US010388779B2

(12) United States Patent
Nakayama et al.

(10) Patent No.: US 10,388,779 B2
(45) Date of Patent: Aug. 20, 2019

(54) SEMICONDUCTOR DEVICE AND MANUFACTURING METHOD THEREOF

(71) Applicant: Renesas Electronics Corporation, Tokyo (JP)

(72) Inventors: Tatsuo Nakayama, Ibaraki (JP); Hironobu Miyamoto, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/135,298

(22) Filed: Sep. 19, 2018

(65) Prior Publication Data

US 2019/0019886 A1 Jan. 17, 2019

Related U.S. Application Data

(62) Division of application No. 15/386,746, filed on Dec. 21, 2016, now Pat. No. 10,109,730.

(30) Foreign Application Priority Data

Feb. 29, 2016 (JP) .................................. 2016-036825

(51) Int. Cl.
*H01L 21/02* (2006.01)
*H01L 29/778* (2006.01)
(Continued)

(52) U.S. Cl.
CPC .... *H01L 29/7787* (2013.01); *H01L 21/02694* (2013.01); *H01L 21/2258* (2013.01); *H01L 21/266* (2013.01); *H01L 21/2654* (2013.01); *H01L 21/26546* (2013.01); *H01L 29/0688* (2013.01); *H01L 29/1087* (2013.01); *H01L 29/2003* (2013.01); *H01L 29/41766* (2013.01); *H01L 29/4236* (2013.01); *H01L 29/42364* (2013.01); *H01L 29/66462* (2013.01); *H01L 29/7783* (2013.01); *H01L 29/1066* (2013.01);
(Continued)

(58) Field of Classification Search
CPC ...................... H01L 29/7787; H01L 21/02694
USPC .......................................................... 257/76
See application file for complete search history.

(56) References Cited

U.S. PATENT DOCUMENTS 8,507,329 B2   8/2013   Kikkawa
9,722,062 B2   8/2017   Nakayama
(Continued)

FOREIGN PATENT DOCUMENTS

JP   2013-149959 A   8/2013

*Primary Examiner* — Igwe U Anya
(74) *Attorney, Agent, or Firm* — Mattingly & Malur, PC

(57) ABSTRACT

A semiconductor device includes a codoped layer, a channel layer, a barrier layer, and a gate electrode disposed in a trench extending through the barrier layer and reaching a middle point in the channel layer via a gate insulating film. On both sides of the gate electrode, a source electrode and a drain electrode are formed. On the source electrode side, an n-type semiconductor region is disposed to fix a potential and achieve a charge removing effect while, on the drain electrode side, a p-type semiconductor region is disposed to improve a drain breakdown voltage. By introducing hydrogen into a region of the codoped layer containing Mg as a p-type impurity in an amount larger than that of Si as an n-type impurity where the n-type semiconductor region is to be formed, it is possible to inactivate Mg and provide the n-type semiconductor region.

16 Claims, 45 Drawing Sheets

(51) Int. Cl.
*H01L 21/265* (2006.01)
*H01L 21/266* (2006.01)
*H01L 29/06* (2006.01)
*H01L 29/20* (2006.01)
*H01L 29/423* (2006.01)
*H01L 29/66* (2006.01)
*H01L 29/417* (2006.01)
*H01L 29/10* (2006.01)
*H01L 21/225* (2006.01)
*H01L 29/40* (2006.01)

(52) U.S. Cl.
CPC ...... *H01L 29/402* (2013.01); *H01L 29/41758* (2013.01); *H01L 29/42368* (2013.01)

(56) References Cited

U.S. PATENT DOCUMENTS

| | | |
|---|---|---|
| 2013/0240900 A1 | 9/2013 | Yaegashi |
| 2015/0171204 A1 | 6/2015 | Nakayama |
| 2016/0064538 A1 | 3/2016 | Nakayama |
| 2016/0225889 A1* | 8/2016 | Umeno .................. H01L 29/47 |
| 2017/0047437 A1* | 2/2017 | Nakayama .......... H01L 21/2258 |

* cited by examiner

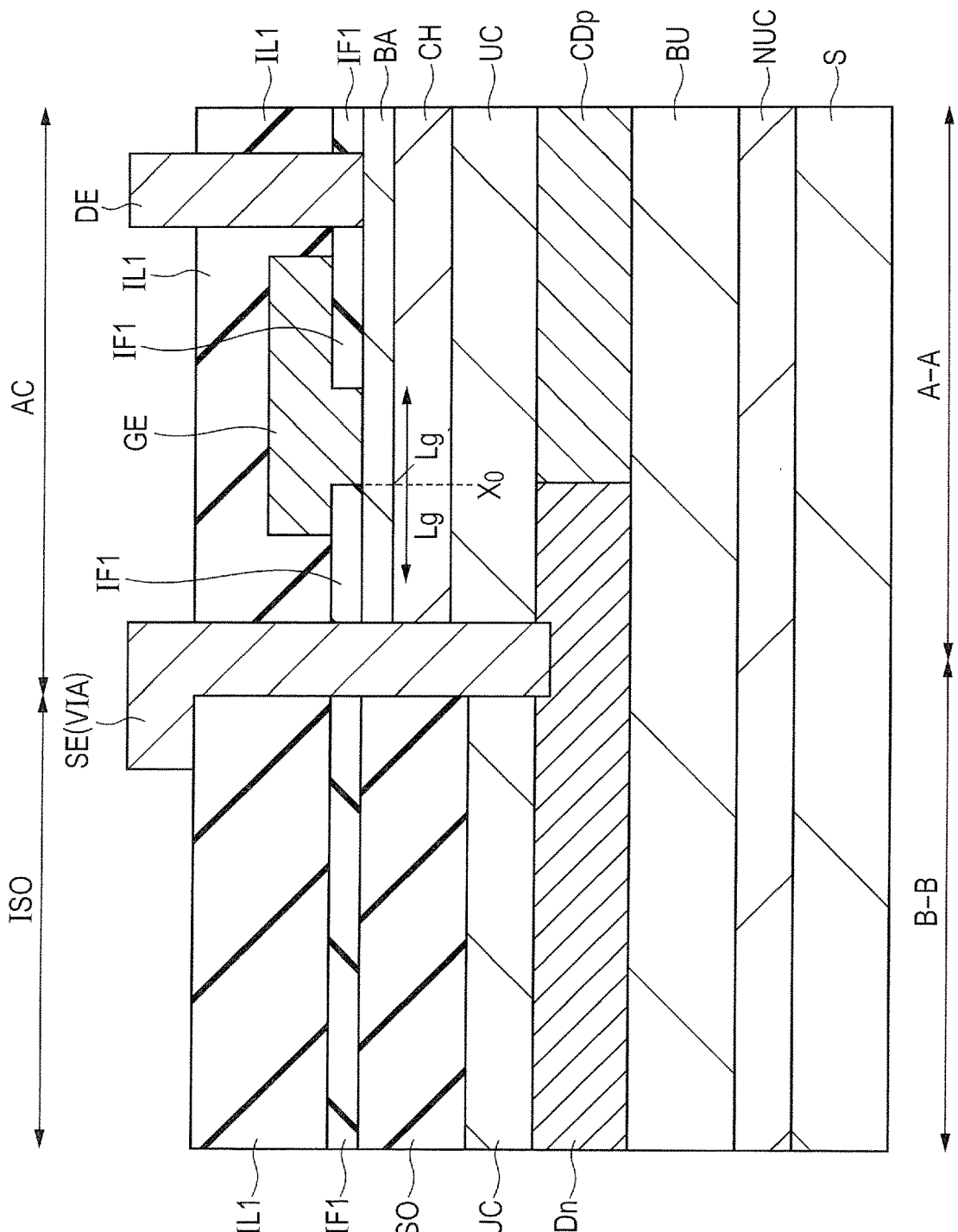

SEMICONDUCTOR DEVICE AND MANUFACTURING METHOD THEREOF

CROSS-REFERENCE TO RELATED APPLICATIONS

This application is a divisional application of U.S. application Ser. No. 15/386,746, filed Dec. 21, 2016, which the disclosure of Japanese Patent Application No. 2016-036825 filed on Feb. 29, 2016 including the specification, drawings and abstract is incorporated herein by reference in its entirety.

BACKGROUND

The present invention relates to a semiconductor device and can be used appropriately as, e.g., a semiconductor device using a nitride semiconductor.

In recent years, attention has been focused on a semiconductor device using a III-V group compound having a band gap larger than that of silicon (Si), e.g., gallium nitride (GaN).

For example, Patent Document 1 (Japanese Unexamined Patent Publication No. 2013-149959) discloses a nitride-based semiconductor device including a substrate, a buffer layer, a channel layer, a source electrode, a drain electrode, and a gate electrode formed over the channel layer and between the source electrode and the drain electrode. The semiconductor device has an intermediate layer which is provided to include at least a part of a region located between the buffer layer and the channel layer and overlapping the gate electrode and contain an n-type nitride-based semiconductor fixed at a predetermined potential.

RELATED ART DOCUMENT

Patent Document

[Patent Document 1] Japanese Unexamined Patent Publication No. 2013-149959

SUMMARY

The present inventors have engaged in research and development of a semiconductor device using a nitride semiconductor as described above and have intensively studied to improve the properties thereof. In the process, the present inventors have studied a method of forming a p-n structure (p-type region and n-type region) in a nitride semiconductor, such as Si, in which a p-n structure cannot easily be formed using an ion implantation method. The present inventors have also studied to further improve the properties of a semiconductor device using a nitride semiconductor by providing a potential fixing layer in the semiconductor device.

Such a semiconductor device using a nitride semiconductor has room for improvement and it has been desired to study a configuration of the semiconductor device for improving the properties thereof and a manufacturing method thereof.

Other problems and novel features of the present invention will become apparent from a statement in the present specification and the accompanying drawings.

The following is a brief description of the outline of the representative ones of the embodiments disclosed in the present application.

In a semiconductor device shown in an embodiment disclosed in the present application, a FET having a nitride semiconductor layer is provided with a codoped layer and the codoped layer located closer to a source electrode is used as an n-type semiconductor region, while the codoped layer located closer to a drain electrode is used as a p-type semiconductor region.

A method of manufacturing the semiconductor device shown in the embodiment disclosed in the present application includes the step of introducing a hydrogen element into the codoped layer.

A semiconductor device shown in each of the following representative embodiments disclosed in the present application is allowed to have improved properties.

A method of manufacturing a semiconductor device shown in each of the following representative embodiments disclosed in the present application allows a semiconductor device having excellent properties to be manufactured.

BRIEF DESCRIPTION OF THE DRAWINGS

FIG. 46 is a cross-sectional view schematically showing another configuration of the semiconductor device in Embodiment 6.

DETAILED DESCRIPTION

Figure 1:
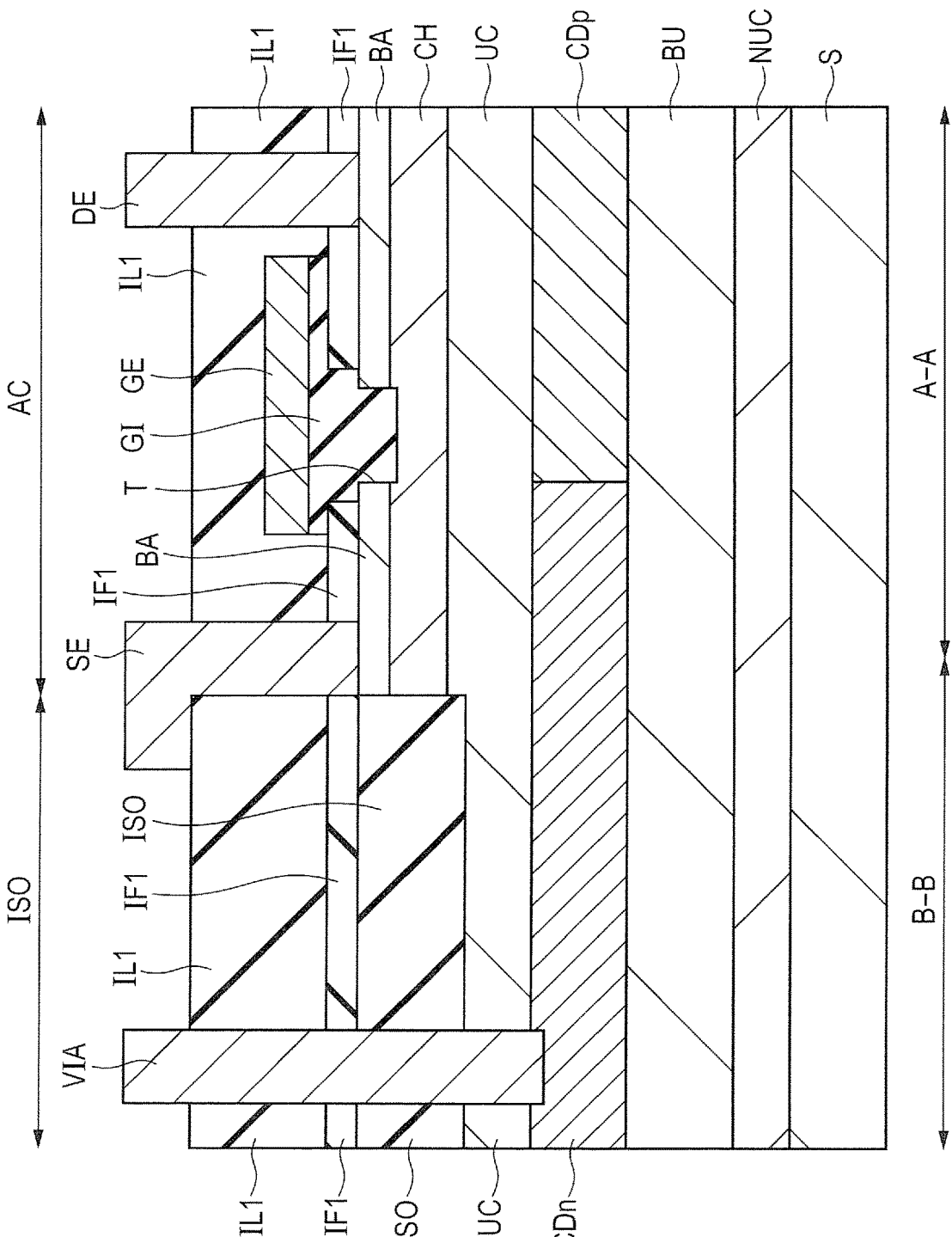
FIG. 1 is a cross-sectional view schematically showing a configuration of a semiconductor device in Embodiment 1.

In each of the following embodiments, if necessary for the sake of convenience, the embodiment will be described by being divided into a plurality of sections or embodiments. However, they are by no means irrelevant to each other unless particularly explicitly described otherwise, but are in relations such that one of the sections or embodiments is a modification, an application example, detailed explanation, supplementary explanation, and so forth of part or the whole of the others. Also, in the following embodiment, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Also, in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing number and the like (including the number, numerical value, amount, range, and the like).

The following will describe the embodiments in detail on the basis of the drawings. Note that, throughout all the drawings for illustrating the embodiments, members having the same functions are designated by the same or related reference numerals, and a repeated description thereof is omitted. When there are a plurality of similar members (portions), marks may be added to general reference numerals to show individual or specific portions. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

In each of a cross-sectional view and a plan view, the sizes of individual portions do not correspond to those in a real device. For improved clarity of illustration, a specific portion may be shown in a relatively large size. Even when a plan view and a cross-sectional view correspond to each other, for improved clarity of illustration, a specific portion may be shown in a relatively large size.

Embodiment 1

Referring to the drawings, the following will describe a semiconductor device in Embodiment 1 in detail.

<Description of Structure>

FIG. 1 is a cross-sectional view schematically showing a configuration of a semiconductor device in Embodiment 1. The semiconductor device (semiconductor element) in Embodiment 1 shown in FIG. 1 and the like is a MIS (Metal Insulator Semiconductor) Field Effect Transistor (FET) using a nitride semiconductor. The semiconductor device can be used as a power transistor of a High Electron Mobility Transistor (HEMT) type. The semiconductor device in Embodiment 1 is a so-called recessed-gate semiconductor device.

In the semiconductor device in Embodiment 1, over a substrate S, a nucleation layer NUC, a buffer layer BU, a codoped layer CD (CDn and CDp), a channel underlying layer UC, a channel layer (referred to also as electron transit layer) CH, and a barrier layer (referred to also as electron supply layer) BA are formed in this order. The nucleation layer NUC is made of a nitride semiconductor layer. The buffer layer BU includes one or a plurality of nitride semiconductor layers each doped with an impurity which forms a deep level in a nitride semiconductor. Here, a superlattice structure (referred to also as superlattice layer) including a plurality of nitride semiconductor layers is used.

The codoped layer CD is made of a nitride semiconductor layer having an impurity serving as a p-type impurity for a nitride semiconductor and an impurity serving as an n-type impurity for a nitride semiconductor.

As the channel underlying layer UC, a nitride semiconductor layer having an electron affinity smaller (having a band gap larger) than that of the channel layer CH and having an average lattice constant in a direction along the top surface of the substrate which is smaller than that of the channel layer CH is used preferably. As the channel layer CH, a nitride semiconductor layer having an electron affinity larger (having a band gap smaller) than that of the channel underlying layer UC is used preferably. As the barrier layer BA, a nitride semiconductor layer having an electron affinity smaller than that of the channel layer CH and smaller than that of the channel underlying layer UC is used preferably. Over the barrier layer BA, an insulating film IF1 is formed. Note that, between the insulating film IF1 and the barrier layer BA, a cap layer may also be provided. As the cap layer, a nitride semiconductor layer having an electron affinity larger than that of the barrier layer BA is used preferably.

The MISFET in Embodiment 1 has a gate electrode GE, a source electrode SE, and a drain electrode DE. The gate electrode GE is formed over the channel layer CH via a gate insulating film GI. The source electrode SE and the drain electrode DE are formed over the barrier layer BA located on both sides of the gate electrode GE. The MISFET is formed in an active region AC defined by an isolation region ISO (see FIG. 10). The gate electrode GE is formed in a trench T extending through the barrier layer BA and reaching a middle point in the channel layer CH.

In the channel layer CH located in the vicinity of the interface between the channel layer CH and the barrier layer BA, a two-dimensional electron gas (2DEG) is generated. When a positive potential (threshold potential) is applied to the gate electrode GE, in the vicinity of the interface between the gate insulating film GI and the channel layer CH, a channel is formed.

The foregoing two-dimensional electron gas (2DEG) is formed in accordance with the following mechanism. The respective nitride semiconductor layers (which are gallium-nitride-based semiconductor layers herein) forming the channel layer CH and the barrier layer BS have different electron affinities (forbidden band widths (band gaps)). The barrier layer BA is made of the nitride semiconductor layer having the electron affinity smaller than that of the channel layer CH. Consequently, at the junction surface between these semiconductor layers, a well (type) potential is generated. In the well (type) potential, electrons are accumulated to form the two-dimensional electron gas (2DEG) in the vicinity of the interface between the channel layer CH and the barrier layer BA. In particular, the channel layer CH and the barrier layer BA are epitaxially formed of the nitride semiconductor materials by gallium (or aluminum) plane growth. As a result, positive fixed polarization charges are generated at the interface between the channel layer CH and the barrier layer BA. To neutralize the positive polarization charges, the electrons are accumulated so that the two-dimensional electron gas (2DEG) is more likely to be formed.

The two-dimensional electron gas (2DEG) formed in the vicinity of the interface between the channel layer CH and the barrier layer BA is divided by the trench T in which the gate electrode GE is formed. Accordingly, in the semiconductor device in Embodiment 1, it is possible to retain an OFF state while a positive potential (threshold potential) is not applied to the gate electrode GE and retain an ON state while the positive potential (threshold potential) is applied to the gate electrode GE. In this manner, a normally-off operation can be performed. Note that, in the ON state and in the OFF state, the potential of the source electrode SE is, e.g., a ground potential (0 V).

By providing the channel layer CH between the barrier layer BA and the channel underlying layer UC each having an electron affinity smaller than that of the channel layer CH, the effect of confining electrons is improved. This can suppress a short channel effect and improve an amplification factor and an operation speed. When the channel underlying layer UC is distorted under tensile strain, negative charges resulting from piezoelectric polarization and spontaneous polarization are induced at the interface between the channel underlying layer UC and the channel layer CH. Consequently, the threshold potential shifts in a positive direction. This can improve the performance of the normally-off operation. When the strain of the channel underlying layer UC is reduced, negative charges resulting from spontaneous polarization are induced at the interface between the channel underlying layer UC and the channel layer CH. Consequently, the threshold potential shifts in the positive direction. This can improve the performance of the normally-off operation.

Note that the foregoing effect is achieved by using the channel underlying layer UC, but the channel underlying layer UC may also be omitted. Alternatively, the channel underlying layer UC may also be formed of the same nitride semiconductor as forming the channel layer CH.

In Embodiment 1, the codoped layer CD (CDn and CDp) is provided. The codoped layer CD is made of respective nitride semiconductor layers having an impurity serving as a p-type impurity for a nitride semiconductor layer and having an impurity serving as an n-type impurity for a nitride semiconductor layer. By forming the codoped layer CD of a layer having an electron affinity smaller than that of the channel layer, it is possible to reduce a leakage current. The codoped layer CD is, e.g., a GaN layer containing Mg as a p-type impurity and Si as an n-type impurity.

The codoped layer CD has the p-type semiconductor region CDp and the n-type semiconductor region CDn. Thus, the region CDp serving as the p-type semiconductor region and the region CDn serving as the n-type semiconductor region are formed in the same layer (in the same plane). The region serving as the p-type semiconductor region is the region where holes are majority carriers, while the region serving as the n-type semiconductor region is the region where electrons are majority carriers. The polarity (either p-type or n-type) of a semiconductor region can be determined by, e.g., SCM (Scanning Capacitance Microscopy). On the other hand, a carrier density (electron density or hole density) can be measured by, e.g., SMM (Scanning Microwave Microscopy). The boundary portion (pn junction portion) between the n-type semiconductor region CDn and the p-type semiconductor region CDp can be defined as a region having a high resistance due to the same numbers of holes and electrons which are induced and cancel out each other. For example, it is possible to measure the region having a high resistance by SMM. Note that, when the region has a width, the pn junction portion may also be located at the middle point thereof. Alternatively, the pn junction portion may also be located on the boundary between the p-type region and the n-type region which has been determined by SCM. In the case where the region between the p-type region and the n-type region has a width, the pn junction portion may also be located at the middle point thereof.

The n-type semiconductor region CDn is disposed mainly under the source electrode SE. The p-type semiconductor region CDp is disposed mainly under the drain electrode DE.

The n-type semiconductor region CDn extends to a position below the isolation region ISO. In Embodiment 1, a coupling portion (referred to also as via or sub-contact electrode) VIA is provided in the isolation region ISO to extend through the isolation region ISO and reach the n-type semiconductor region CDn located thereunder. By thus providing the n-type semiconductor region CDn and the coupling portion VIA and fixing the n-type semiconductor region CDn to a predetermined potential (e.g., 0 V or a negative potential), it is possible to reduce variations in properties such as threshold potential and ON resistance.

Also, in Embodiment 1, the coupling portion VIA in a through hole (TH) is disposed in the isolation region ISO outside the active region AC which conducts electrons. This can achieve a reduction in the size of the semiconductor element and a higher integration thereof. In addition, since it is possible to ensure a large active region AC capable of conducting electrons, an ON resistance per unit area can be reduced.

Also, in Embodiment 1, the p-type semiconductor region CDp is provided between and below the gate electrode GE and the drain electrode DE. By thus providing the p-type semiconductor region CDp where it is easier to ensure a sufficient breakdown voltage than in the n-type semiconductor region CDn, a drain breakdown voltage can be improved. In particular, by setting the p-type impurity concentration of the p-type semiconductor region CDp to a relatively low value in a range of, e.g., $5 \times 10^{17}$ cm$^{-3}$ to $2 \times 10^{19}$ cm$^{-3}$, it is possible to increase the resistance of the p-type semiconductor region CDp and improve the drain breakdown voltage. In the codoped layer CD, carriers (holes) resulting from a p-type impurity are cancelled out by carriers (electrons) resulting from an n-type impurity. Accordingly, it is possible to further increase the resistance of the p-type semiconductor region CDp. Also, in Embodiment 1, the codoped layer CD located closer to the source electrode CD is used as the n-type semiconductor region CDn and the codoped layer CD located closer to the drain electrode DE is used as the p-type semiconductor region CDp. Consequently, the codoped layer (CDn and CDp) functions as a protective diode to be able to improve a breakdown resistance when a negative bias is applied to the drain electrode.

Figure 2:
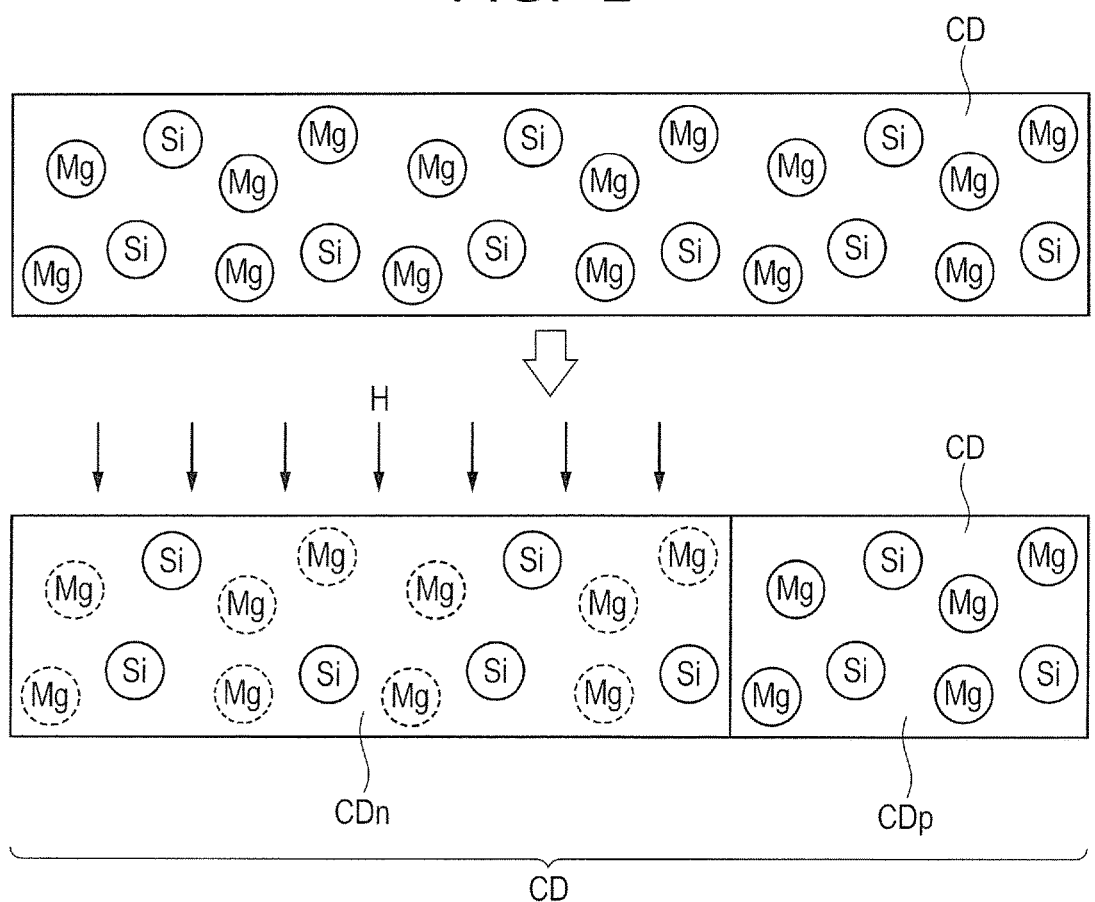
FIG. 2 is a cross-sectional view schematically showing a configuration of a codoped layer and the step of forming the codoped layer.

FIG. 2 is a cross-sectional view schematically showing a configuration of the codoped layer and the step of forming the codoped layer. As shown in the upper part of FIG. 2, the codoped layer CD has, e.g., Mg as a p-type impurity and Si as an n-type impurity. By epitaxially growing a nitride semiconductor layer (e.g., AlGaN layer) while doping the nitride semiconductor layer with Mg as the p-type impurity and Si as the n-type impurity, the nitride semiconductor layer (e.g., AlGaN layer) containing Mg as the p-type impurity and Si as the n-type impurity can be formed.

The codoped layer CD contains Mg as the p-type impurity in an amount larger than that of Si as the n-type semiconductor impurity. In other words, in the codoped layer CD, the concentration of the p-type impurity (which is Mg herein) is higher than the concentration of the n-type impurity (which is Si herein). In still other words, in the codoped layer CD, the content (additive amount) of the p-type impurity (which is Mg herein) is higher than the content of the n-type impurity (which is Si herein) (Mg rich). Note that the concentration or content of an impurity can be represented by the number of impurity elements per unit area.

Consequently, the carriers (electrons) resulting from the n-type impurity (which is Si herein) in the codoped layer CD are cancelled out by the carriers (holes) resulting from the p-type impurity (which is Mg herein) so that the codoped layer CD serves as the p-type semiconductor region (CDp).

Then, as shown in the lower part of FIG. 2, by introducing hydrogen (H) into the region of the codoped layer CD where the n-type semiconductor region is to be formed (formation planned region), Mg can be inactivated. In the lower part of FIG. 2, Mg enclosed by the broken line shows inactivated Mg. As a result of inactivating Mg, the concentration of the carriers (holes) resulting from a p-type impurity (which is Mg herein) is as low as, e.g., zero. Consequently, in the region where hydrogen (H) is introduced, carriers (electrons) resulting from the n-type impurity (which is Si herein) in the codoped layer CD becomes dominant to provide the n-type semiconductor region CDn. On the other hand, the region where hydrogen (H) is not introduced remains as the p-type semiconductor region CDp. A method of introducing hydrogen (H) is not limited and, as will be described later, an ion implantation method or a solid-phase diffusion method can be used.

By thus introducing hydrogen (H) into the codoped layer CD, it is possible to form the p-type semiconductor region CDp and the n-type semiconductor region CDn in the same layer.

The following is a summary of the configuration of the codoped layer CD.

The codoped layer CD before the introduction of hydrogen (H) has a p-type impurity (which is Mg herein) and an n-type impurity (which is Si herein). The p-type impurity (which is Mg herein) and the n-type impurity (which is Si herein) are substantially uniformly contained in the codoped layer CD. In the codoped layer CD, the concentration of the p-type impurity (which is Mg herein) is higher (greater) than the concentration of the n-type impurity (which is Si herein). These impurities have been activated.

In the codoped layer CD, the uniformity and concentration of each of the p-type impurity (which is Mg herein) and the n-type impurity (which is Si herein) remains unchanged even after the introduction of hydrogen (H). Only the activation rate of the p-type impurity (which is Mg herein) is different.

Therefore, the codoped layer containing the p-type impurity (which is Mg herein) and the n-type impurity (which is Si herein) is denoted by "CD" regardless of whether it is before or after the introduction of hydrogen (H). Accordingly, before the introduction of hydrogen (H), the codoped layer CD is a single layer having a p-type impurity (which is Mg herein) and an n-type impurity (which is Si herein). After the introduction of hydrogen (H), the codoped layer CD has the p-type semiconductor region CDp and the n-type semiconductor region CDn (see FIG. 2).

Thus, after the introduction of hydrogen (H), the codoped layer CD has the p-type semiconductor region CDp and the n-type semiconductor region CDn. As described above, the polarity (either p-type or n-type) of a semiconductor region can be determined by, e.g., SCM. In other words, the codoped layer CD has a region where the concentration of electrons is higher and a region where the concentration of holes is higher. The region where the concentration of electrons is higher corresponds to the n-type semiconductor region CDn and the region where the concentration of holes is higher corresponds to the p-type semiconductor region CDp. The concentration of carriers (concentration of electrons or holes) can be measured by, e.g., SMM).

After the introduction of hydrogen (H), the codoped layer CD has a region which contains hydrogen (H) and a region which does not contain hydrogen (H). In other words, the codoped layer CD has a region where the concentration of hydrogen (H) is higher and a region where the concentration of hydrogen (H) is lower. The region which contains hydrogen (H) or where the concentration of hydrogen (H) is higher corresponds to the n-type semiconductor region CDn. The region which does not contain hydrogen (H) or where the concentration of hydrogen (H) is lower corresponds to the p-type semiconductor region CDp. Accordingly, the hydrogen concentration in the n-type semiconductor region CDn is higher than the hydrogen concentration in the p-type semiconductor region CDp. In still other words, the concentration of the activated n-type impurity (which is Si herein) in the n-type semiconductor region CDn is lower (smaller) than the concentration of the activated p-type impurity (which is Mg herein) in the p-type semiconductor region CDp.

After the introduction of hydrogen (H), the codoped layer CD has a region which contains a p-type impurity (which is Mg herein) in an inactivated state and a region which contains a p-type impurity (which is Mg herein) in an activated state. The region which contains the p-type impurity (which is Mg herein) in the inactivated state corresponds to the n-type semiconductor region CDn. The region which contains the p-type impurity (which is Mg herein) in the activated state corresponds to the p-type semiconductor region CDp. Note that, in the codoped layer CD, the n-type impurity (which is Si herein) is substantially uniformly present in the activated state As shown in FIG. 1, the MISFET in Embodiment 1 has the gate electrode GE formed via the gate insulating film GI in the trench T extending through the barrier layer BA and reaching a middle point in the channel layer CH. The MISFET in Embodiment 1 also has the source electrode SE and the drain electrode DE which are formed over the barrier layer BA located on both sides of the gate electrode GE. In the region of the codoped layer CD which is closer to the source electrode SE, the n-type semiconductor region CDn is disposed while, in the region of the codoped layer CD which is closer to the drain electrode DE, the p-type semiconductor region CDp is disposed. The gate electrode GE is covered with an interlayer insulating film IL1. In the contact holes in the interlayer insulating film IL1, the foregoing source electrode SE and the foregoing drain electrode DE are formed.

Figure 3:
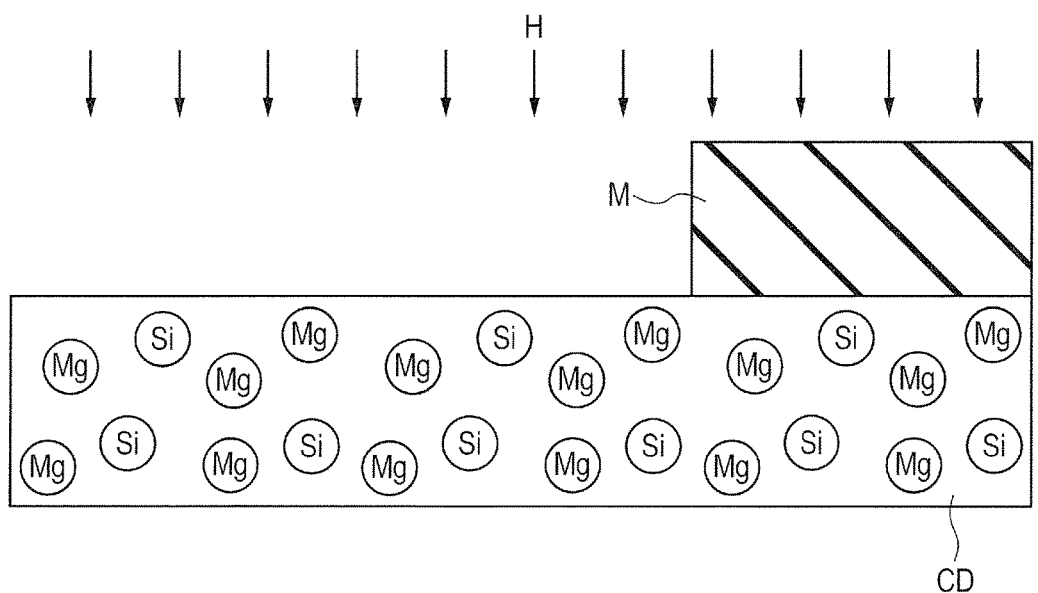
FIG. 3 is a cross-sectional view showing the step of introducing hydrogen into the region of the codoped layer where an n-type semiconductor region is to be formed.
Figure 4:
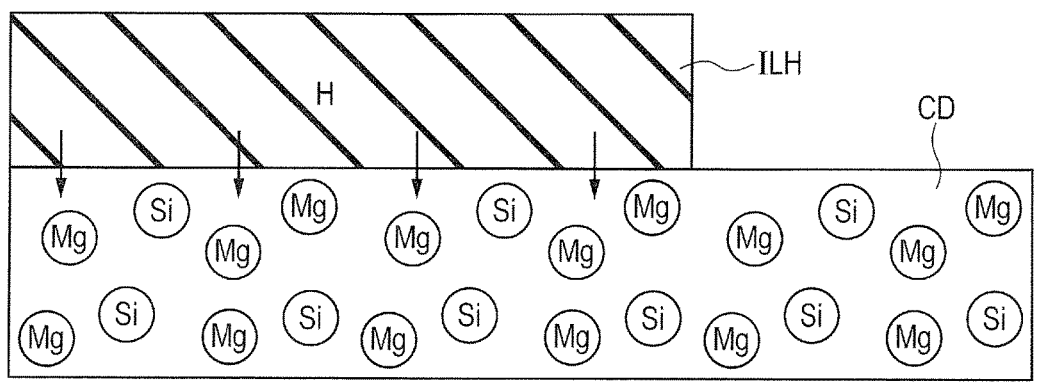
FIG. 4 is a cross-sectional view showing the step of introducing hydrogen into the region of the codoped layer where the n-type semiconductor region is to be formed.

Next, referring to FIGS. 3 and 4, a description will be given of a method of introducing hydrogen (H) into the region of the codoped layer CD where the n-type semiconductor region is to be formed. FIGS. 3 and 4 are cross-sectional views showing the step of introducing hydrogen into the region of the codoped layer where the n-type semiconductor region is to be formed. Examples of the method of introducing hydrogen (H), i.e., a method of inactivating Mg only in a local region include an ion implantation method and a solid-phase diffusion method which will be shown below.

(1) Ion Implantation Method

For example, as shown in FIG. 3, a mask film M having an opening over the region where the n-type semiconductor region CDn is to be formed is formed. Then, using the mask film M as a mask, hydrogen (H) is ion-implanted (by ion implantation) into the codoped layer CD and heat treatment is performed thereon to inactivate the p-type impurity (which is Mg herein) in the codoped layer CD. As a result, the region in which hydrogen (H) is ion-implanted serves as the n-type semiconductor region CDn (see FIG. 2).

(2) Solid-Phase Diffusion Method

For example, as shown in FIG. 4, over the region where the n-type semiconductor region CDn is to be formed, a film ILH containing hydrogen is formed. Then, by performing heat treatment thereon, hydrogen (H) is introduced from the film ILH containing hydrogen into the codoped layer CD. The introduction of hydrogen (H) inactivates the activated p-type impurity (which is Mg herein) to provide the n-type semiconductor region CDn (see FIG. 2).

Figure 5:
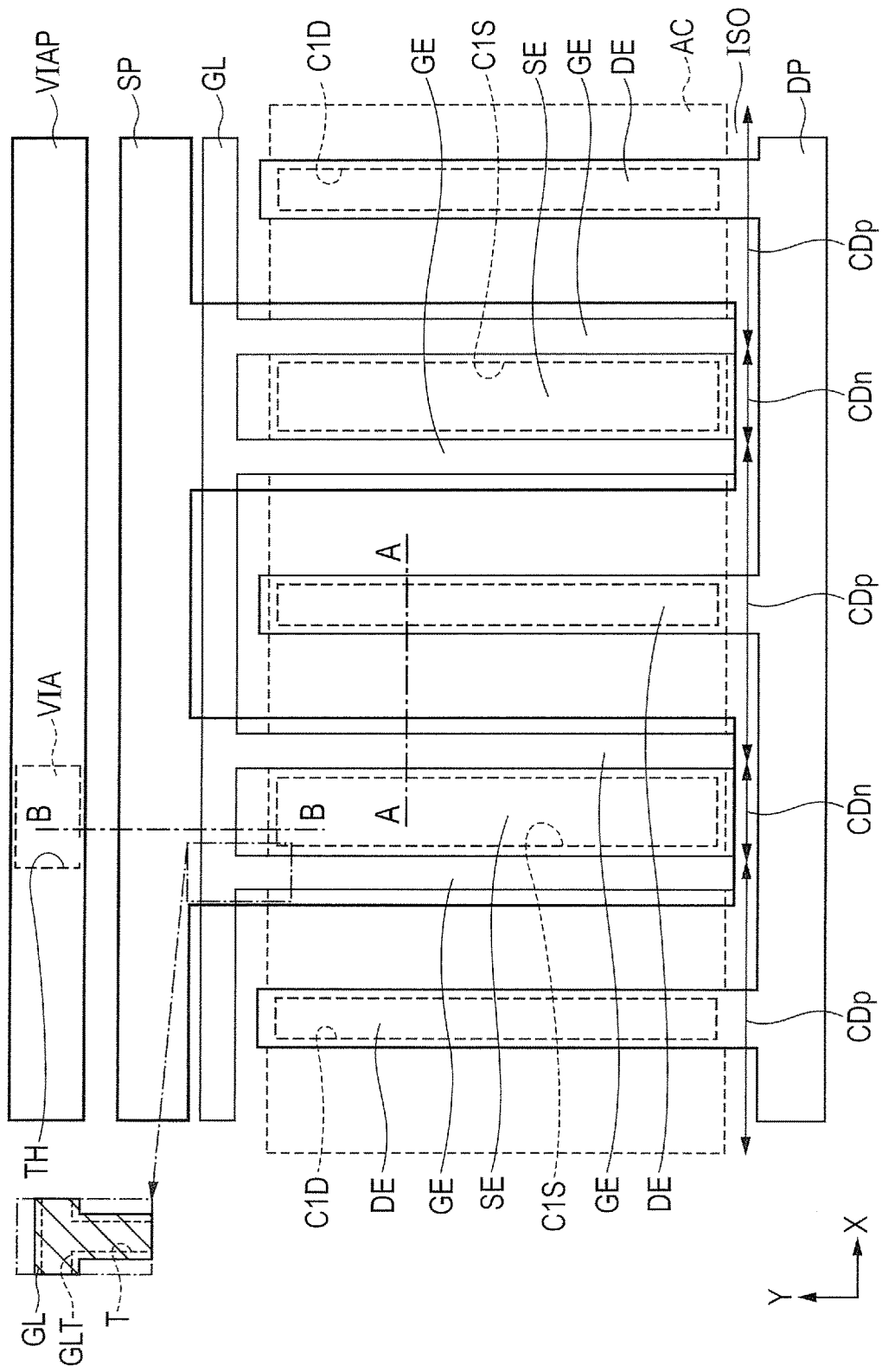
FIG. 5 is a plan view showing the configuration of the semiconductor device in Embodiment 1.
Figure 6:
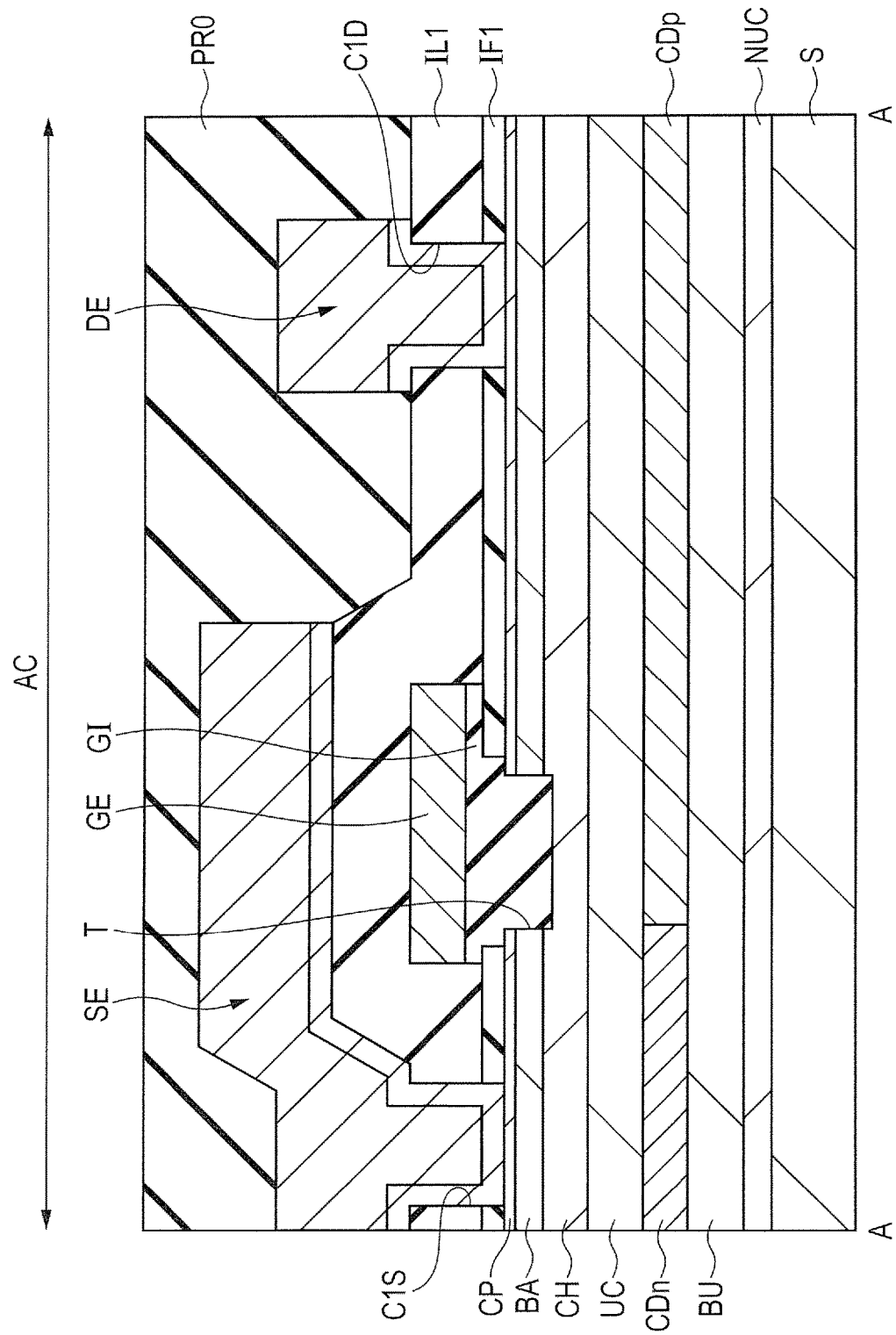
FIG. 6 is a cross-sectional view showing the configuration of the semiconductor device in Embodiment 1.
Figure 7:
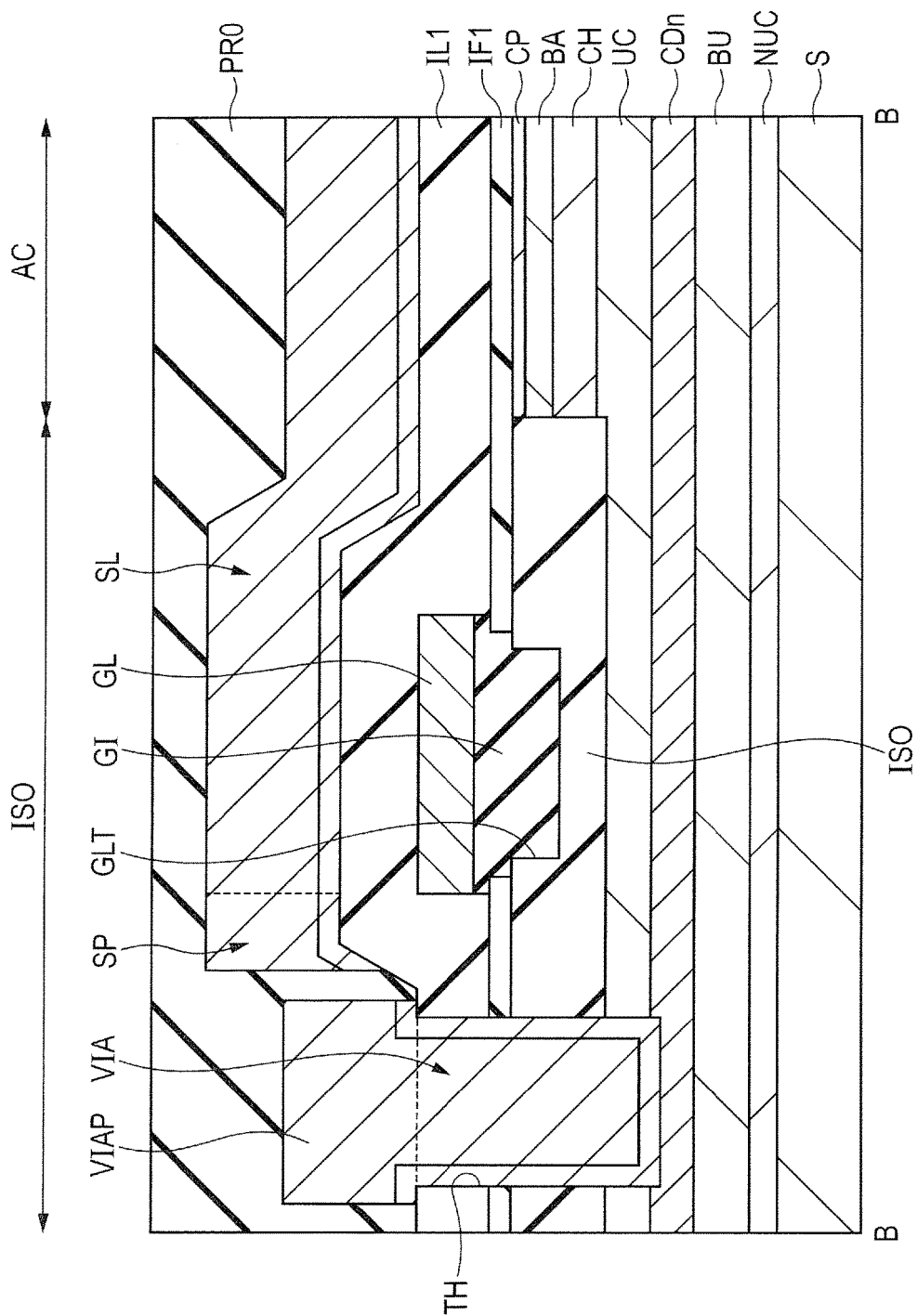
FIG. 7 is a cross-sectional view showing the configuration of the semiconductor device in Embodiment 1.

Referring to FIGS. 5 to 7, the semiconductor device in Embodiment 1 will be described in greater detail. FIG. 5 is a plan view showing a configuration of the semiconductor device in Embodiment 1. FIGS. 6 and 7 are cross-sectional views showing a configuration of the semiconductor device in Embodiment 1. FIG. 6 corresponds to the portion along the line A-A in FIG. 5. FIG. 7 corresponds to the portion along the line B-B in FIG. 5. Note that the left-hand part of FIG. 1 (schematic diagram) described above corresponds to the foregoing portion along the line B-B, while the right-hand part thereof corresponds to the foregoing portion along the line A-A.

As shown in FIG. 5, each of the drain electrodes DE has a rectangular two-dimensional shape having long sides in a Y-direction. The plurality of linear drain electrodes DE are arranged at regular intervals in an X-direction. Each of the source electrodes SE has a rectangular two-dimensional shape having a long side in the Y-direction. The plurality of linear source electrodes SE are arranged at regular intervals in the X-direction. The plurality of source electrodes SE and the plurality of drain electrodes DE are arranged to alternate along the X-direction.

Under the respective drain electrodes DE, contact holes C1D are disposed to serve as coupling portions between the respective drain electrodes DE and the cap layer CP (barrier layer BA). Each of the contact holes C1D has a rectangular two-dimensional shape having long sides in the Y-direction. Under the respective source electrodes SE, contact holes C1S are disposed to serve as coupling portions between the respective source electrodes SE and the cap layer (barrier layer BA). Each of the contact holes C1S has a rectangular two-dimensional shape having long sides in the Y-direction.

Between the contact holes C1D under the respective drain electrodes DE and the contact holes C1S under the respective source electrodes SE, the gate electrodes GE are disposed. Each of the gate electrodes GE has a rectangular shape having long sides in the Y-direction. Under each one of the source electrodes SE, the two (pair of) gate electrodes GE are disposed. The two gate electrodes GE are disposed on both sides of the contact hole C1S under the source electrode SE.

The plurality of drain electrodes DS are coupled to each other via a drain pad (referred to also as a terminal portion) DP. The drain pad DP is disposed on one end side (lower side in FIG. 5) of the drain electrode DE so as to extend in the X-direction. In other words, the plurality of drain electrodes DE are disposed so as to protrude in the Y-direction from the drain pad DP extending in the X-direction. Such a shape may be referred to as a comb-shaped shape.

The plurality of source electrodes SE are coupled to each other via a source pad (referred to also as a terminal portion) SP. The source pad SP is disposed on the other end side (upper side in FIG. 5) so as to extend in the X-direction. In other words, the plurality of source electrodes SE are arranged so as to protrude in the Y-direction from the source pad SP extending in the X-direction. Such a shape may be referred to as a comb-shaped shape.

The plurality of gate electrodes GE are coupled to each other via a gate line GL. The gate line GL is disposed on one end side (upper side in FIG. 5) of the gate electrode GE so as to extend in the X-direction. In other words, the plurality of gate electrodes GE are arranged so as to protrude in the Y-direction from the gate line GL extending in the X-direction. Note that the gate line GL is coupled to gate pads (not shown) provided on both sides (right and left sides in FIG. 5) of the gate line GL in the X-direction. Over the coupling portion VIA described later, a via pad VIAP is disposed so as to extend in the X-direction.

The source electrodes SE, the drain electrodes DE, and the gate electrodes GE each described above are disposed mainly over the active region AC surrounded by the isolation region ISO. The active region AC has a rectangular two-dimensional shape having long sides in the X-direction (see FIG. 10). On the other hand, the drain pad DP, the gate line GL, the source pad SP, and the via pad VIAP are disposed over the isolation region ISO. Between the active region AC and the source pad SP, the gate line GL is disposed.

In Embodiment 1, in the isolation region ISO, the through hole (referred to also as a hole, an opening, or a recessed portion) TH is disposed to extend through the isolation region ISO and reach the n-type semiconductor region CDn of the codoped layer CD. In the through hole TH, a conducive film is embedded to form the coupling portion VIA. The coupling portion VIA is coupled to the via pad VIAP extending in the X-direction. The via pad VIAP is electrically coupled to the n-type semiconductor region CDn via the coupling portion VIA. This allows the potential of the n-type semiconductor region CDn to be fixed to the potential applied to the via pad VIAP. The via pad VIAP may be referred to as a "potential fixing electrode" and the semiconductor layer coupled to the coupling portion VIA may be referred to as a "potential fixing layer".

In Embodiment 1, under the gate electrode GE and the drain electrode DE, the p-type semiconductor region CDp of the codoped layer CD is provided (see FIGS. 5 to 6).

As shown in FIGS. 6 and 7, the MISFET in Embodiment 1 includes the gate electrode GE, the source electrode SE, and the drain electrode DE. The gate electrode GE is formed over the active region AC of the substrate S. The source electrode SE and the drain electrode DE are formed over the cap layer CP located on both sides of the gate electrode GE and in the regions where the contact holes (C1S and C1D) are formed. Over the source electrode SE and the drain electrode DE, a protective film (referred to also as an insulating film, a cover film, or a top surface protective film) PRO is disposed.

Over the substrate S, as described above, the nucleation layer NUC, the buffer layer BU, the codoped layer CD (CDn and CDp), the channel underlying layer UC, the channel layer CH, the barrier layer BA, the cap layer CP, and the insulating film IF1 are formed in this order. The gate electrode GE is formed in the trench T extending through the insulating film IF1, the cap layer CP, and the barrier layer BA and reaching a middle point in the channel layer CH via the gate insulating film GI.

As the substrate S, a semiconductor substrate made of, e.g., silicon (Si) can be used. As the substrate S, instead of the foregoing substrate made of silicon, a substrate made of a nitride semiconductor such as GaN or a substrate made of AlN, SiC, sapphire, or the like may also be used. When a nitride semiconductor layer such as a GaN layer is formed over the silicon substrate among them, to improve the crystallinity thereof and reduce strain (inner stress) in the substrate, the buffer layer BU is used in most cases, as will be described later. As a result, as will be described later, charges are likely to be accumulated. Accordingly, in the case of using the silicon substrate and the nitride semiconductor in combination, it is effective to use the semiconductor device in Embodiment 1.

The nucleation layer NUC is formed to generate a crystal core when a layer formed over the buffer layer BU or the like grows. The nucleation layer NUC is formed also to prevent the substrate S from being modified by the diffusion of the component element (such as, e.g., Ga) of the layer formed over the buffer layer BU. As the nucleation layer NUC, e.g., an aluminum nitride (AlN) layer can be used. The AlN layer has a film thickness of about 200 nm. Depending on the material of the substrate S and the use of the semiconductor device, the material and thickness of the nucleation layer NUC can be determined selectively and appropriately. When a GaN substrate or the like is used as the substrate S or the nucleation layer NUC is not necessary depending on film deposition conditions for the buffer layer or the like, the nucleation layer NUC can be omitted.

The buffer layer BU is formed to adjust a lattice constant, improve the crystallinity of the nitride semiconductor formed thereover, and reduce a film stress in the nitride semiconductor to be stacked. This improves the crystallinity of the nitride semiconductor. This can also reduce strain (inner stress) in the substrate S and inhibit the warping of the substrate S and the formation of a crack therein. As the buffer layer BU, a superlattice structure in which multi-layer films (AlN/GaN films) each including a gallium nitride (GaN) layer and an aluminum nitride (AlN) layer are stacked in multiple cycles can be used. In the superlattice structure, two or more multi-layer bodies each including nitride semiconductor layers having different electron affinities are repeatedly disposed. The superlattice structure is doped with carbon (C). For example, the superlattice structure in which each of the GaN layers has a film thickness of about 20 nm, each of the AlN layers has a film thickness of about 5 nm, and the multi-layer films each including the GaN layer and the AlN layer are deposited in 40 cycles can be used. The concentration (doping amount) of carbon is, e.g., about $1\times10^{19}$ (1E19) cm$^{-3}$. However, depending on the use of the semiconductor device, the material and thickness of each of the films included in the multi-layer film may be determined selectively and appropriately. The buffer layer BU may also include a layer other than the superlattice structure. For example, over the superlattice structure, another material film (such as an i-InAlN layer having a film thickness of, e.g., about 1 µm) may also be formed. Alternatively, as the buffer layer BU, a single-layer film not including the superlattice structure or the like can also be used.

As the materials of the superlattice structure and the foregoing single-layer film, besides AlN and GaN, InN can be used. It may also be possible to use a mixed crystal of such nitride semiconductors. For example, in the multi-layer film of the foregoing superlattice structure, instead of the AlN/GaN film, an AlGaN/GaN film can be used. As the foregoing single-layer film, e.g., an AlGaN layer, an InAlN layer, or the like can be used.

In the foregoing description, the superlattice structure is internally doped with carbon (carbon has been added into the superlattice structure). However, another doping impurity may also be used. As the doping impurity, an element which forms a deep level is preferred. Instead of carbon, a transition metal such as iron (Fe), magnesium (Mg), beryllium (Be), or the like may also be used. Depending on the use of the semiconductor device, a doping amount or an impurity element may be determined selectively and appropriately.

As the codoped layer CD, e.g., an AlGaN layer doped with a p-type impurity and an n-type impurity and having a thickness of about 400 nm can be used. The composition of Al is about 5%. For example, the AlGaN layer is doped with Mg as the p-type impurity such that the doping amount thereof is about $1\times10^{18}$ (1E18) cm$^3$. The AlGaN layer is also doped with Si as the n-type impurity such that the doping amount thereof is about $2\times10^{17}$ (2E17) cm$^3$. However, depending on the use of the semiconductor device, the concentrations of the impurities, the material of the nitride semiconductor, and the film thickness thereof can be determined selectively and appropriately. As the material of the nitride semiconductor, a GaN layer, an AlN layer, an InN layer, or the like can be used. It may also be possible to use a mixed crystal of these nitride semiconductors. As the doping impurities, an n-type impurity and a p-type impurity can be used. Examples of the n-type impurity include Si, O, S, and Se. Examples of the p-type impurity include Be, C, Mg, and Zn. After the activation, to allow the codoped layer CD to have the p-type conductivity type, the concentration of the p-type impurity needs to be set higher than the concentration of the n-type impurity. For example, in consideration of the activation rate, the concentration of the p-type impurity (which is Mg herein) to be introduced into the codoped layer CD is set to a value which is double or more, more preferably five times or more, or most preferably 10 times or more the concentration of the n-type impurity (which is Si herein).

As the channel underlying layer UC, e.g., an AlGaN layer can be used. The composition of Al is about 5%. The channel underlying layer UC is not intentionally doped with an impurity. The thickness of the AlGaN layer is, e.g., about 100 nm. As the material of the channel underlying layer UC, GaN, AlN, InN, or the like can be used instead of AlGaN. It may also be possible to use a mixed crystal (such as InGaN layer, AlGaN layer, or InAlN layer) of such nitride semiconductors. However, to enhance an electron confinement effect in the channel layer CH, a material having an electron affinity smaller than that of the channel layer CH is used preferably. Note that, in Embodiment 1, the non-doped channel underlying layer UC is used. However, depending on the use of the semiconductor device, the channel underlying layer UC may also be doped appropriately with an impurity. As a doping impurity, an n-type impurity or a p-type impurity can be used. Examples of the n-type impurity include Si, O, S, and Se. Examples of the p-type impurity include Be, C, Mg, and Zn. Note that, when a deep level is formed through doping with an impurity, the deep level causes variations in properties such as threshold voltage. Accordingly, the doping amount of the impurity is preferably not more than $1\times10^{16}$ (1E16) cm$^{-3}$.

Also, in Embodiment 1, as a result of epitaxial growth, each of the channel layer CH and the barrier layer BA overlying the channel underlying layer UC also has the lattice constant of the channel underlying layer UC in an in-plane direction thereof. In the case where, e.g., a layer having a lattice constant larger than that of the channel underlying layer (AlGaN layer) UC, such as a GaN layer, an $In_XGa_{(1-X)}N$ layer ($0 \leq X \leq 1$), or an InAlN layer is formed over the channel underlying layer UC, compressive strain is applied to the layer located thereover. Conversely, in the case where, e.g., a layer having a lattice constant smaller than that of the channel underlying layer (AlGaN layer) UC such as an InAlN layer having a high Al composition ratio is formed over the channel underlying layer UC, tensile strain is applied to the layer located thereover.

As the channel layer CH, e.g., a GaN layer can be used. The channel layer CH is not intentionally doped with an impurity. The thickness of the GaN layer is, e.g., about 80 nm. As the material of the channel layer CH, AlN, InN, or the like can be used instead of GaN. It may also be possible to use a mixed crystal (such as InGaN layer, AlGaN layer, or InAlN layer) of such nitride semiconductors. Depending on the use of the semiconductor device, the material and thickness of the channel layer CH can be determined selectively and appropriately. Note that, in Embodiment 1, the non-doped channel layer CH is used. However, depending on the use of the semiconductor device, the channel layer CH may also be doped appropriately with an impurity. As the doping impurity, an n-type impurity or a p-type impurity can be used. Examples of the n-type impurity include Si, O, S, and Se. Examples of the p-type impurity include Be, C, Mg, and Zn.

However, since the channel layer CH is an electron transit layer, when the doping amount of the impurity is excessively large, the mobility of electrons may decrease due to Coulomb scattering. Accordingly, the doping amount of the impurity in the channel layer CH is preferably not more than $1\times10^{17}$ (1E17) cm$^{-3}$.

As the channel layer CH, a nitride semiconductor having an electron affinity larger than those of the channel underlying layer UC and the barrier layer BA is used preferably. As described above, when the AlGaN layer is used as the channel underlying layer UC, the GaN layer is used as the channel layer CH, and the respective lattice constants of these layers are different, the film thickness of the channel layer CH needs to be not more than a critical film thickness beyond which dislocations increase.

As the barrier layer BA, e.g., an $Al_{0.2}Ga_{0.8}N$ layer can be used. The thickness of the $Al_{0.2}Ga_{0.8}N$ layer is, e.g., about 30 nm. As the material of the barrier layer BA, an InAlN layer or the like can be used instead of the AlGaN layer. An Al composition ratio or the like may also be adjusted appropriately. Alternatively, it may also be possible to stack films having different Al composition ratios and use the barrier layer BA having a multi-layer structure. As the material of the barrier layer BA, a GaN layer, an AlN layer, an InN layer, or the like can be used. It may also be possible to use a mixed crystal of such nitride semiconductors. Depending on the use of the semiconductor device, the material, thickness, and the like of the barrier layer BA can be determined selectively and appropriately. Note that, as the barrier layer BA, a non-doped layer may also be used or, depending on the use of the semiconductor device, the barrier layer BA may also be doped appropriately with an impurity. As the doping impurity, an n-type impurity or a p-type impurity can be used. Examples of the n-type impurity include Si, O, S, and Se. Examples of the p-type impurity include Be, C, Mg, and Zn. However, when the doping amount of the impurity in the barrier layer BA is excessively large, the vicinity of the gate electrode GE described later is susceptible to the influence of the potential of the drain electrode DE and the breakdown voltage thereof may decrease. In addition, since the impurity in the barrier layer BA may cause the Coulomb scattering in the channel layer CH, the mobility of electrons may decrease. Accordingly, the doping amount of the impurity in the barrier layer BA is preferably not more than $1 \times 10^{17}$ (1E17) $cm^3$. More preferably, the non-doped barrier layer BA is used.

When the GaN layer is used as the channel layer CH, the AlGaN layer is used as the barrier layer BA, and these layers have different lattice constants, the film thickness of the barrier layer BA needs to be not more than a critical film thickness beyond which dislocations increase.

Also, as described above, for the barrier layer BA, a nitride semiconductor having an electron affinity smaller than that of the channel layer CH needs to be used. However, in the case of using the barrier layer BA having the multi-layer structure, it may also be possible that the multiple layers include a layer having an electron affinity larger than that of the channel layer CH. It is sufficient for the multiple layers to include at least one or more layers each having an electron affinity smaller than that of the channel layer CH.

As the cap layer CP, e.g., a GaN layer can be used. A thickness of the GaN layer is, e.g., about 2 nm. As the cap layer CP, an AlN layer, an InN layer, or the like can be used instead of the GaN layer. It may also be possible to use a mixed crystal (e.g., AlGaN or InAlN) of such nitride semi-conductors. Alternatively, the cap layer CP may also be omitted.

For the cap layer CP, a nitride semiconductor having an electron affinity larger than that of the barrier layer BA is used preferably. As the cap layer CP, a non-doped layer may also be used or, depending on the use of the semiconductor device, the cap layer CP may also be doped appropriately with an impurity. As the doping impurity, an n-type impurity or a p-type impurity can be used. Examples of the n-type impurity include Si, O, S, and Se. Examples of the p-type impurity include Be, C, Mg, and Zn.

In the case where an AlGaN layer is used as the channel underlying layer UC, a GaN layer is used as the cap layer C, and these layers have different lattice constants, the film thickness of the cap layer CP needs to be not more than a critical film thickness beyond which dislocations increase.

The insulating film IF1 functions to diffuse hydrogen into the region where the n-type semiconductor region CDn is to be formed. Accordingly, in Embodiment 1, as the insulating film IF1, a film containing hydrogen at a high concentration can be used. Specifically, a SiN film containing hydrogen at a high concentration and a film thickness of about 200 nm can be used. The material and thickness of the film containing hydrogen at a high concentration can be determined selectively and appropriately depending on the use of the semiconductor device. The film containing hydrogen at a high concentration may also have a multi-layer structure including several types of films. In addition to SiN, $SiO_2$, SiON, SiOC, $Al_2O_3$, $HfO_2$, $ZrO_2$, and the like can be used. Besides, an organic insulating film or the like may also be used.

Note that the insulating film IF1 remaining as a final structure is provided with the function of the film for diffusing hydrogen herein. However, it may also be possible to remove the film for diffusing hydrogen and add another insulating film. However, since the SiN film is easily allowed to contain hydrogen at a high concentration and, to suppress a current collapse, interface states are formed at a low density at the interface between the SiN film and the nitride semiconductor in the layer located thereunder, the SiN film is used appropriately as the insulating film IF.

The gate electrode GE is formed in the trench (referred to also as a recess) T formed to extend through the insulating film IF1, the cap layer CP, and the barrier layer BA and reach a middle point in the channel layer CH via the gate insulating film GI.

As the gate insulating film GI, an aluminum oxide ($Al_2O_3$) film can be used. The aluminum oxide film has a thickness of, e.g., about 50 nm. As the gate insulating film GI, an insulating film other than the aluminum oxide film may also be used. The gate insulating film GI may also have a multi-layer structure including several types of insulating films. Depending on the use of the semiconductor device, the material and thickness of the gate insulating film GI can be determined selectively and appropriately. As the gate insulating film GI, a film having a band gap larger than that of the nitride semiconductor in the layer located thereunder and an electron affinity smaller than that of the nitride semiconductor in the layer located thereunder is preferred. As a film which satisfies such conditions, not only the aluminum oxide film, but also a silicon dioxide ($SiO_2$) film, a silicon nitride (SiN) film, a hafnium oxide ($HfO_2$) film, a zirconium oxide ($ZrO_2$) film, or the like can be listed. Since the gate insulating film GI affects the voltage applicable to the gate electrode GE and the threshold voltage thereof, the gate insulating film GI is preferably set in consideration of the breakdown voltage, dielectric constant, and film thickness thereof.

As the gate electrode GE, a titanium nitride (TiN) film can be used. The thickness of the titanium nitride film is, e.g., about 200 nm. As the gate electrode GE, a conductive film other than the titanium nitride film may also be used. For example, a polycrystalline silicon film doped with an impurity such as boron (B) or phosphorus (P) may also be used. Alternatively, a metal film made of Ti, Al, Ni, Au, or the like may also be used. Still alternatively, a compound film (metal silicide film) of metal such as Ti, Al, Ni, or Au and Si may also be used. Yet alternatively, a film made of a nitride of metal such as Ti, Al, Ni, or Au may also be used. The gate electrode GE may also have a multi-layer structure including several types of conductive films. Depending on the use of the semiconductor device, the material and thickness of the gate electrode GE can be determined selectively and appropriately.

For the gate electrode GE, a material which is unlikely to react with a film (e.g., gate insulating film GI) in a layer located thereunder or a film (e.g., interlayer insulating film IL1) in a layer located thereover is preferably used selectively.

Over the gate electrode GE, the interlayer insulating film IL1 is disposed. The interlayer insulating film IL1 has the through hole TH and the contact holes C1S and C1D.

As the interlayer insulating film IL1, e.g., a silicon dioxide film can be used. The thickness of the silicon dioxide film is, e.g., about 500 nm. Alternatively, an insulating film other than the silicon dioxide film may also be used. The interlayer insulating film IL1 may also have a multi-layer structure including several types of insulating films. Depending on the use of the semiconductor device, the material and thickness of the interlayer insulating film IL1 can be determined selectively and appropriately. As the interlayer insulating film IL1, a film having a band gap larger that of the nitride semiconductor in the layer located thereunder and an electron affinity smaller than that of the nitride semiconductor in the layer located thereunder is preferred. Also, as the interlayer insulating film IL1, a material which is unlikely to react with the gate electrode GE in contact with the interlayer insulating film IL1 is preferably used selectively. As a film which satisfies such conditions, not only a silicon dioxide film, but also a silicon nitride film, a silicon oxynitride film, an aluminum oxide ($Al_2O_3$) film, a hafnium oxide ($HfO_2$) film, a zirconium oxide ($ZrO_2$) film, and the like can be listed.

Over the interlayer insulating film IL1 including the through hole TH and the contact holes C1S and C1D, a conductive film is formed. In Embodiment 1, a multi-layer film including a TiN film and an Al film is formed. Of the multi-layer film, the portions located in the contact holes C1S and C1D serve as the source electrodes SE and the drain electrodes DE. On the other hand, the portion of the multi-layer film located in the through hole TH serves as the coupling portion VIA.

As each of the source electrodes SE and the drain electrodes DE, a multi-layer film including a TiN film and an Al film located thereover can be used. The thickness of the TiN film is, e.g., about 50 nm. The thickness of the Al film is, e.g., about 1000 nm. As the material of the source electrodes SE and the drain electrodes DE, any material which makes an ohmic contact with the nitride semiconductor layer (cap layer CP) at the bottom portions of the contact holes (C1S ad C1D) can be used appropriately. As the material forming the source electrodes SE and the drain electrodes DE, a metal film made of Ti, Al, Mo (molybdenum), Nb (niobium), V (vanadium), or the like may also be used. Alternatively, as the material forming the source electrodes SE and the drain electrodes DE, a film made of a mixture (alloy) of such metals, a film (metal silicide film) made of a compound of any of such metals and Si, a film made of a nitride of any of such metals, or the like can be used. Still alternatively, a multi-layer film made of such materials may also be used.

As the coupling portion VIA, in the same manner as for the source electrodes SE and the drain electrodes DE each described above, a multi-layer film including a TiN film and an Al film located thereover can be used. In particular, when the nitride semiconductor layer (which is the n-type semiconductor region CDn herein) at the bottom portion of the coupling portion VIA has the n-type conductivity type, an ohmic contact is likely to be made. Note that, to reduce the coupling resistance between the coupling portion VIA and the nitride semiconductor layer (which is the n-type semiconductor region CDn herein), an impurity ion implanted layer may also be provided at the bottom surface of the through hole TH. The thickness of the TiN film is, e.g., about 50 nm. The thickness of the Al film is, e.g., about 1000 nm. As the material forming the coupling portion VIA, any material that makes an ohmic contact with the nitride semiconductor (potential fixed layer) at the bottom portion of the through hole TH can be used. Also, as the material forming the coupling portion VIA, a material which is unlikely to react with the interlayer insulating film IL1 in contact with the coupling portion VIA is preferably used selectively.

In Embodiment 1, the bottom surface of the through hole TH is located at a middle point in the codoped layer CD (n-type semiconductor region CDn) and the coupling portion VIA is disposed in the through hole TH. However, it is sufficient for the coupling portion VIA to be disposed so as to come in contact with the codoped layer CD (n-type semiconductor region CDn). For example, a configuration may also be such that, e.g., the bottom surface of the through hole TH is located at the upper surface of the codoped layer (n-type semiconductor region CDn) and the bottom portion of the coupling portion VIA is in contact with the codoped layer CD (n-type semiconductor region CDn). Alternatively, a configuration may also be such that the bottom surface of the through hole TH is located below the bottom surface of the codoped layer (n-type semiconductor region CDn) and a part of the side surface of the coupling portion VIA is in contact with the codoped layer (n-type semiconductor region CDn). For example, the bottom surface of the through hole TH may be located at the top surface of the buffer layer BU or at a middle point in the buffer layer BU. Alternatively, the bottom surface of the through hole TH may also be located at the top surface of the nucleation layer NUC or at a middle point in the nucleation layer NUC. Still alternatively, the bottom surface of the through hole TH may also be located at the top surface of the substrate S or at a middle point in the substrate S. However, in the contact between a part of the side surface of the coupling portion VIA and the codoped layer CD (n-type semiconductor region CDn), the contact area may be reduced. Accordingly, the bottom surface of the through hole TH is preferably located at or below the upper surface of the codoped layer CD (n-type semiconductor region CDn) and above the lower surface of the codoped layer CD (n-type semiconductor region CDn).

Note that, in Embodiment 1, the source pad SP and the drain pad DP are respectively formed integrally with the source electrodes SE and the drain electrodes DE. Accordingly, the source pad SP and the drain pad DP are formed of the same material as that of the source electrodes SE and the drain electrodes DE. Under the via pad VIAP, the foregoing coupling portion VIA is disposed (FIG. 7). Accordingly, the via pad VIAP is made of the same material as that of the coupling portion VIA. The source electrodes SE, the drain electrodes DE, the source pad SP, the drain pad DP, the via pad VIAP, and the coupling portion VIA may also be formed of the same material.

In Embodiment 1, the source pad SP and the via pad VIAP are separately provided. This allows the respective potentials applied to the source pad SP and the via pad VIAP to be individually controlled.

<Description of Manufacturing Method>

Next, referring to FIGS. 8 to 30, a method of manufacturing a semiconductor device in Embodiment 1 will be described and also a configuration of the semiconductor device will be specified. FIGS. 8 to 30 are cross-sectional views or plan views showing the manufacturing process of the semiconductor device in Embodiment 1.

Figure 8:
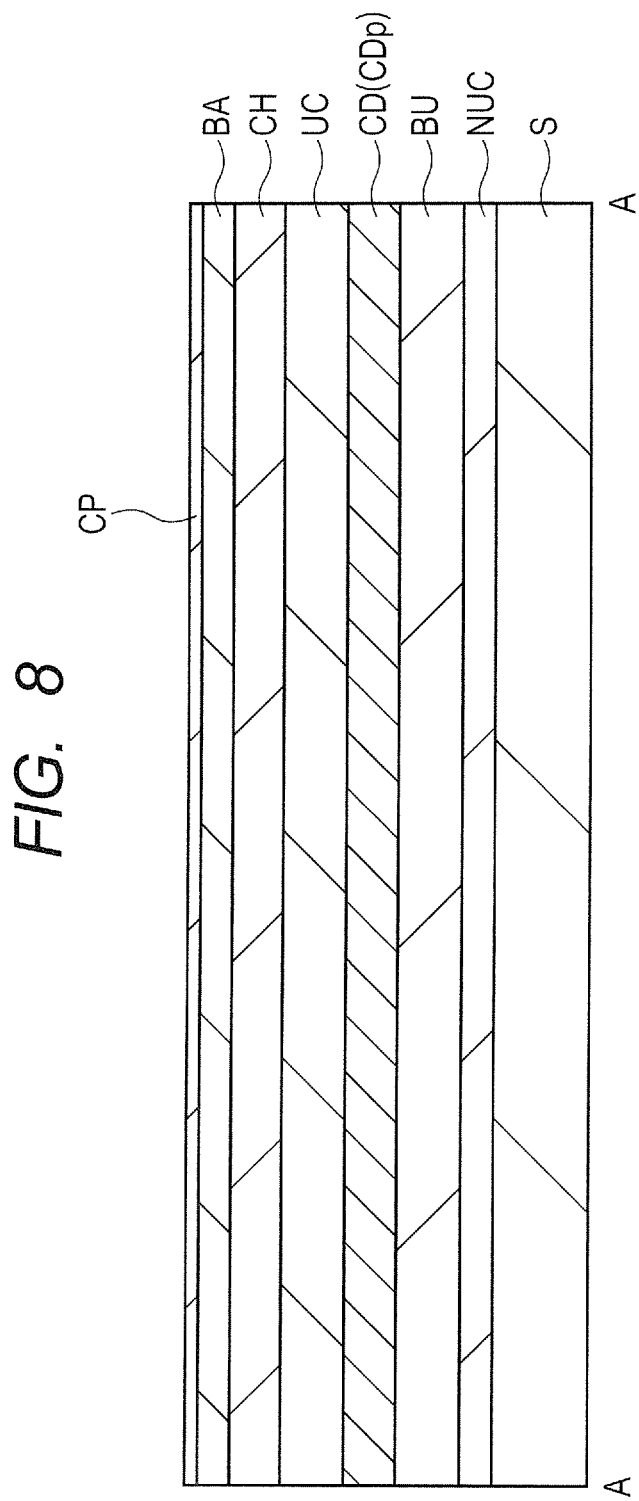
FIG. 8 is a cross-sectional view showing a manufacturing process of the semiconductor device in Embodiment 1.

As shown in FIG. 8, over the substrate S, the nucleation layer NUC and the buffer layer BU are successively formed. As the substrate S, e.g., a semiconductor substrate made of silicon (Si) having an exposed (111) plane is used. Over the substrate S, as the nucleation layer NUC, e.g., an aluminum nitride (AlN) layer is hetero-epitaxially grown using a Metal Organic Chemical Vapor Deposition (MOCVD) method or the like to have a film thickness of about 200 nm.

As the substrate S, a substrate made of SiC, sapphire, or the like instead of silicon mentioned above may also be used. Typically, the nucleation layer NUC and the nitride semiconductor layers (III-V group compound semiconductor layers) over the nucleation layers NUC are all formed by III-group-element plane growth (i.e., in the present application, by gallium plane growth or aluminum plane growth).

Then, over the nucleation layer NUC, as the buffer layer BU, the superlattice structure is formed by repeatedly stacking multi-layer films (AlN/GaN films) each including a gallium nitride (GaN) layer and an aluminum nitride (AlN) layer. For example, gallium nitride (GaN) layers each having a film thickness of about 20 nm and aluminum nitride (AlN) layers each having a film thickness of about 5 nm are alternately hetero-epitaxially grown using a metal organic chemical vapor deposition method or the like. For example, the forty multi-layer films described above are formed. The multi-layer films may also be grown while being doped with carbon (C). For example, the multi-layer films are doped with carbon such that a carbon concentration in each of the multi-layer films is, e.g., about $1 \times 10^{19}$ (1E19) $cm^{-3}$.

Over the buffer layer BU, an AlGaN layer having a film thickness of about 1 μm may also be hetero-epitaxially grown as a part of the buffer layer BU using a metal organic chemical vapor deposition method or the like.

Next, over the buffer layer BU, the codoped layer CD is formed. First, a nitride semiconductor layer is formed, while being doped with a p-type impurity and an n-type impurity (while a p-type impurity and an n-type impurity are introduced into the nitride semiconductor layer). For example, an AlGaN layer containing a p-type impurity (which is Mg herein) and an n-type impurity (which is Si herein) is grown using, e.g., a metal organic chemical vapor deposition method. The composition of Al is set to about 5%. For example, the layer is grown while, e.g., a carrier gas and source gases are introduced into an apparatus. As the source gases, gases containing the respective component elements of the nitride semiconductor layer (which is a GaN layer herein) are used. For example, during the deposition of the AlGaN layer, as the respective source gases of Al, G, and N, trimethyl aluminum (TMA), trimethyl gallium (TMG), and ammonia are used. As the source gas of Mg as the p-type impurity, bis(cyclopentadienyl) magnesium (($C_5H_5$)$_2$Mg)) is used while, as the source gas of Si as the n-type impurity, silane is used. Thus, in accordance with an epitaxial growth method, by adjusting the respective flow rates of the source gases, the respective doping amounts (introduction amounts) of the p-type impurity and the n-type impurity can easily and accurately be adjusted. In addition, in accordance with the epitaxial growth method, a lattice defect resulting from the implantation of an atom is less likely to be formed than in an ion implantation method. Accordingly, the nitride semiconductor layer (which is the AlGaN layer herein) having particularly excellent properties can be formed.

For example, a GaN layer in which the concentration (doping amount) of Mg is $1 \times 10^{18}$ $cm^{-3}$ and the concentration (doping amount) of Si is $2 \times 10^{17}$ $cm^{-3}$ is grown to have a film thickness of about 400 nm. Needless to say, depending on the use of the semiconductor device, the types and concentrations of doping impurities and the material and thickness of the nitride semiconductor can be determined selectively and appropriately. As the material of the nitride semiconductor, GaN, AlN, or InN can be used instead of AlGaN. It may also be possible to use a mixed crystal thereof. As the n-type doping impurity, e.g., O, S, Se, or the like can be used instead of Si. As the p-type doping impurity, Zn, Be, C, or the like can be used instead of Mg. Among them, Si and Mg are used preferably.

It is necessary to set the concentration of the activated p-type impurity higher than the activated concentration of the n-type impurity (Activated Concentration of n-Type Impurity<Activated Concentration of p-Type Impurity). Preferably, the respective amounts of the p-type impurity (which is Mg herein) and the n-type impurity (which is Si herein) to be introduced into the codoped layer CD are adjusted in consideration of the respective activation rates of the p-type impurity (which is Mg herein) and the n-type impurity (which is Si herein). For example, in consideration of the activation rate, the concentration of the p-type impurity (which is Mg herein) to be introduced into the codoped layer CD is adjusted to be preferably not less than double, more preferably not less than five times, or most preferably not less than 10 times the concentration of the n-type impurity (which is Si herein). The concentration of the p-type impurity (which is Mg herein) is preferably set to the range of $5 \times 10^{17}$ $cm^{-3}$ to $2 \times 10^{19}$ $cm^{-3}$. The concentration of the n-type impurity (which is Si herein) is preferably set to the range of $5 \times 10^{16}$ $cm^{-3}$ to $2 \times 10^{18}$ $cm^{-3}$. When the respective concentrations of the p-type impurity and the n-type impurity are in such ranges, it is possible to epitaxially grow a nitride semiconductor layer (e.g., AlGaN layer), while accurately introducing the p-type impurity (which is Mg herein) and the n-type impurity (which is Si herein) into the codoped layer CD.

Then, over the codoped layer CD, the channel underlying layer UC is formed. Over the codoped layer CD, as the channel underlying layer UC, e.g., an AlGaN layer is hetero-epitaxially grown using a metal organic chemical vapor deposition method or the like. At this time, the AlGaN layer is grown without being subjected to intentional doping with an impurity. The film thickness of the AlGaN layer is set to, e.g., about 1000 nm. The composition of Al is set to, e.g., about 3%.

Next, over the channel underlying layer UC, the channel layer CH is formed. For example, over the channel underlying layer UC, a gallium nitride layer (GaN layer) is hetero-epitaxially grown using a metal organic chemical vapor deposition method or the like. At this time, the gallium nitride layer is grown without being subjected to intentional doping with an impurity. The film thickness of the channel layer CH is set to, e.g., about 50 nm.

Next, over the channel layer CH, as the barrier layer BA, e.g., an AlGaN layer is hetero-epitaxially grown using a metal organic chemical vapor deposition method or the like. For example, an $Al_{0.2}Ga_{0.8}N$ layer is formed by setting the composition ratio of Al to 0.2 and setting the composition ratio of Ga to 0.8. The composition ratio of Al in the AlGaN layer as the barrier layer BA is set higher than the composition ratio of Al in the AlGaN layer as the channel underlying layer UC described above.

Thus, a multi-layer including the channel underlying layer UC, the channel layer CH, and the barrier layer BA is formed. In the multi-layer, in the vicinity of the interface between the channel layer CH and the barrier layer BA, a two-dimensional electron gas (2DEG) is generated.

Next, over the barrier layer BA, the cap layer CP is formed. For example, over the barrier layer BA, a gallium nitride layer (GaN layer) is hetero-epitaxially grown using a metal organic chemical vapor deposition method or the like. At this time, the gallium nitride layer is grown without being subjected to intentional doping with an impurity. The film thickness of the cap layer CP is, e.g., about 2 nm.

Next, heat treatment for activating the p-type impurity (which is Mg herein) in the codoped layer CD is performed. For example, the heat treatment is performed in a nitrogen atmosphere at 800° C. for 30 minutes. As a result, the p-type impurity (which is Mg herein) is activated. The n-type impurity (which is Si herein) is likely to be activated so that, before the heat treatment is performed, the n-type impurity has already been activated.

Figure 9:
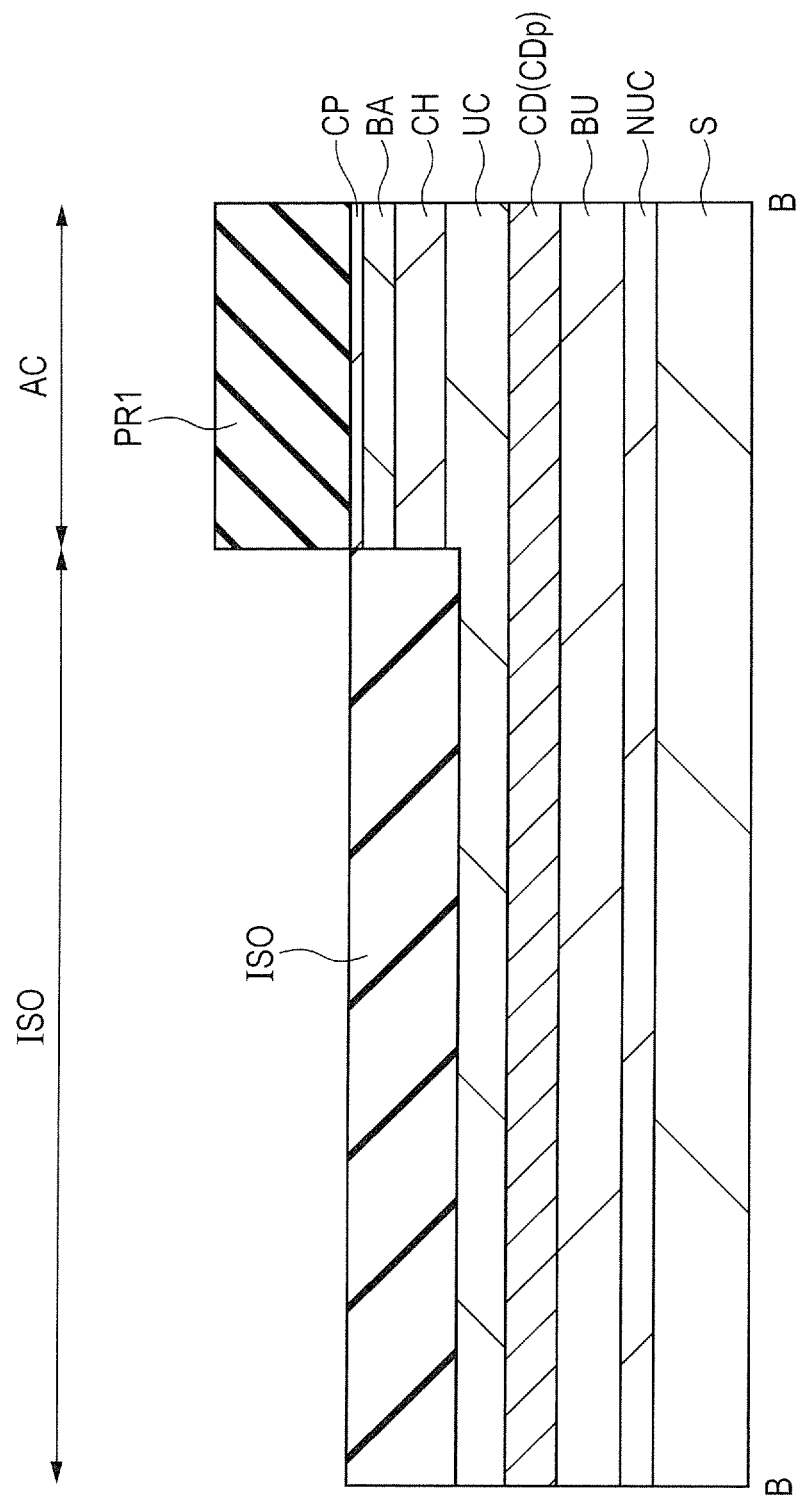
FIG. 9 is a cross-sectional view showing the manufacturing process of the semiconductor device in Embodiment 1.

Next, as shown in FIG. 9, by a photolithographic process, a photoresist film PR1 having an opening corresponding to the isolation region is formed over the cap layer CP. Then, using the photoresist film PR1 as a mask, boron ions are implanted to form the isolation region ISO. By thus implanting an ion species such as boron (B) or nitrogen (N), the crystalline state is changed to result in a higher resistance.

Figure 10:
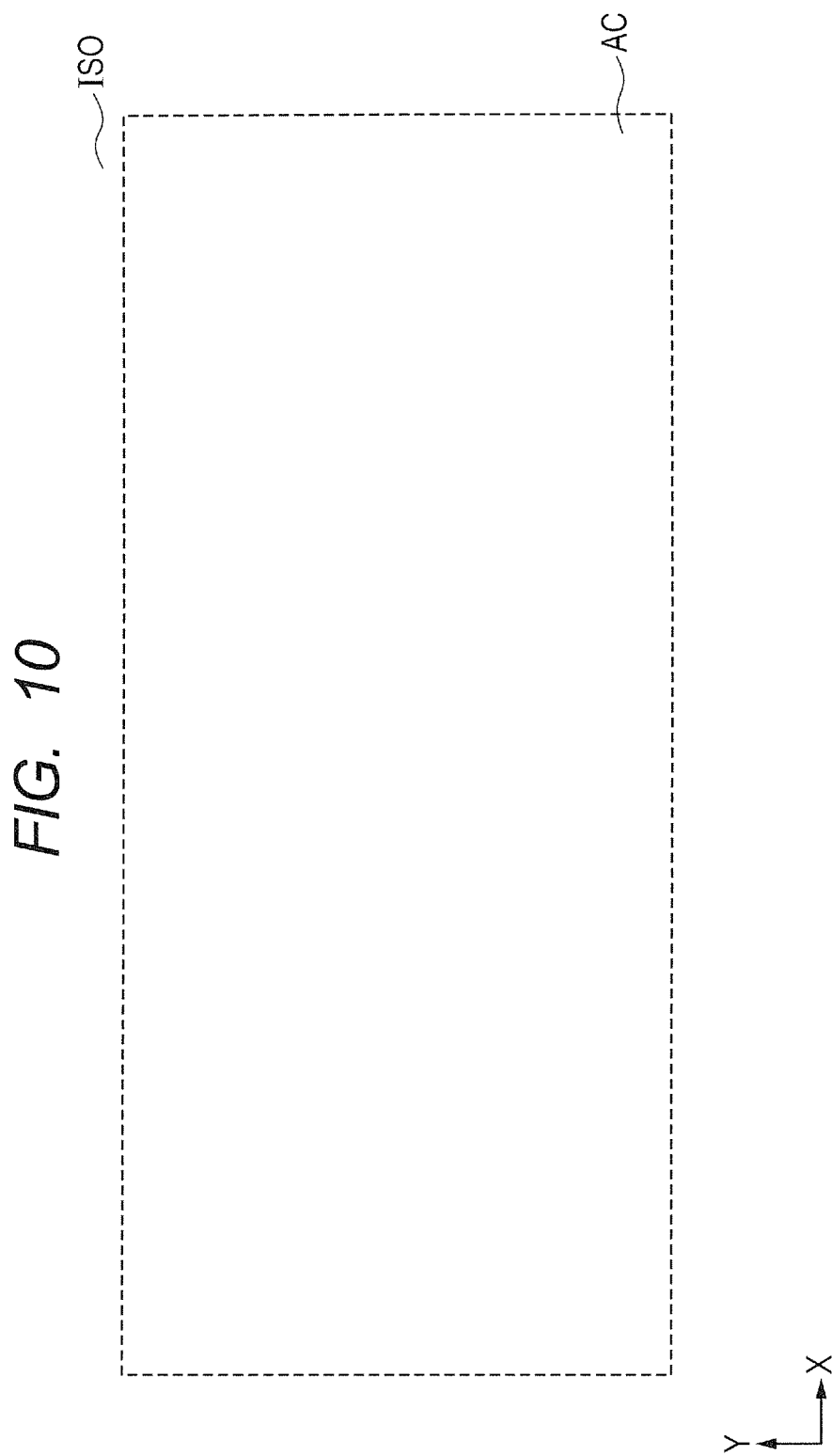
FIG. 10 is a plan view showing the manufacturing process of the semiconductor device in Embodiment 1.
Figure 11:
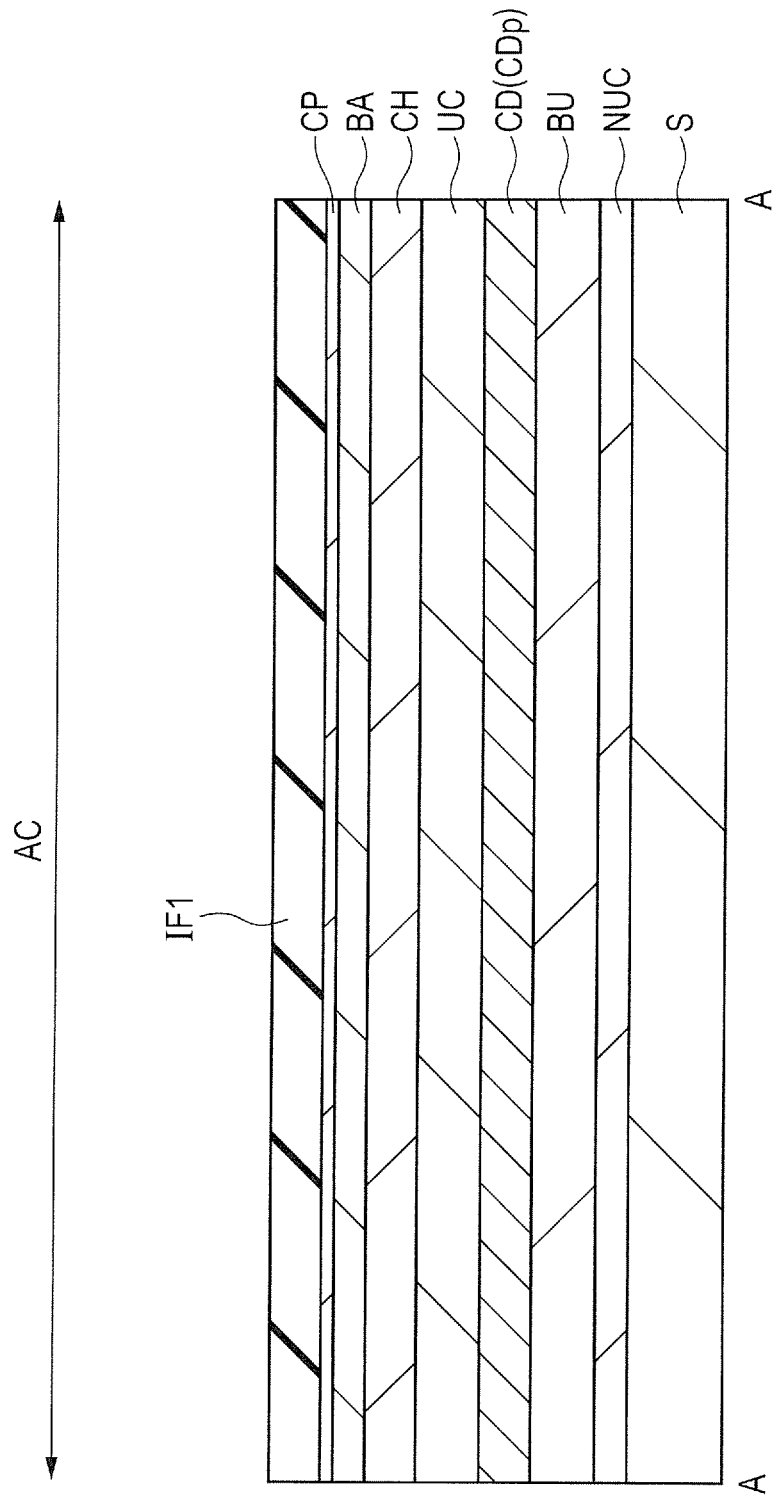
FIG. 11 is a cross-sectional view showing the manufacturing process of the semiconductor device in Embodiment 1.

For example, boron ions are implanted at a density of about $1 \times 10^{14}$ (1E14) $cm^{-2}$ into the multi-layer including the channel underlying layer UC, the channel layer CH, and the barrier layer BA. An implantation energy is, e.g., about 35 keV. Nitrogen ion implantation conditions are adjusted such that an implantation depth, i.e., the bottom portion of the isolation region ISO is located below the bottom surface of the channel layer CH and above the bottom surface of the codoped layer CD. Note that the bottom portion of the isolation region ISO is located above the bottom portion of the through hole TH (coupling portion VIA) described later. Thus, the isolation region ISO is formed. The region surrounded by the isolation region ISO serves as the active region AC. As shown in FIG. 10, the active region AC has, e.g., a generally rectangular shape having long sides in the X-direction Next, as shown in FIG. 11, over the cap layer CP, the insulating film IF1 is formed. The insulating film IF1 serves as a film for introducing hydrogen (H) into the codoped layer CD.

Over the cap layer CP, as the insulating film IF1, a silicon nitride film containing hydrogen at a high concentration is formed to have a film thickness of about 100 nm using a PECVD (plasma-enhanced chemical vapor deposition) method or the like. For example, by depositing the silicon nitride film by the PECVD method in which, e.g., $SiH_4$ and $NH_3$ are used as source gases and the ratio of the flow rate of $NH_3$ to the flow rate of $SiH_4$ is set to 2 or more, the silicon nitride film containing hydrogen at a high concentration can be formed. Note that, as the insulating film, the silicon nitride film (SiN film) is used herein but, instead of the SiN film, a $SiO_2$ film, a SiON film, a SiOC film, an $Al_2O_3$ film, a $HfO_2$ film, a $ZrO_2$ film, or the like can also be used. Alternatively, an organic insulating film or the like may also be used. During the deposition of an inorganic film such as a SiN film by a CVD method or the like, by using a hydrogen compound gas as a source gas or using hydrogen as a carrier gas, hydrogen is introduced into the film. On the other hand, by using a film containing hydrogen in the composition thereof as the organic insulating film, hydrogen can be released from the film.

Figure 12:
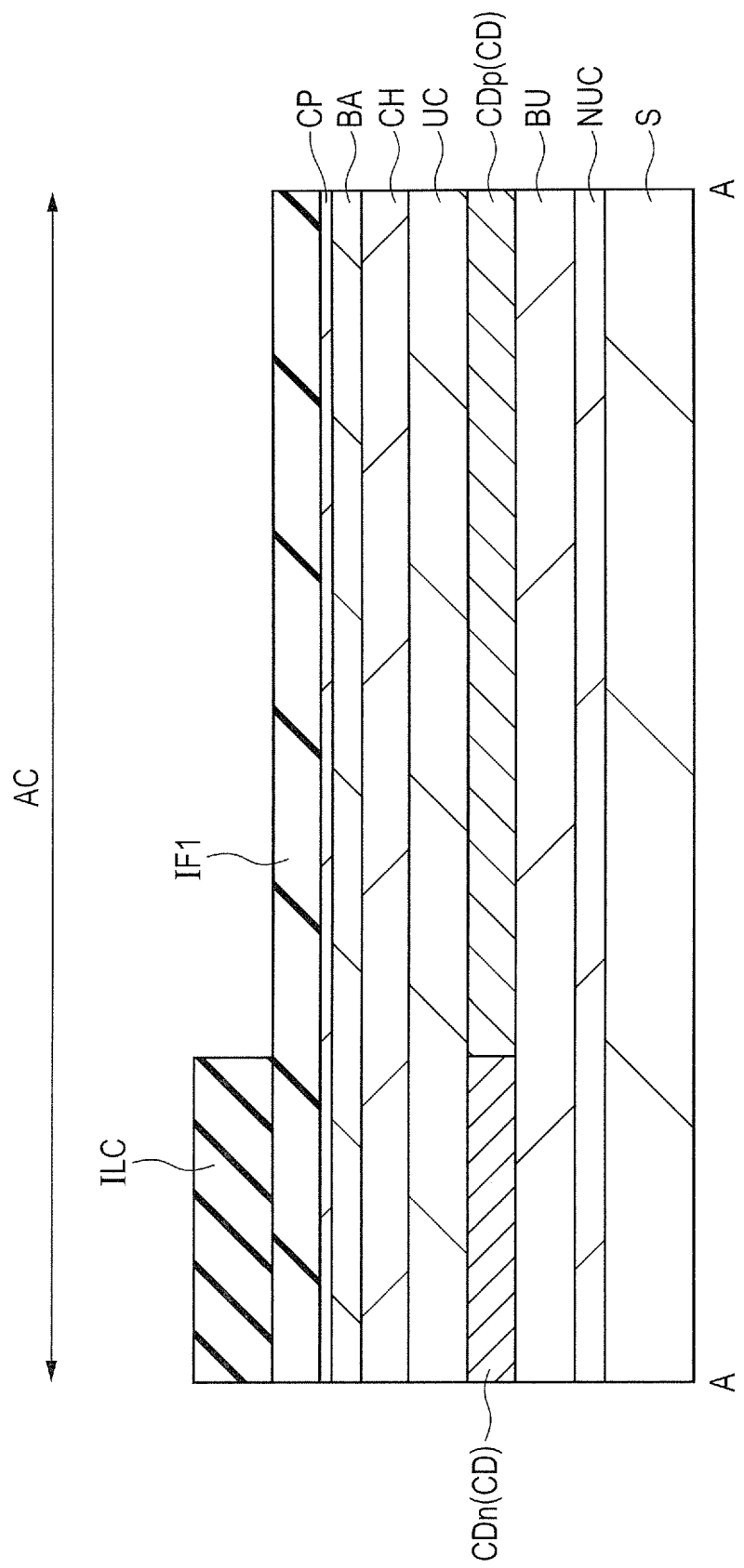
FIG. 12 is a cross-sectional view showing the manufacturing process of the semiconductor device in Embodiment 1.
Figure 13:
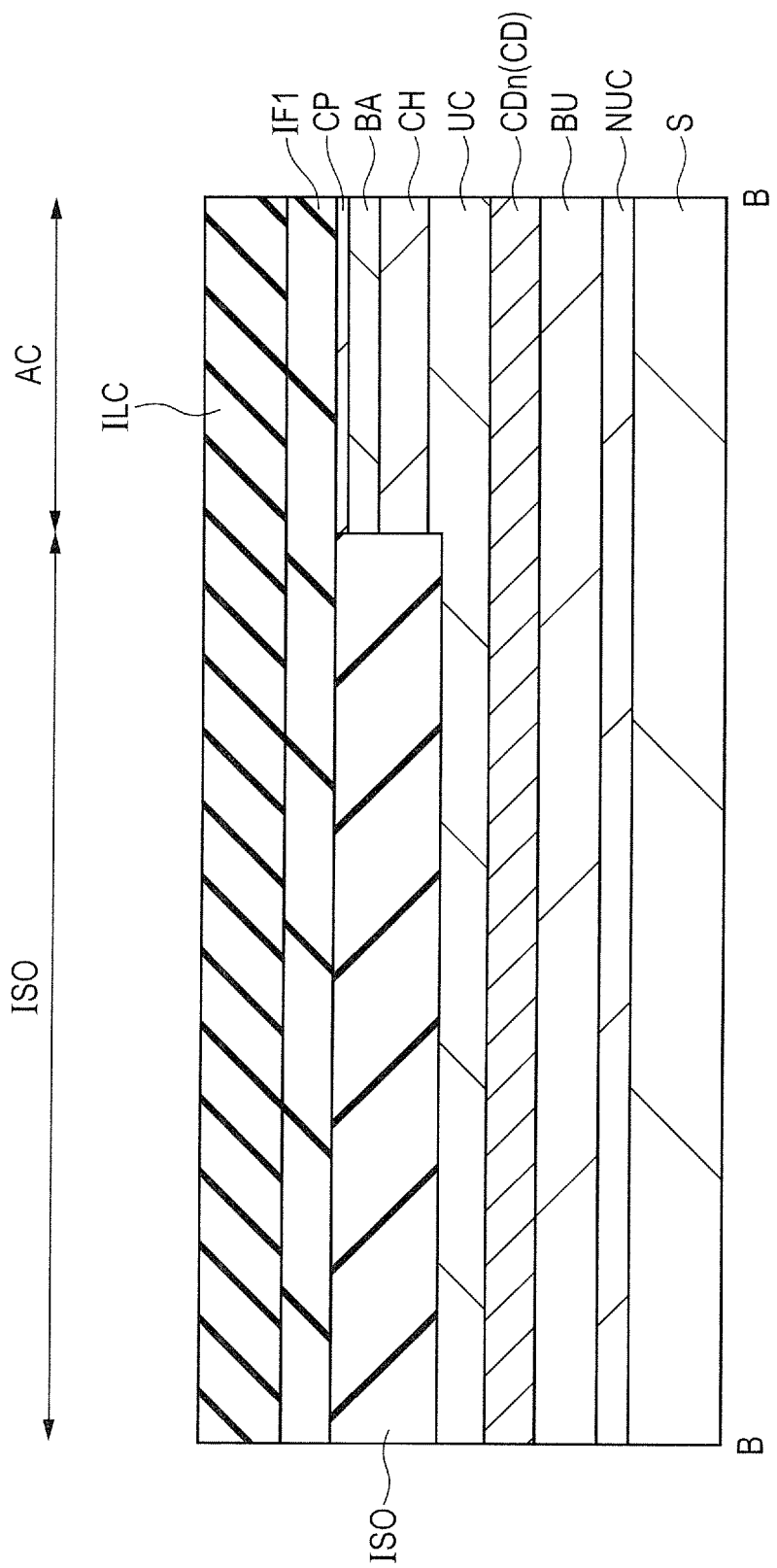
FIG. 13 is a cross-sectional view showing the manufacturing process of the semiconductor device in Embodiment 1.
Figure 14:
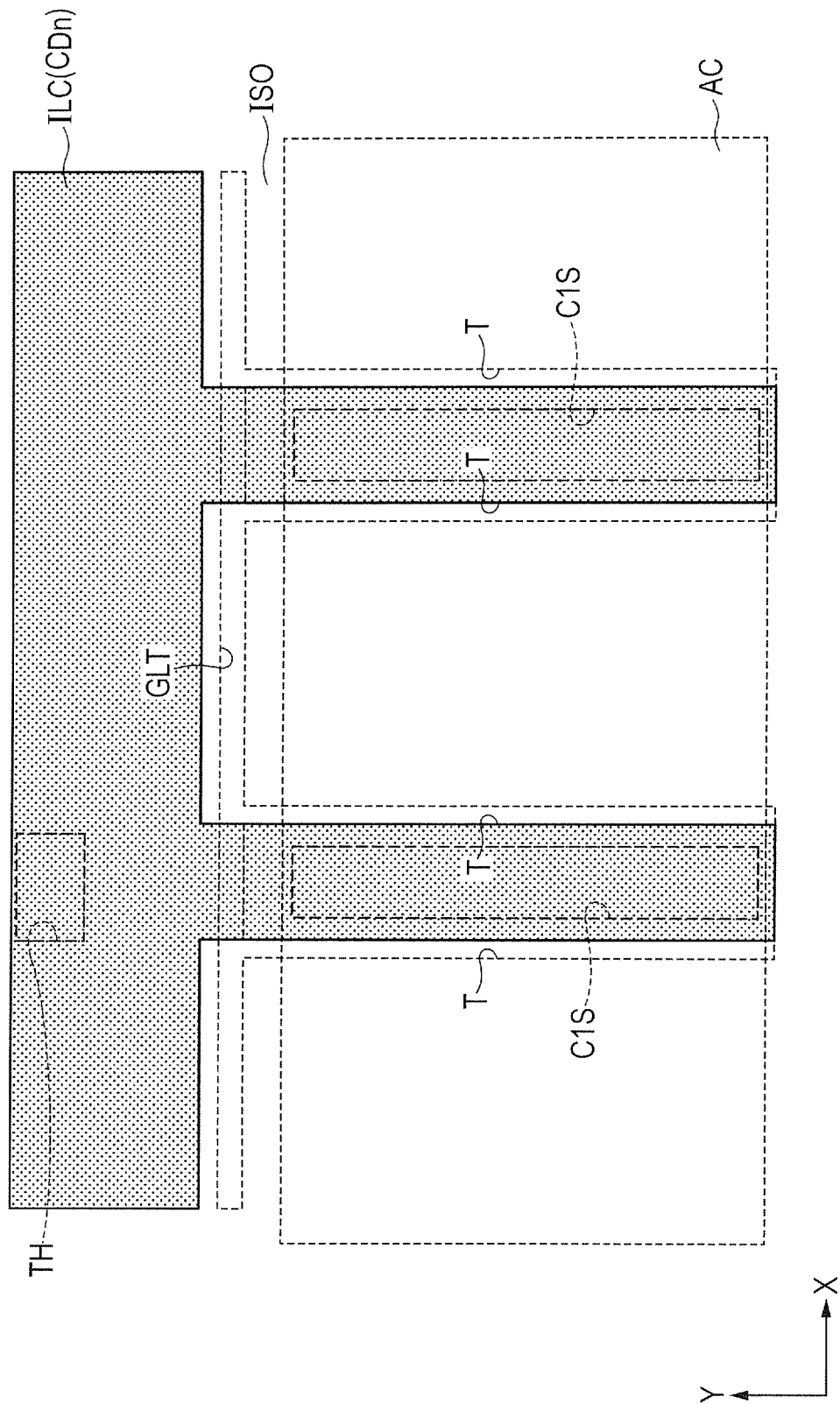
FIG. 14 is a plan view showing the manufacturing process of the semiconductor device in Embodiment 1.

Next, as shown in FIGS. 12 to 14, over the insulating film IF1 containing hydrogen at a high concentration, a cover insulating film ILC is formed. For example, using an atmospheric pressure CVD method or the like, a silicon dioxide film is formed to have a film thickness of about 200 nm. As the insulating film, the silicon dioxide film ($SiO_2$ film) is used herein but, instead of the $SiO_2$ film, a SiN film, a SiON film, a SiOC film, an $Al_2O_3$ film, a $HfO_2$ film, a $ZrO_2$ film, or the like can be used. Alternatively, an organic insulating film or the like can also be used. As the cover insulating film ILC, a film which is unlikely to transmit hydrogen (H) can be used. By thus using the film which is unlikely to transmit hydrogen (H) as the cover insulating film ILC, it is possible to reduce the amount of hydrogen (H) released from the upper surface of the insulating film IF1 containing hydrogen at a high concentration and efficiently introduce hydrogen (H) from the lower surface thereof, i.e., into the codoped layer CD. As the cover insulating film ILC, a film which is unlikely to transmit hydrogen (H) and is easy to remove is used preferably.

Next, using photolithography and an etching technique, from a multi-layer film including the insulating film IF1 containing hydrogen at a high concentration and the cover insulating film ILC, the cover insulating film ILC is removed from the region where the p-type semiconductor region CDp is to be formed. That is, over the foregoing multi-layer film, a photoresist film (not shown) is formed and is removed from the region where the p-type semiconductor region CDp is to be formed. Then, using the photoresist film as a mask, the cover insulating film ILC is removed from the foregoing multi-layer film. For example, by dry etching using a gas containing $CF_4$ as a main component, the foregoing cover insulating film ILC is removed. Then, the photoresist film is removed. Note that etching a lower-layer film using a film having an intended shape as a mask is referred to as patterning.

Next, heat treatment is performed to introduce hydrogen (H) from the insulating film IF1 containing hydrogen at a high concentration into the codoped layer CD through the cap layer CP, the barrier layer BA, the channel layer CH, and the channel underlying layer UC (FIG. 12). Hydrogen (H) is also introduced from the insulating film IF1 containing hydrogen at a high concentration into the codoped layer CD via the isolation region ISO and the channel underlying layer UC (FIG. 13). For example, the heat treatment is performed at 600° C. for 30 minutes. As a result, the hydrogen (H) in the insulating film IF1 is diffused into the codoped layer CD via the cap layer CP and the like. However, in Embodiment 1, the codoped layer CD as a target layer into which hydrogen (H) is to be introduced is at a relatively deep position and, in the region which is uncovered with the cover insulating film ILC, the hydrogen (H) in the insulating film IF1 is diffused also in an upward direction. Accordingly, downward diffusion is small so that the hydrogen (H) is scarcely diffused into the codoped layer CD. As a result, the hydrogen (H) is diffused only into the region covered with the cover insulating film ILC where the n-type semiconductor region CDn is to be formed. By thus using the presence or absence of the cover insulating film ILC, the introduction of hydrogen (H) can be controlled. When the introduction of hydrogen (H) cannot be controlled using only the presence or absence of the cover insulating film ILC, i.e., when the hydrogen (H) in the insulating film IF1 is excessively diffused in the downward direction in the region uncovered with the cover insulating film ILC, the insulating film IF1 may appropriately be removed from the region where the p-type semiconductor region CDp is to be formed. At this time, over the cap layer CP, a new insulating film may also be provided again. In this case, the insulating film need not contain hydrogen.

The introduction of hydrogen (H) inactivates the activated p-type impurity (which is Mg herein). Note that there is no inactivation of the n-type impurity (which is Si herein) by hydrogen (H). As a result, in the region where hydrogen (H) is introduced, Mg is inactivated to provide the n-type semiconductor region CDn. That is, the p-type semiconductor region CDp closer to the drain electrode (on the right side in FIG. 12) and the n-type semiconductor region CDn closer to the source electrode (on the left side in FIG. 12) can be formed in the same layer. Note that the cap layer CP, the barrier layer BA, the channel layer CH, and the channel underlying layer UC transmit hydrogen (H). Thus, a hydrogen (H) atom is small and can be diffused in a layer. For example, a hydrogen (H) atom can be diffused in a nitride semiconductor layer (GaN, AlN, InN, InGaN, AlGaN, or InAlN). On the other hand, SiN, SiON, SiOC, $Al_2O_3$, $HfO_2$, $ZrO_2$, or the like having a low H content can inhibit the diffusion of hydrogen (H). In the case where the nitride semiconductor layers (e.g., the cap layer CP, the barrier layer BA, the channel layer CH, and the channel underlying layer UC) located over the codoped layer CD have been doped with impurities, impurities other than Mg are used preferably to prevent the doping impurities from being inactivated by the foregoing step of introducing hydrogen (H). In the case of using Mg, in consideration of the rate of inactivation resulting from the foregoing step of introducing hydrogen (H), the doping may also be performed using Mg at a concentration higher than the intended concentration.

Then, the foregoing cover insulating film ILC is removed. For example, the foregoing multi-layer film is removed by wet etching using an aqueous HF solution.

Note that a so-called solid phase diffusion method which introduces hydrogen (H) from the insulating film IF1 containing hydrogen into the codoped layer CD is used herein. However, as described above, hydrogen (H) may also be introduced into the codoped layer CD using an ion implantation method. In this case, it is appropriate to form a photoresist film (not shown) over the insulating film IF1 so as to cover the region where the p-type semiconductor region CDp is to be formed and ion-implant hydrogen (H) into the codoped layer CD. Needless to say, in this case, the insulating film IF1 need not contain hydrogen. Specifically, using the foregoing photoresist as a mask, hydrogen (H) is ion-implanted into the codoped layer CD via the insulating film IF1, the cap layer CP, the barrier layer BA, the channel layer CH, and the channel underlying layer UC (see FIG. 12). Hydrogen (H) is also ion-implanted into the codoped layer CD via the insulating film IF1, the isolation region ISO, and the channel underlying layer UC (see FIG. 13). Then, heat treatment is performed to inactivate the p-type impurity (which is Mg herein) in the codoped layer CD. Instead, it may also be possible to perform hydrogen plasma treatment, hydrogen anneal, or the like using the foregoing photoresist as a mask.

Figure 15:
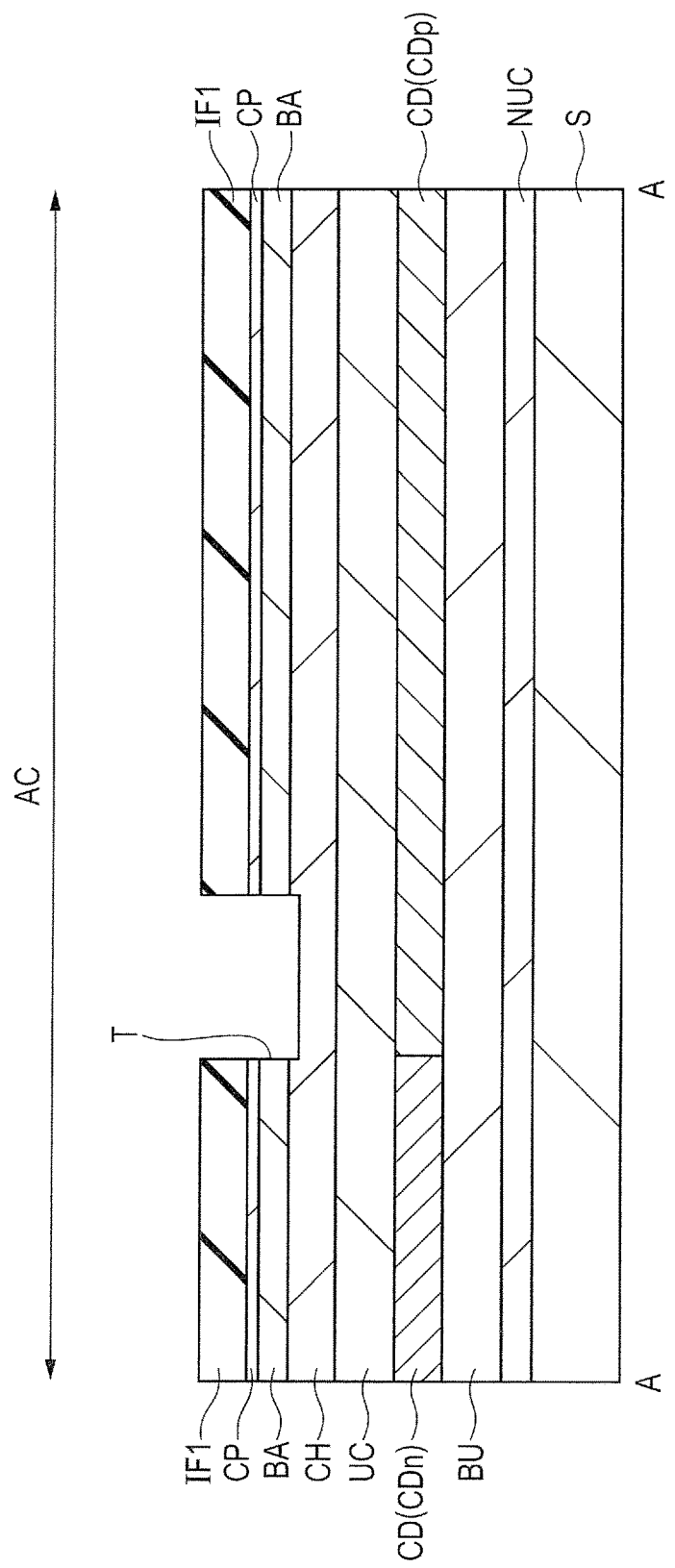
FIG. 15 is a cross-sectional view showing the manufacturing process of the semiconductor device in Embodiment 1.
Figure 16:
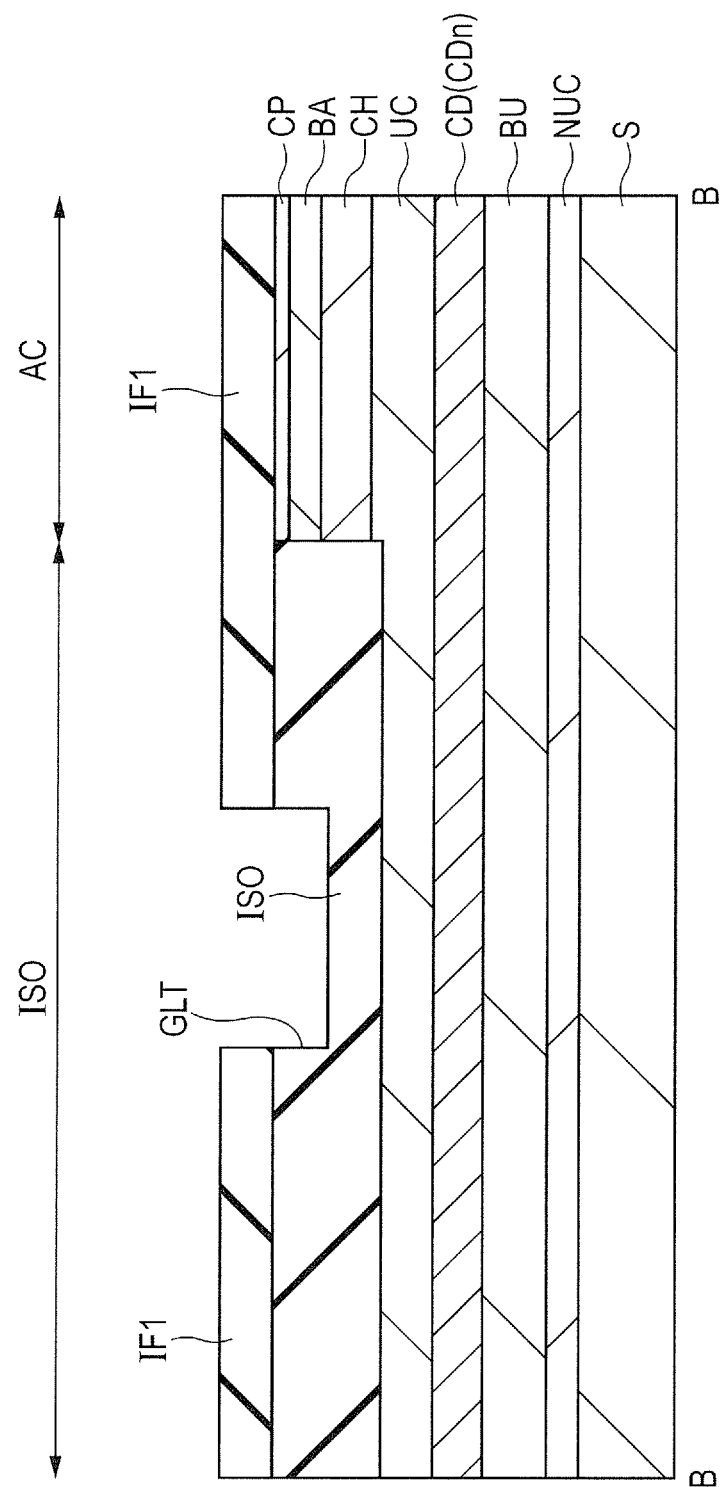
FIG. 16 is a cross-sectional view showing the manufacturing process of the semiconductor device in Embodiment 1.
Figure 17:
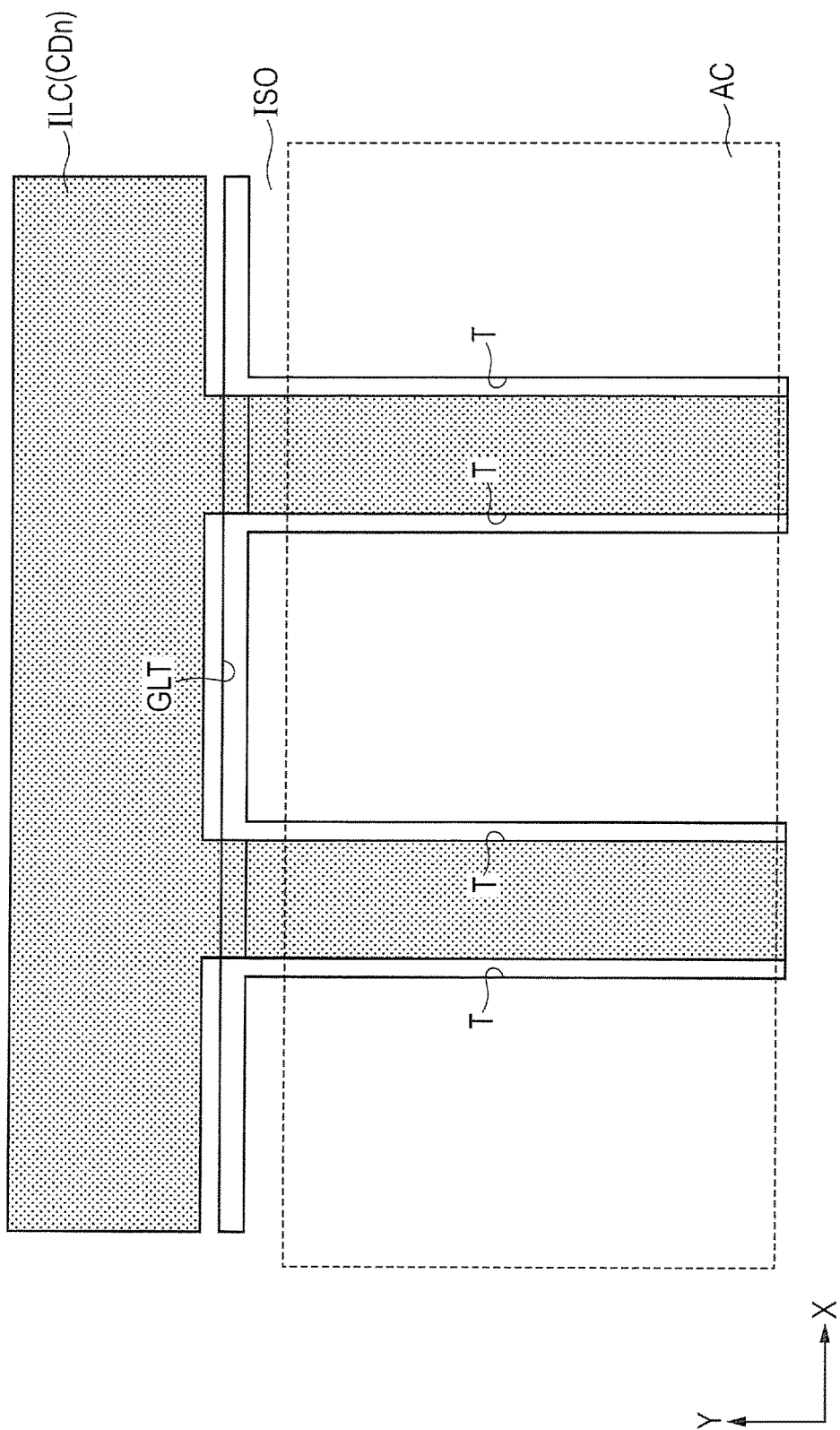
FIG. 17 is a plan view showing the manufacturing process of the semiconductor device in Embodiment 1.

Next, as shown in FIGS. 15 to 17, using a photolithographic technique and an etching technique, the insulating film IF1 is patterned. For example, over the insulating film IF1, a photoresist film (not shown) is formed and, by a photolithographic process, a photoresist film (not shown) is removed from the gate electrode formation region. In other words, over the insulating film IF1, the photoresist film (not shown) having an opening corresponding to the gate electrode formation region is formed. Then, using the photoresist film (not shown) as a mask, the insulating film IF1 is etched. For example, dry etching using a dry etching gas including a fluoride-based gas such as $CH_4$ is performed. Subsequently, the photoresist film (not shown) is removed by a plasma asking process or the like. In this manner, over the cap layer CP, the insulating film IF1 having the opening corresponding to the gate electrode formation region is formed.

Next, using the insulating film IF1 as a mask, the cap layer CP, the barrier layer BA, and the channel layer CH is dry-etched to be formed with the trench T extending through the cap layer CP and the barrier layer BA to reach a middle point in the channel layer CH. As the etching gas, a dry etching gas including a chlorine-based gas such as, e.g., $BCl_3$ is used. At this time, in the isolation region ISO, a trench GLT for the gate line GL is formed (FIGS. 16 and 17).

Figure 18:
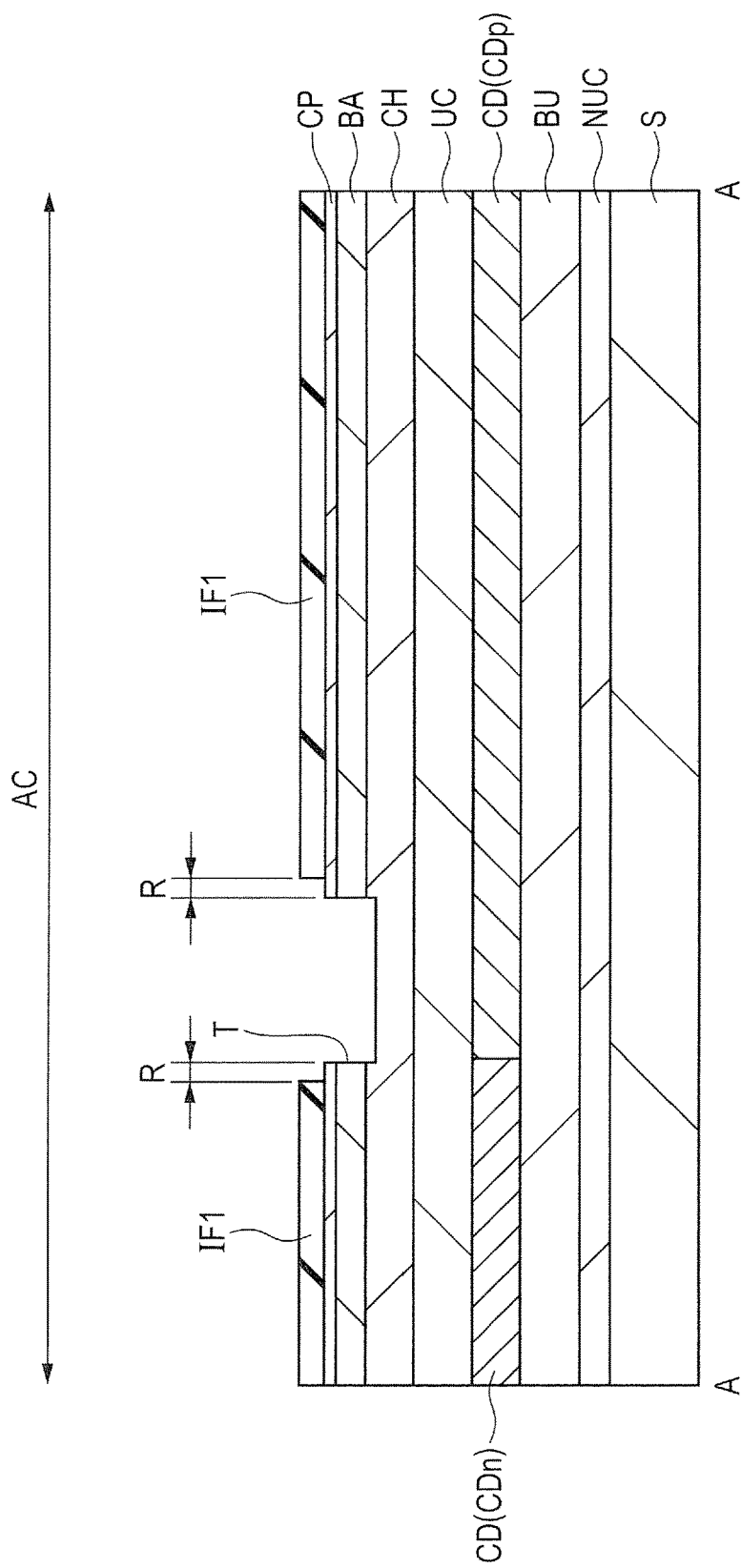
FIG. 18 is a cross-sectional view showing the manufacturing process of the semiconductor device in Embodiment 1.
Figure 19:
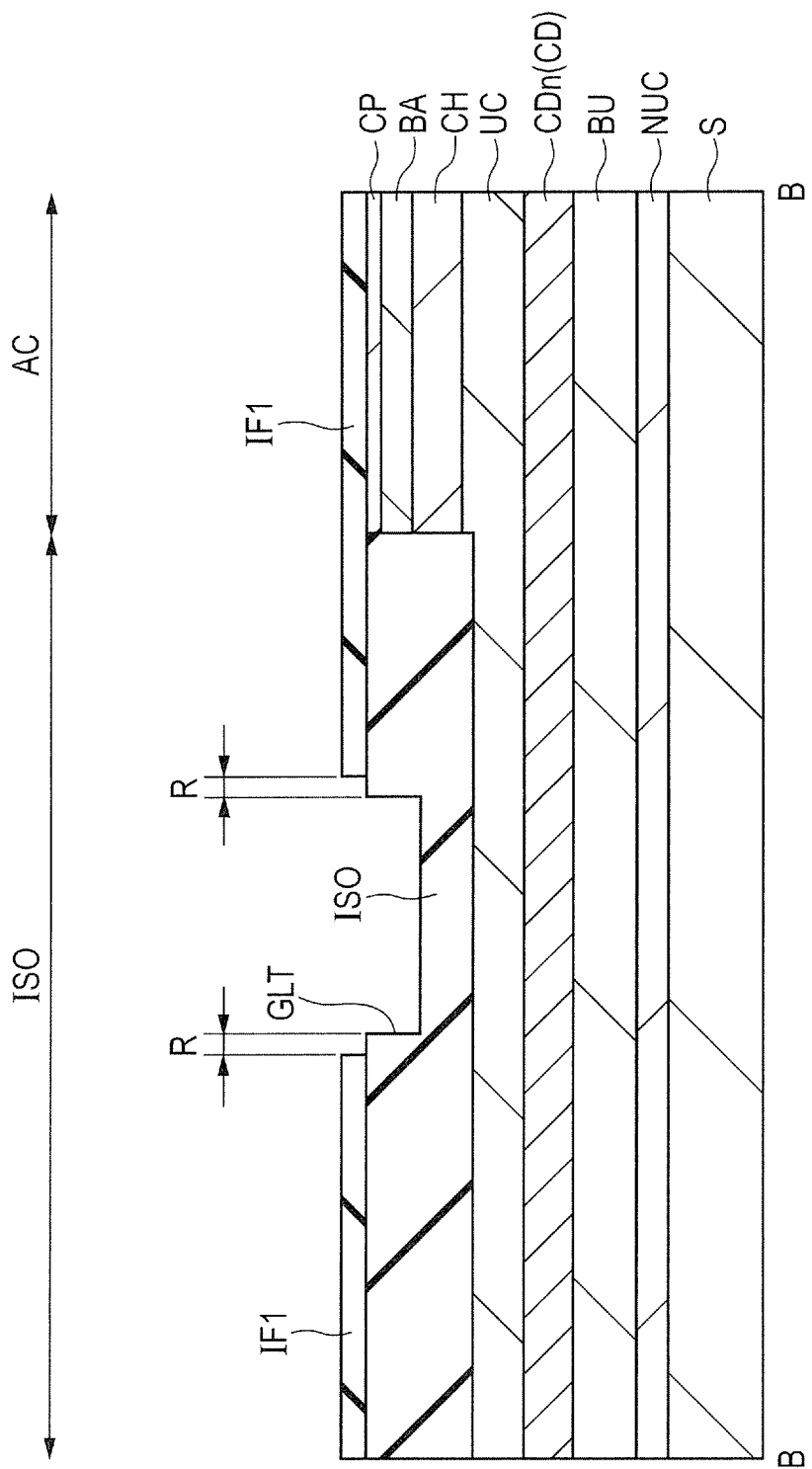
FIG. 19 is a cross-sectional view showing the manufacturing process of the semiconductor device in Embodiment 1.

Next, as shown in FIGS. 18 and 19, the insulating film IF1 is etched from the top surface thereof by a given film thickness. This reduces the film thickness of the insulating film IF1 to, e.g., about 50 nm to 100 nm. As the film thickness of the insulating film IF1 is reduced, the cap layer CP located on both sides of the trench T is exposed. In other words, the insulating film IF1 recedes from the end portion of the trench T to expose the nitride semiconductor layer located under the insulating film IF1. In FIGS. 18 and 19, the amount of recession is shown by "R".

Figure 20:
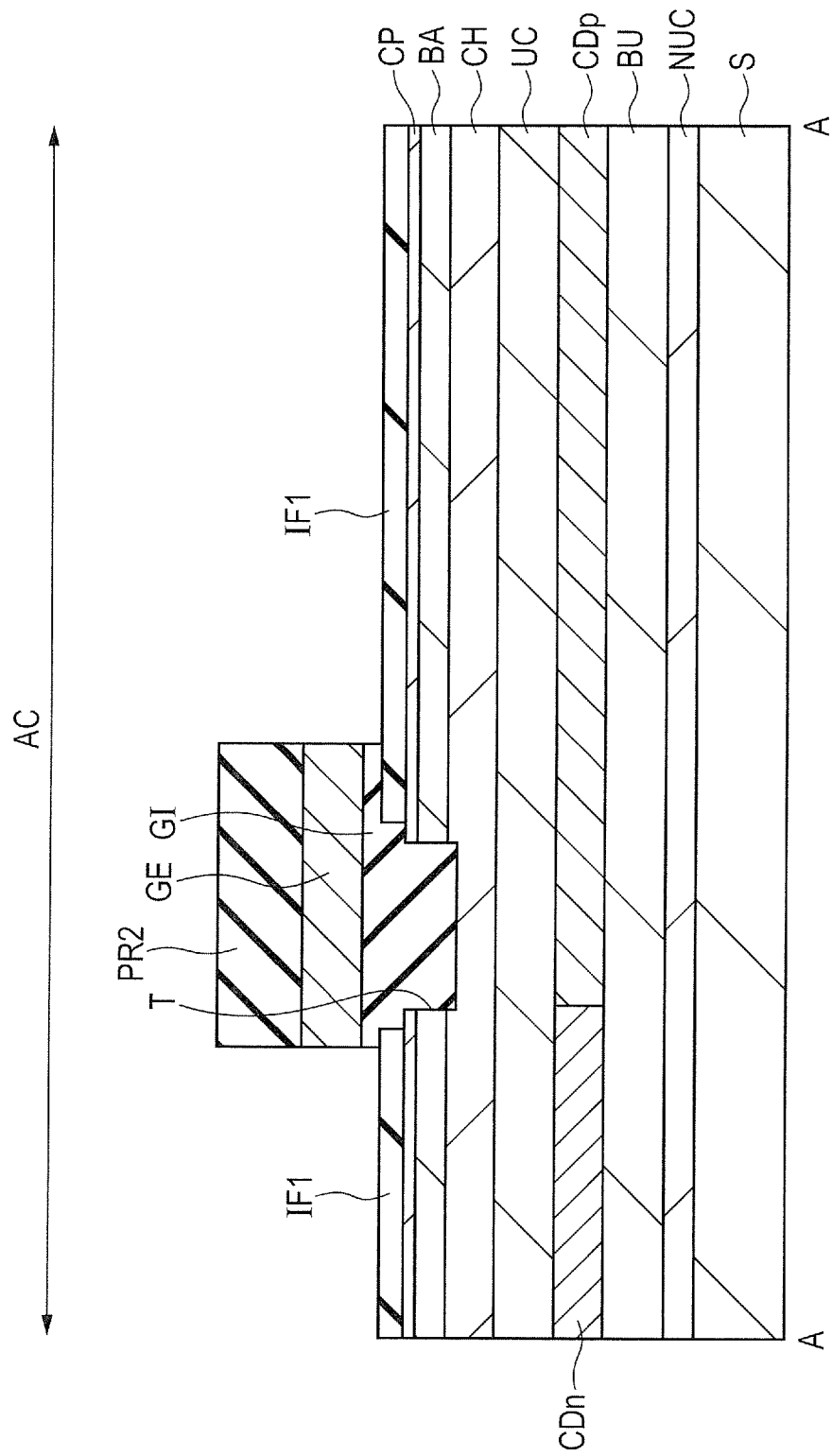
FIG. 20 is a cross-sectional view showing the manufacturing process of the semiconductor device in Embodiment 1.
Figure 21:
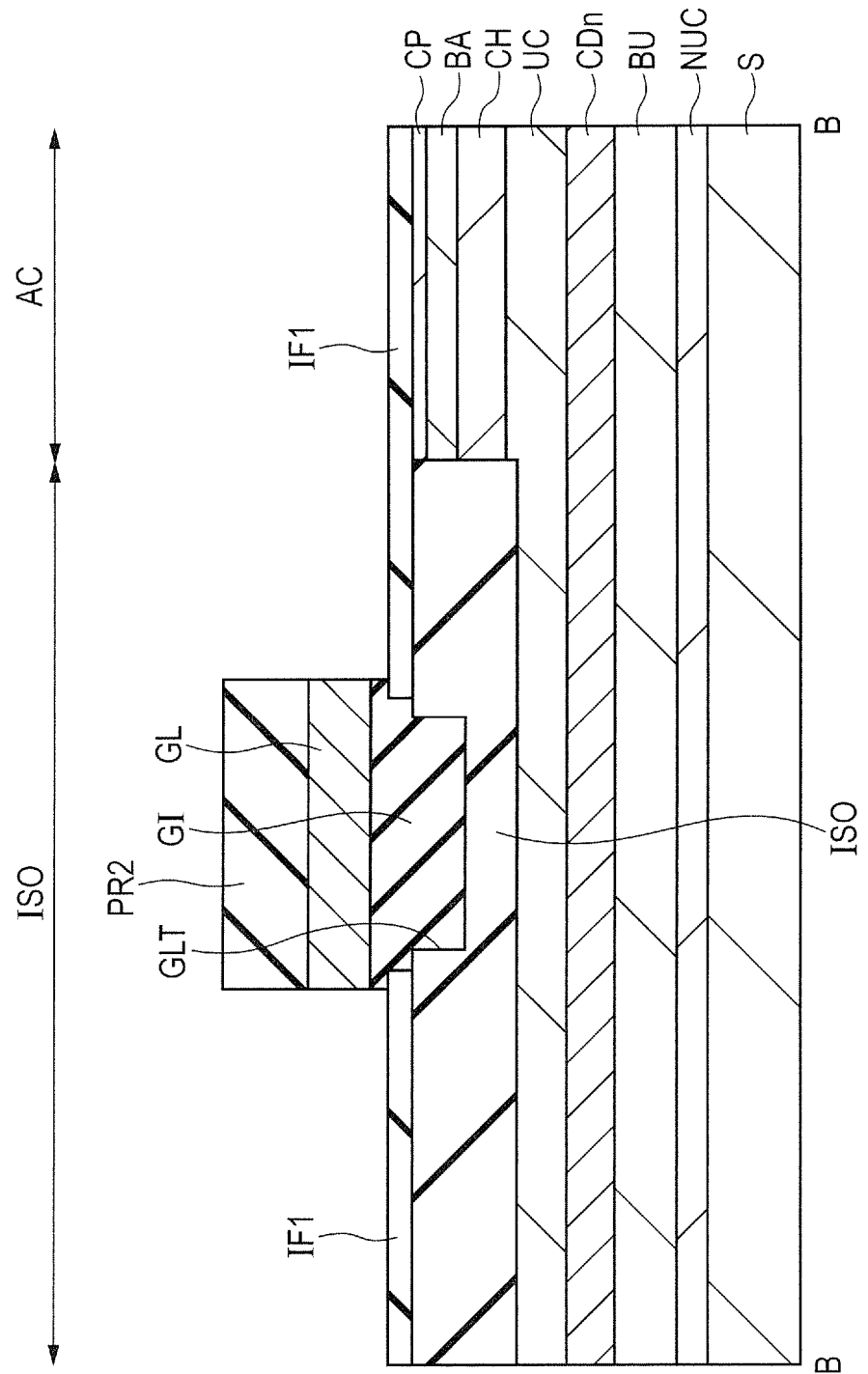
FIG. 21 is a cross-sectional view showing the manufacturing process of the semiconductor device in Embodiment 1.
Figure 22:
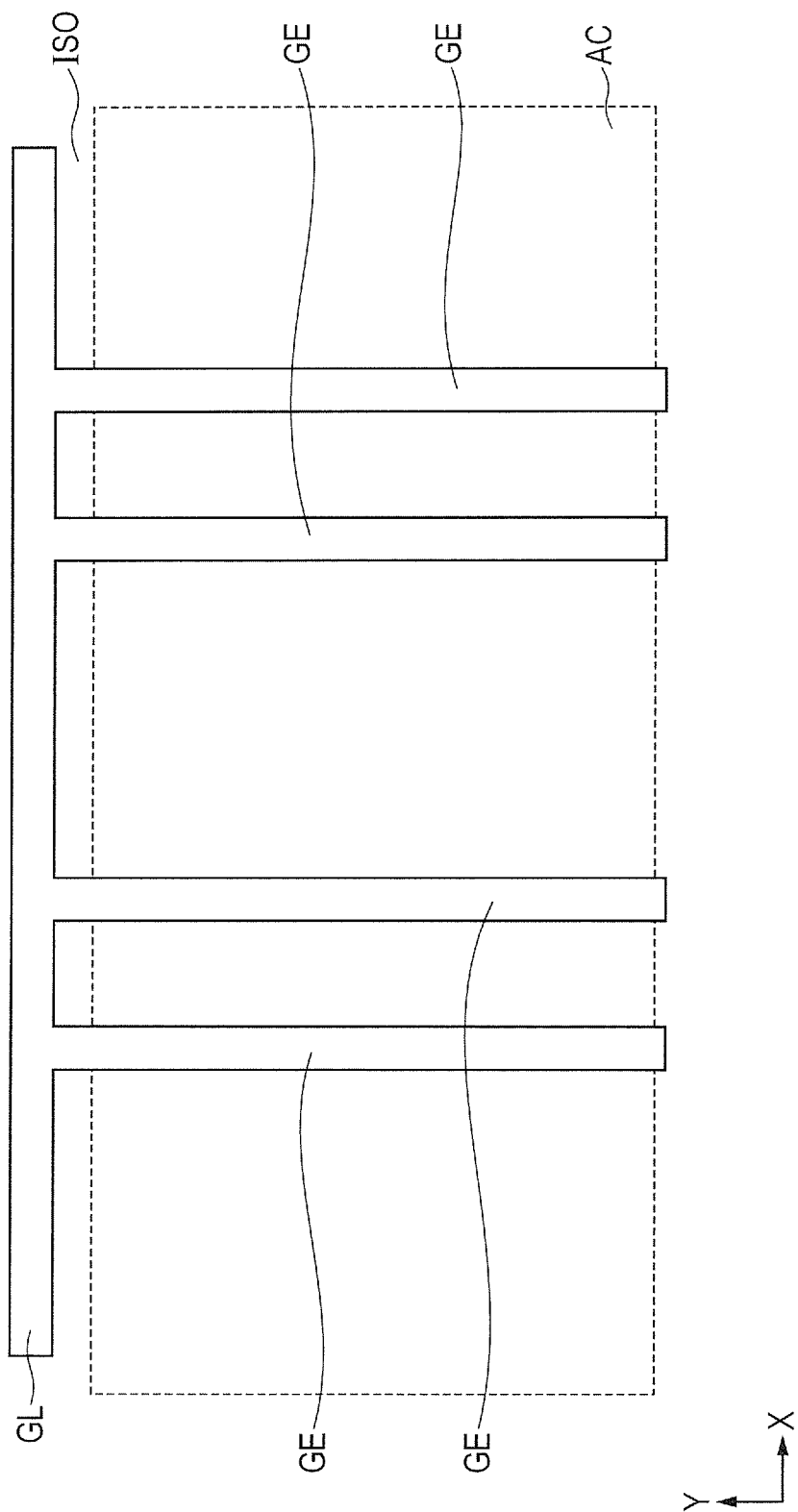
FIG. 22 is a plan view showing the manufacturing process of the semiconductor device in Embodiment 1.

Next, as shown in FIGS. 20 to 22, over the insulating film IF1 including the trench T, the gate electrode GE is formed via the gate insulating film GI. For example, over the insulating film IF1 including the trench T, an aluminum oxide film is deposited as the gate insulating film GI to have a film thickness of about 50 nm using an ALD (Atomic Layer Deposition) method or the like.

As the gate insulating film GI, a silicon dioxide film or a high-dielectric-constant film having a dielectric constant higher than that of the silicon dioxide film may also be used instead of the aluminum oxide film. As the high-dielectric-constant film, a SiN film (silicon nitride film) or a hafnium-based insulting film such as a $HfO_2$ film (hafnium oxide film), a hafnium aluminate film, a HfON film (hafnium oxynitride film), a HfSiO film (hafnium silicate film), a HfSiON film (hafnium silicon oxynitride film), or a HfAlO film may also be used.

Next, e.g., over the gate insulating film GI, e.g., a TiN (titanium nitride) film is deposited as a conductive film to have a film thickness of about 200 nm using a sputtering method or the like. Then, using a photolithographic technique, a photoresist film PR2 is formed over the gate electrode formation region. By using the photoresist film PR2 as a mask, the TiN film is etched to form the gate electrode GE. During the etching, the aluminum oxide film in a layer located below that of the TiN film may also be etched. For example, during the processing of the TiN film, dry etching using a dry etching gas including a chlorine-based gas such as C12 is performed. During the processing of the aluminum oxide film, dry etching using a dry etching gas including a chlorine-based gas such as $BCl_3$ is performed.

Also, during the etching, the gate electrode GE is patterned into a shape protruding in one direction (to the right or toward the drain electrode DE in FIG. 20). The protruding portion is referred to as a field plate electrode portion. The field plate electrode portion is a local region of the gate electrode GE which extends from the end portion of the trench T which is closer to the drain electrode DE toward the drain electrode DE. Subsequently, the photoresist film (not shown) is removed by a plasma asking process or the like.

Figure 23:
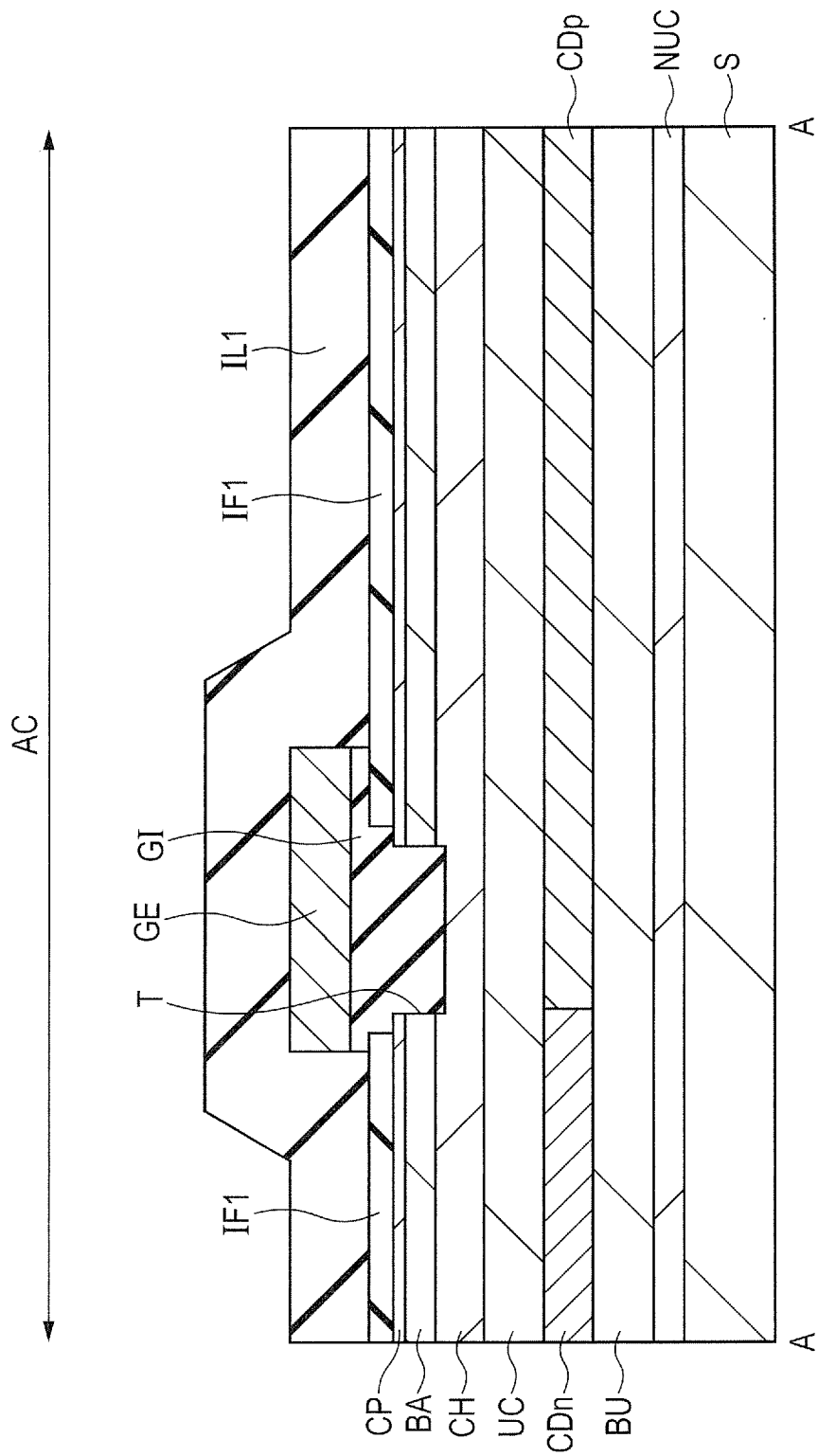
FIG. 23 is a cross-sectional view showing the manufacturing process of the semiconductor device in Embodiment 1.
Figure 24:
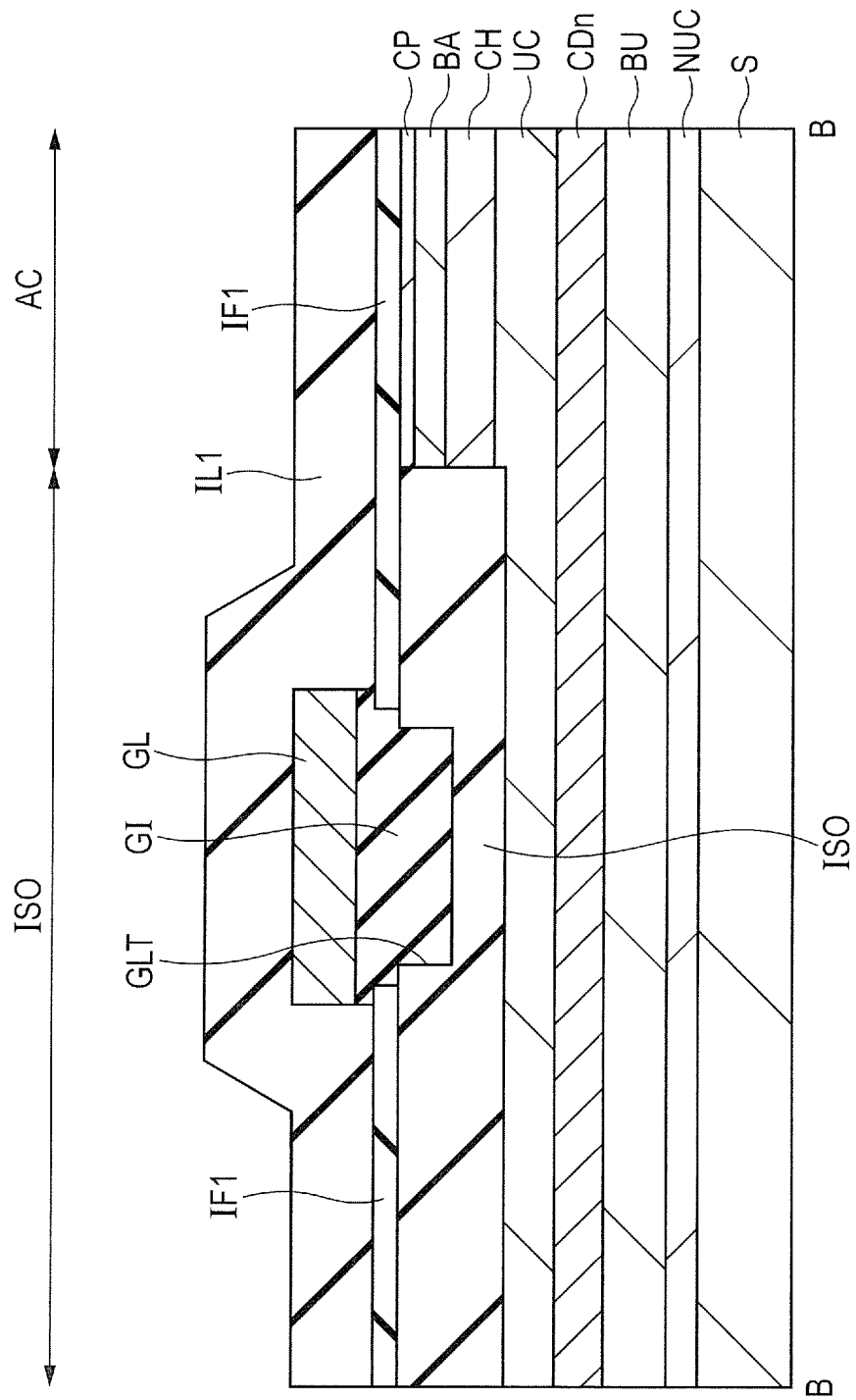
FIG. 24 is a cross-sectional view showing the manufacturing process of the semiconductor device in Embodiment 1.

Next, as shown in FIGS. 23 and 24, over the insulating film IF1 including the gate electrode GE, e.g., a silicon dioxide film is deposited as the interlayer insulating film IL1 to about 500 nm using a sputtering method, an atmospheric pressure CVD method, or the like.

Figure 25:
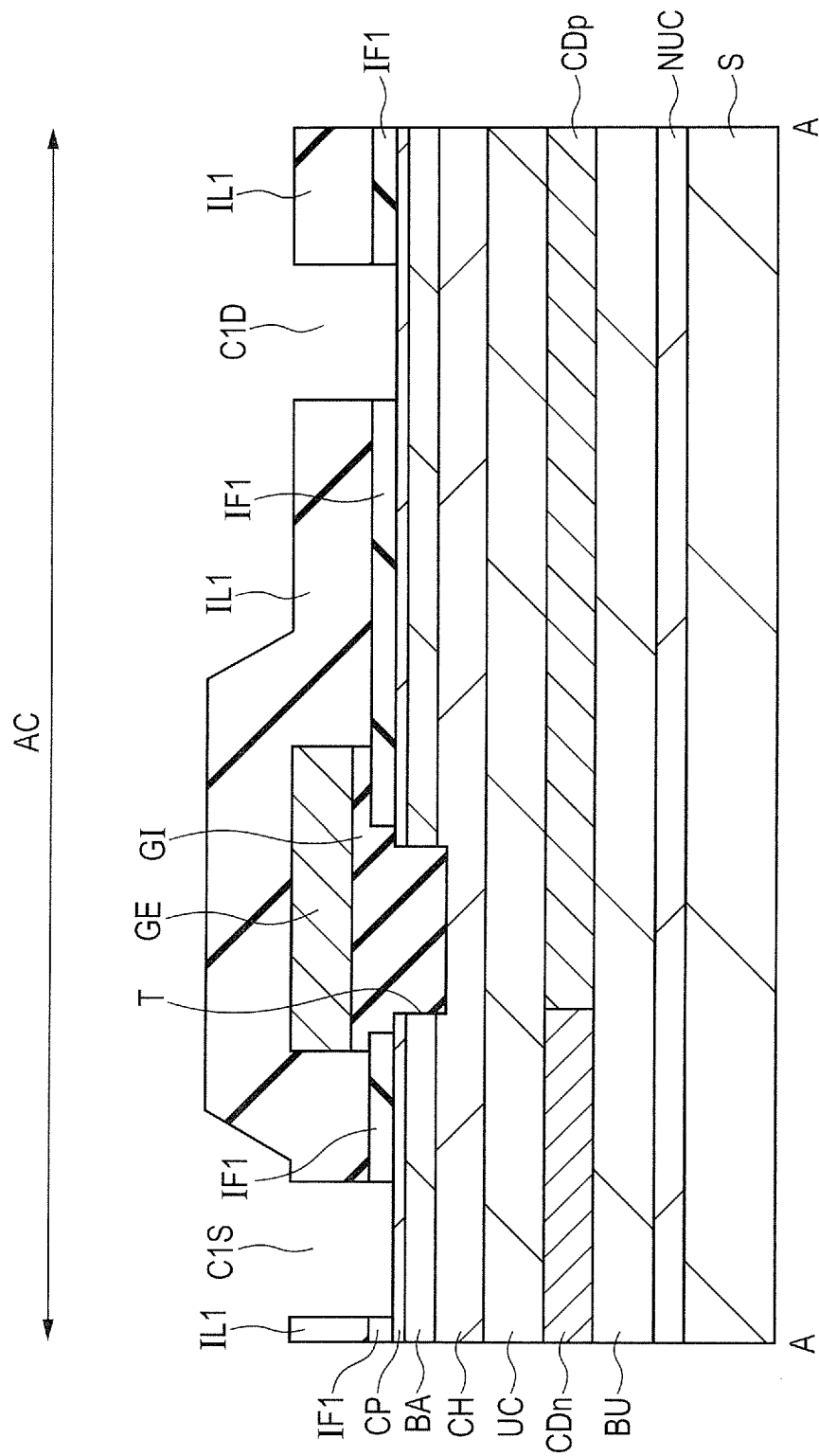
FIG. 25 is a cross-sectional view showing the manufacturing process of the semiconductor device in Embodiment 1.
Figure 26:
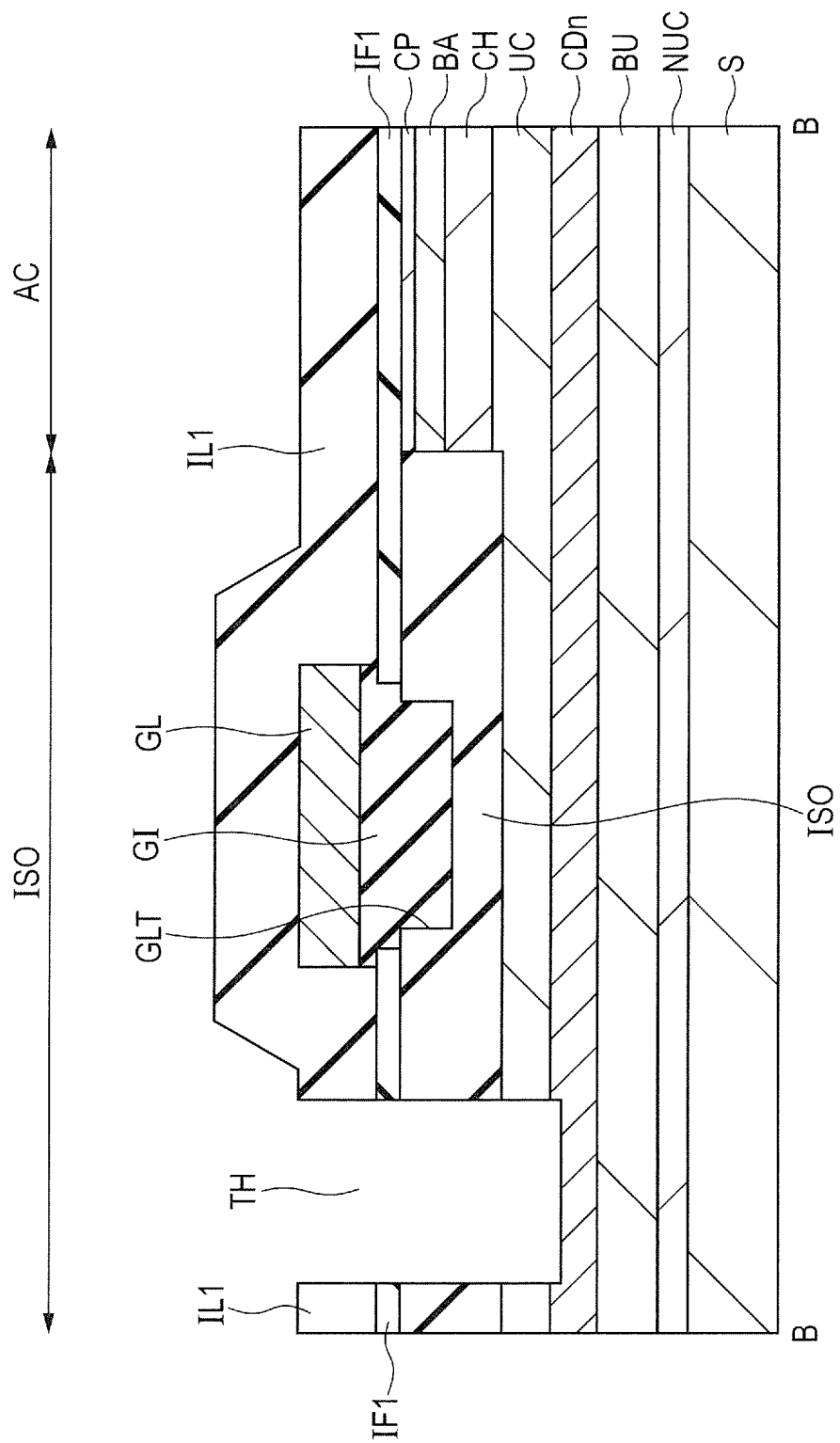
FIG. 26 is a cross-sectional view showing the manufacturing process of the semiconductor device in Embodiment 1.
Figure 27:
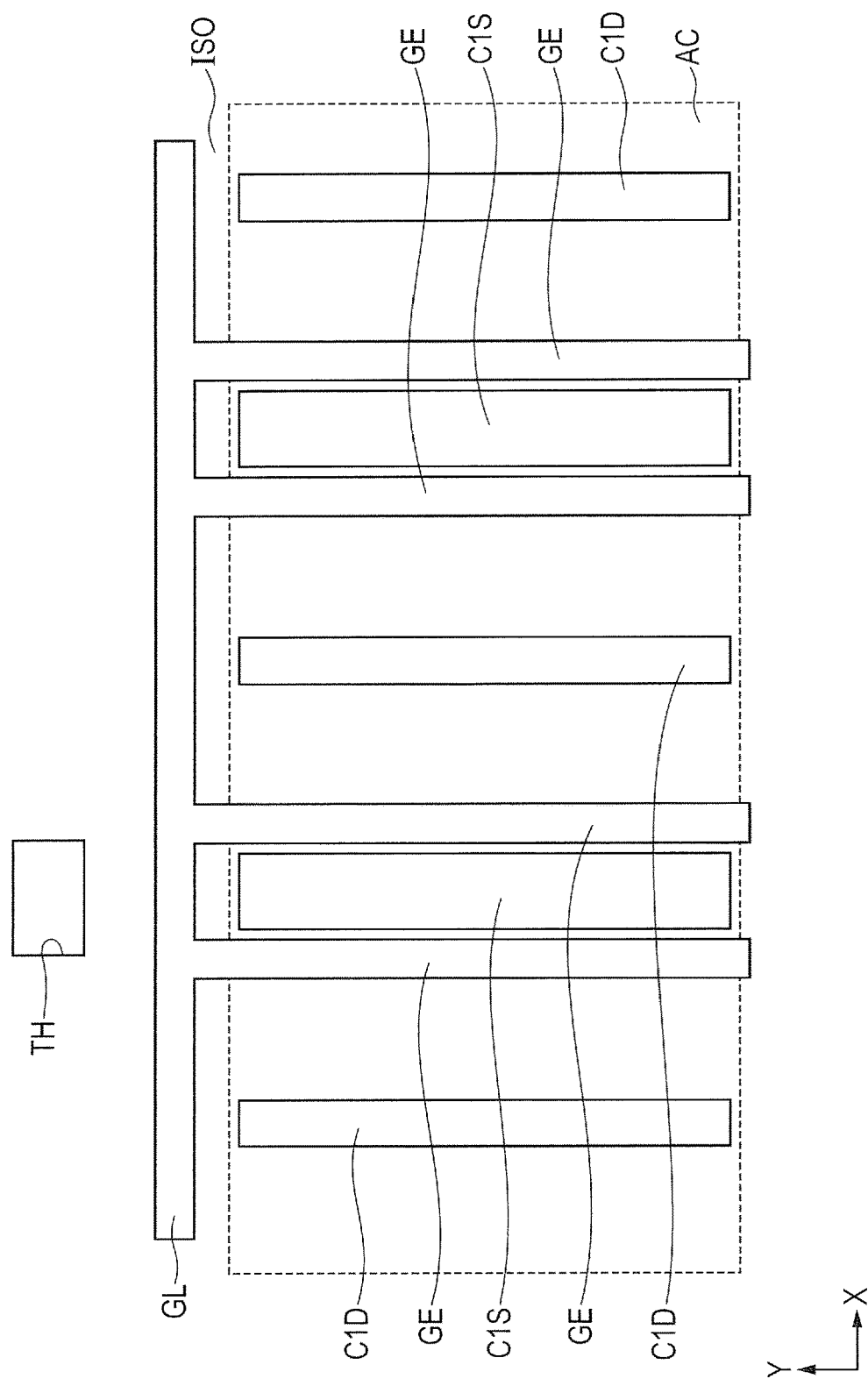
FIG. 27 is a plan view showing the manufacturing process of the semiconductor device in Embodiment 1.

Next, as shown in FIGS. 25 to 27, using a photolithographic technique and an etching technique, in the interlayer insulating film IL1 and the insulating film IF1, the contact holes C1S and C1D and the through hole TH are formed. The contact holes C1S and C1D are formed respectively in a source electrode formation region and a drain electrode formation region. The through hole TH is formed in the isolation region ISO.

For example, over the interlayer insulating film IL1, a first photoresist film (not shown) having respective openings corresponding to a source electrode coupled region and a drain electrode coupled region is formed. Then, using the first photoresist film (not shown) as a mask, the interlayer insulating film IL1 and the insulating film IF1 are etched to be formed with the contact holes C1S and C1D.

In the case of using a silicon dioxide film as the interlayer insulating film IL1 and using a silicon nitride film as the insulating film IF1, when these films are etched, dry etching using a dry etching gas including a fluorine-based gas such as, e.g., $SF_6$ is performed.

Next, after the first photoresist film is removed, over the interlayer insulating film IL1 including the contact holes C1S and C1D, a second photoresist film (not shown) having an opening corresponding to a through hole formation region is formed. Then, using the second photoresist film (not shown) as a mask, each of the interlayer insulating IL1, the insulating film IF1, the isolation region ISO, the channel underlying layer UC, and a portion of the n-type semiconductor region CDn is etched to be formed with the through hole TH. In other words, the thought hole TH is formed to extend through the interlayer insulating film IL1, the insulating film IF1, the isolation region ISO, and the channel underlying layer UC and reach a middle point in the n-type semiconductor region CDn.

As described above, the etching is performed such that the bottom portion of the through hole TH is at a position in the n-type semiconductor region CDn which is located below the bottom portion of the isolation region ISO.

In the case of using a silicon dioxide film as the interlayer insulating film IL1 and using a silicon nitride film as the insulating film IF1, first, by dry etching using a dry etching gas including a fluorine-based gas such as, e.g., $SF_6$, these films are removed. Then, the isolation region IS, the channel underlying layer (AlGaN layer) UC, and a part of the codoped layer (AlGaN layer) CD are removed by dry etching using a dry etching gas including a chlorine-based gas such as, e.g., $Cl_2$ until a middle point in the codoped layer CD is reached.

Note that the order in which the contact holes C1S and C1D and the through hole TH are formed is not limited to that shown above. It may also be possible to form the through hole TH first and then form the contact holes C1S and C1D. It may also be possible that, after the interlayer insulating film IL1 is removed from the through hole formation region, the source electrode coupled region, and the drain electrode coupled region, the insulating film IF1, the isolation region ISO, the channel underlying layer UC, and a part of the n-type semiconductor region CDn in the through hole formation region are removed until a middle point in the n-type semiconductor region CHn is reached and the insulating film IF1 is further removed from the source electrode coupled region and the drain electrode coupled region. Thus, as the steps of forming the contact holes C1S and C1D and the through hole TH, various process steps can be used.

At the respective bottom surfaces of the contact holes C1S and C1D formed in the foregoing steps, the cap layer CP is exposed and, at the bottom surface of the through hole TH, the n-type semiconductor region CDn is exposed.

Figure 28:
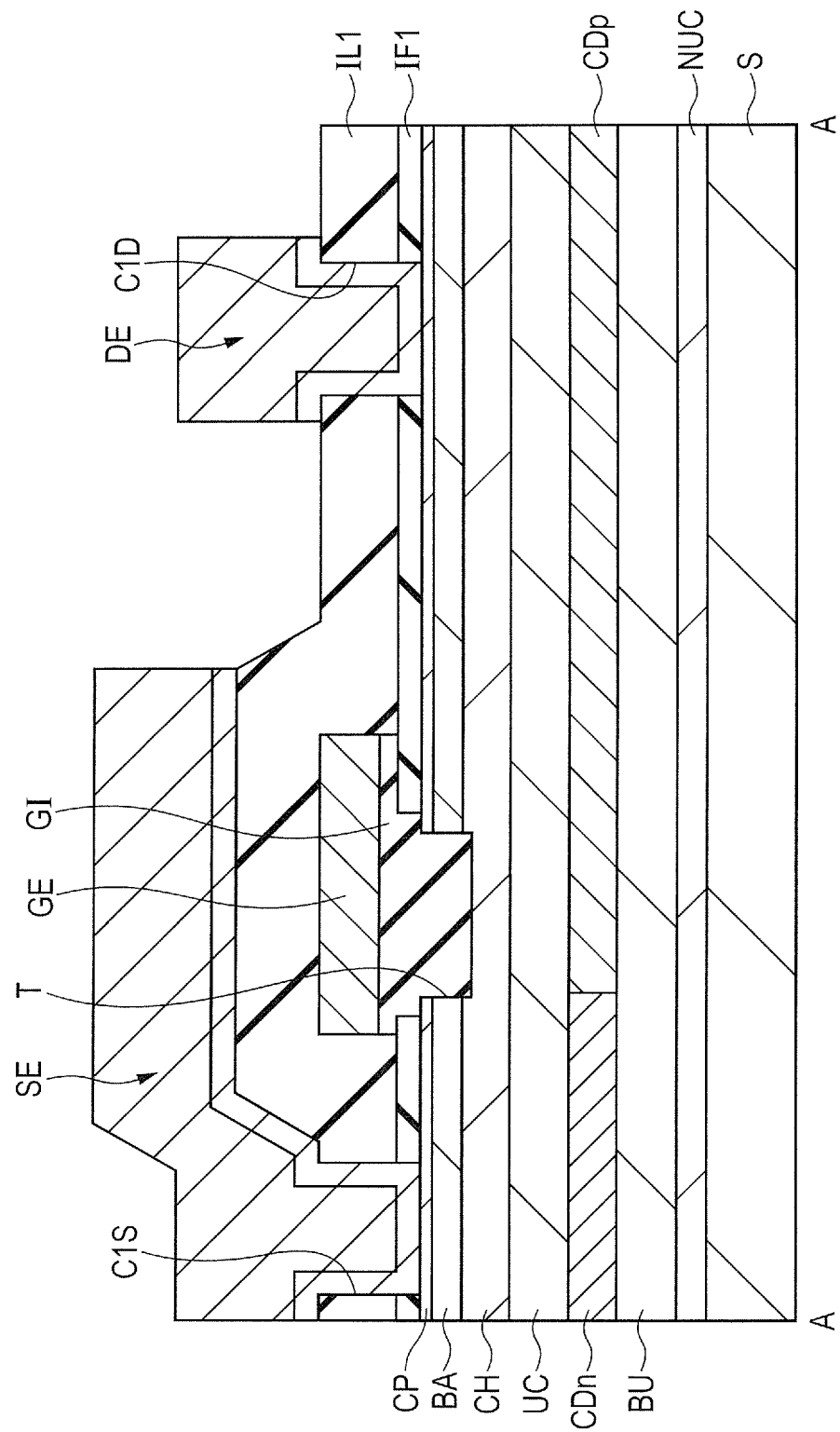
FIG. 28 is a cross-sectional view showing the manufacturing process of the semiconductor device in Embodiment 1.
Figure 29:
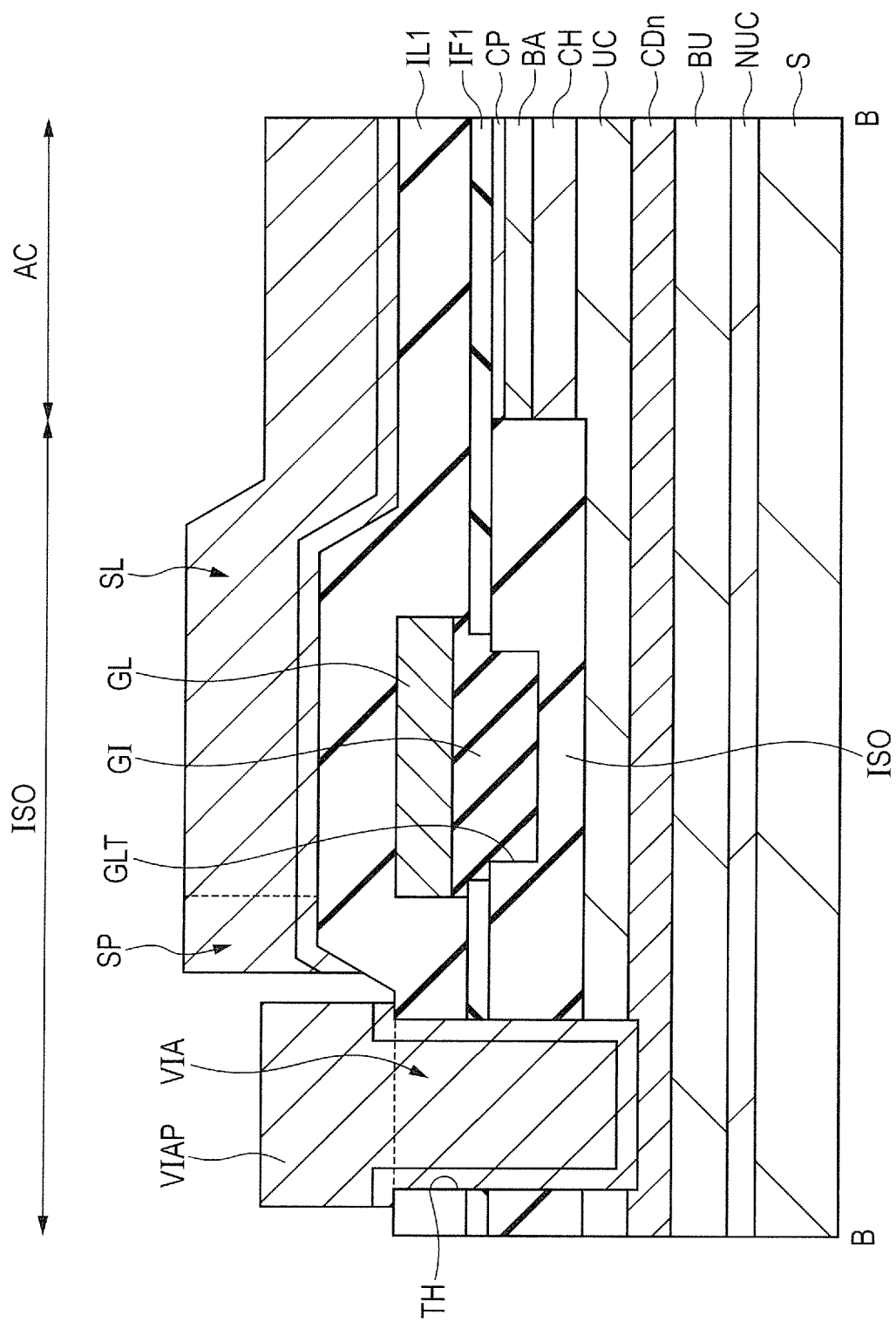
FIG. 29 is a cross-sectional view showing the manufacturing process of the semiconductor device in Embodiment 1.
Figure 30:
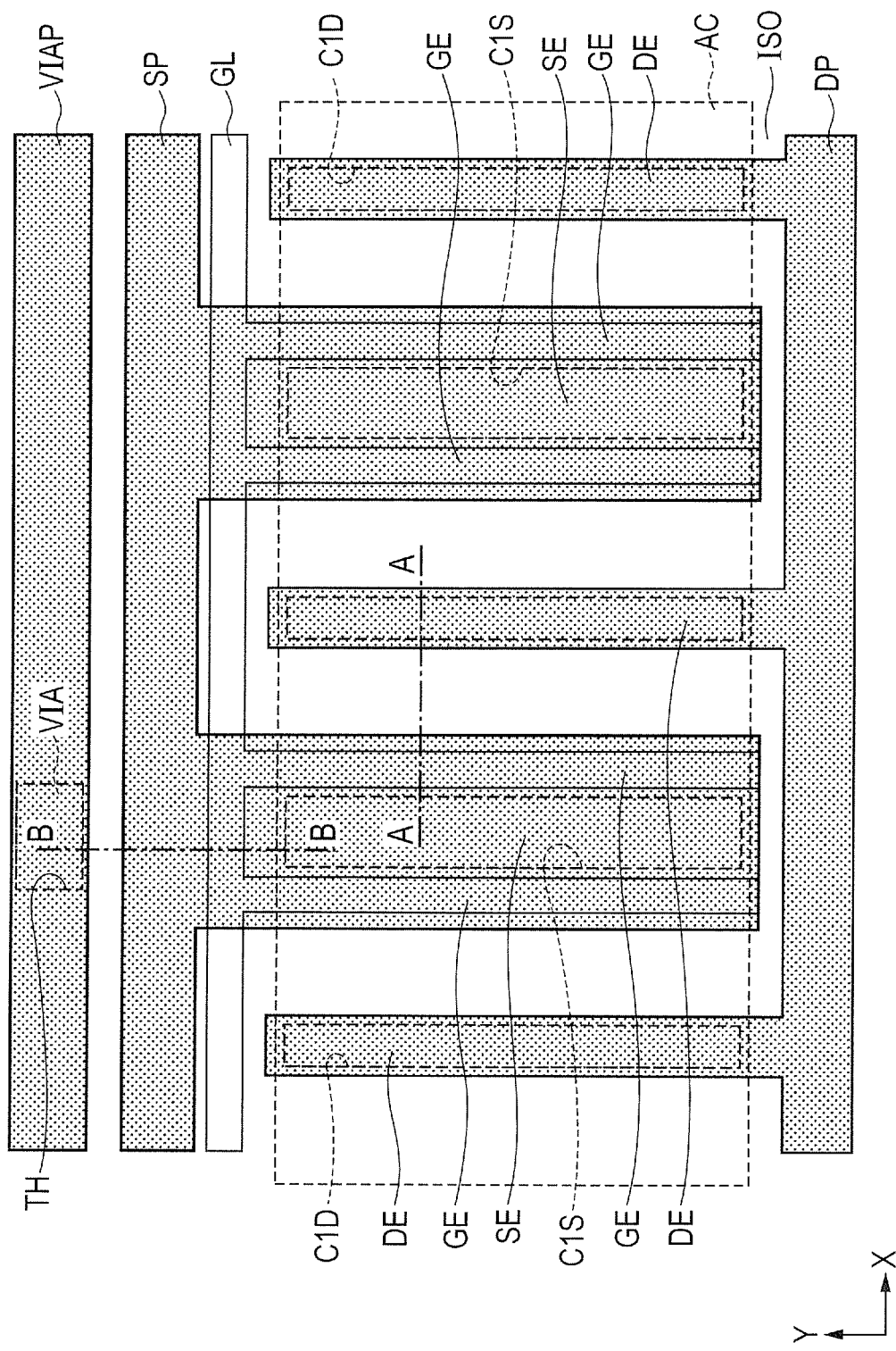
FIG. 30 is a plan view showing the manufacturing process of the semiconductor device in Embodiment 1.

Next, as shown in FIGS. 28 to 30, over the cap layer CP located on both sides of the gate electrodes GE, the source electrodes SE and the drain electrodes DE are formed. Also, on the end portion of each of the source electrodes SE, the source pad SP is formed and, on the end portion of each of the drain electrodes DE, the drain pad DP is formed (FIG. 30). Also, in the through hole TH, the coupling portion VIA is formed and, over the coupling portion VIA, the via pad VIAP is formed.

For example, over the interlayer insulating film IL1 including the contact holes C1S and C1D and the through hole TH, a conductive film is formed. For example, as the conductive film, a multi-layer film (Al/TiN) including a titanium nitride (TiN) film and an aluminum (Al) film located thereover is formed using a sputtering method or the like. The titanium nitride film has a film thickness of, e.g., about 50 nm and the aluminum film has a film thickness of, e.g., about 1000 nm. Then, heat treatment is performed at, e.g., 500° C. for about 30 minutes. By the heat treatment, an ohmic contact can be made between the multi-layer film (Al/TiN) and the nitride semiconductor layer located thereunder.

Next, using a photolithographic technique, a photoresist film (not shown) is formed over the respective regions where the source electrodes SE, the drain electrodes DE, the source pad SP, and the drain pad DP are to be formed. Then, using the photoresist film (not shown) as a mask, the conductive film (Al/TiN) is etched. For example, dry etching using a dry etching gas including a chlorine-based gas such as $Cl_2$ is performed. By the process step, the coupling portion VIA which is the conductive film embedded in the through hole TH and the via pad VIAP located thereover are formed. Also, the source electrodes SE, the drain electrodes DE, the source pad SP, and the drain pad DP are formed. As shown in FIG. 30, each of the source electrodes SE and the drain electrodes DE has a rectangular (linear) two-dimensional shape having long sides in the Y-direction. As also shown in FIG. 30, each of the source pad SP, the drain pad DP, and the via pad VIAP has a rectangular (linear) two-dimensional shape having long sides in the X-direction. The source pad SP is disposed so as to couple the plurality of source electrodes SE to each other. The drain pad DP is disposed so as to couple the plurality of drain electrodes DE to each other.

Under the via pad VIAP, the through hole TH is located and the via pad VIAP and the n-type semiconductor region CDn are electrically coupled to each other via the coupling portion VIA (FIG. 29).

Then, over the interlayer insulating film IL1 including the source electrodes SE, the drain electrodes DE, the source pad SP, the drain pad DP, and the via pad VIAP, the protective film (referred to also as an insulating film, a cover film, or a top surface protective film) PRO is formed. For example, over the interlayer insulating film IL1, as the protective film PRO, e.g., a silicon oxynitride (SiON) film is deposited using a sputtering method, an atmospheric pressure CVD method, or the like (see FIGS. 6 and 7).

By the foregoing process steps, the semiconductor device in Embodiment 1 can be formed. Note that the foregoing process steps are only exemplary and the semiconductor device in Embodiment 1 may also be manufactured by process steps other than the foregoing process steps.

Thus, according to Embodiment 1, the codoped layer CD is provided between the buffer layer BU and the channel layer CH and the codoped layer CD located closer to the source electrode SE is used as the n-type semiconductor region CDn and coupled to the via pad VIAP via the coupling portion VIA. This can reduce variations in the properties of the semiconductor element. That is, the n-type semiconductor region CDn can be used as a potential fixed layer to be able to prevent the channel layer CH from being affected by a potential change resulting from a change in the amount of charge in a layer (such as, e.g., the buffer layer BU) located below the n-type semiconductor region CDn. Thus, it is possible to reduce variations in properties such as threshold potential and ON resistance.

Also, in Embodiment 1, the coupling portion VIA in the through hole TH is disposed in the isolation region ISO outside the active region AC which conducts electrons. This can achieve a reduction in the size of the semiconductor element and a higher integration thereof. In addition, since it is possible to ensure the large active region AC capable of conducting electrons, the ON resistance per unit area can be reduced.

For example, when an impurity such as Fe has been added into the buffer layer for a higher breakdown voltage, Fe forms a deep level. Such a deep level serves as a point where electrons or holes are captured or released during the operation of the semiconductor element to serve as a factor causing variations in properties such as threshold potential. When the level is particularly deep, depending on an energy depth and position, the deep level may cause variations in properties such as threshold potential for several minutes or for an extremely long period of several days.

By contrast, in embodiment 1, the n-type semiconductor region CDn is provided between the buffer layer BU and the channel layer CH and coupled to the via pad VIAP via the coupling portion VIA. This can fix the potential of the n-type semiconductor region CDn and reduce variations in the properties of the semiconductor element.

When a superlattice structure is used as the buffer layer BU, the superlattice structure serves as an extremely deep quantum well (extremely high barrier for the movement of electrons and holes). As a result, when charges such as electrons or holes are captured in the vicinity of the superlattice structure, it becomes difficult for electrons or holes to move in a direction perpendicular to the substrate. Accordingly, when the superlattice structure is used, unneeded charges are unlikely to be removed to possibly cause variations in properties such as threshold potential for an extremely long period.

By contrast, in Embodiment 1, the n-type semiconductor region CDn is provided between the buffer layer BU and the channel layer CH and coupled to the via pad VIAP via the coupling portion VIA. This can fix the potential of the n-type semiconductor region CDn and reduce variations in the properties of the semiconductor element.

When plasma treatment is performed during the manufacturing process, charges are likely to be introduced into a semiconductor layer. Examples of the plasma treatment include PECVD and a plasma asking process for a photoresist film. The charges introduced during such treatment may also cause variations in properties such as threshold potential. Since a nitride semiconductor has a particularly large band gap and a particularly high insulation property, the charges introduced by plasma treatment or the like are less likely to be released, which may possible cause variations in properties such as threshold potential for an extremely long period.

By contrast, in Embodiment 1, the n-channel semiconductor region CDn is provided between the buffer layer BU and the channel layer CH and coupled to the via pad VIAP via the coupling portion VIA. This can fix the potential of the n-type semiconductor region CDn and reduce variations in the properties of the semiconductor element.

Also in Embodiment 1, under the region between each of the gate electrode GE and the corresponding drain electrode DE, the p-type semiconductor region CDp is provided. By thus using the codoped layer CD located between the gate electrode GE and the drain electrode DE as the p-type semiconductor region CDp where it is easy to ensure a sufficient breakdown voltage, the drain breakdown voltage can be improved. By particularly providing the p-type semiconductor region CDp with a relatively low p-type impurity concentration, it is possible to increase the resistance of the p-type semiconductor region CDp and improve the drain breakdown voltage.

Also, in Embodiment 1, the codoped layer CD closer to the source electrode SE is used as the n-type semiconductor region CDn and the codoped layer CD closer to the drain electrode DE is used as the p-type semiconductor region CDp. Consequently, the codoped layer CD (CDn and CDp) functions as a protective diode to be able to improve the properties of the device.

In addition, in Embodiment 1, into a local region of the codoped layer CD as a nitride semiconductor layer containing a p-type impurity and an n-type impurity, hydrogen is introduced from the insulating film IF1 containing hydrogen at a high concentration. This can inactivate the p-type impurity in the region. As a result, the inactivated region serves as the n-type semiconductor region CDn, while the region that has not been inactivated remains as the p-type semiconductor region CDp. Thus, in the same layer, the n-type semiconductor region CDn and the p-type semiconductor region CDp can be formed. Since the impurities in these regions are disposed at ideal positions in a crystal by epitaxial growth and are not implanted by a method which tends to destroy a crystal such as ion implantation, excellent semiconductor properties can be achieved.

For example, as will be described below, by using an ion implantation method and a regrowth method, the n-type semiconductor region CDn and the p-type semiconductor region CDp can be formed in the same layer. A description will be given of the advantages of the method used in Embodiment 1 when compared to these methods.

(1) By using an ion implantation method, it is possible to form the n-type semiconductor region CDn and the p-type semiconductor region CDp in the same layer. However, in the portion through which the implanted atoms have passed, the crystal of the layer subjected to ion implantation is destroyed so that the crystallinity deteriorate. In this case, the crystallinity and film thickness that have deteriorated are restored by heat treatment at a temperature of not less than 1200° C. to a degree, but not completely. When the crystallinity and the film quality are to be retained, it is inevitable to implant ions at a shallow position and consequently the n-type semiconductor region CDn and the p-type semiconductor region CDp each having a predetermined depth cannot be formed. In the ion implantation, when the dose is low, activation is difficult. Under the present circumstances, e.g., a semiconductor region having a relatively low concentration (e.g., an n-type semiconductor region at a concentration of not more than $1 \times 10^{18}$ cm$^{-3}$ or an n$^-$-type region) cannot be formed. Also, in the ion implantation, the inevitably implanted impurities have statistic distributions. In the region where the implantation dose is low, variations are likely to occur in the properties of the semiconductor regions (CDn and CDP), such as higher resistance.

By contrast, in Embodiment 1, there is no need to ion-implant a p-type impurity (which is Mg herein) and an n-type impurity (which is Si herein). Accordingly, it is possible to avoid damage resulting from the ion implantation of such impurities. In addition, by using epitaxial growth, the film thickness of the formed layer is easily controlled and a thin or thick film having excellent properties can be formed. Also, by using epitaxial growth, it is possible to easily adjust the respective concentrations of a p-type impurity (which is Mg herein) and an n-type impurity (which is Si) through the adjustment of the respective flow rates of source gasses. In addition, since the impurity concentration is determined by the difference between the respective concentrations of a p-type impurity (which is Mg herein) and an n-type impurity (which is Si), the impurity concentration is easily adjusted in a wide range between high and low concentrations. In particular, a low-concentration impurity region which is essential to increasing the breakdown voltage of the semiconductor element can easily be formed. Also, by using epitaxial growth, the respective concentrations of a p-type impurity (which is Mg herein) and an n-type impurity (which is Si herein) can be controlled to be substantially uniform and property variations resulting from variations in the distributions of a p-type impurity (which is Mg herein) and an n-type impurity (which is Si herein) can be suppressed. Note that, when the respective concentrations of a p-type impurity (which is Mg herein) and an n-type impurity (which is Si herein) are intended to have gradients, by adjusting the flow rates of the respective source gases of a p-type impurity and an n-type impurity, it is possible to easily provide the impurity concentrations with gradients.

(2) By using a regrowth method, the n-type semiconductor region CDn and the p-type semiconductor region CDp can be formed in the same layer. For example, after the n-type semiconductor region CDn is epitaxially grown, the n-type semiconductor region CDn is removed from the region where the p-type semiconductor region CDp is to be formed to form an opening. Then, in the opening, the p-type semiconductor region CDp is epitaxially grown (regrown). By such a method also, the n-type semiconductor region CDn and the p-type semiconductor region CDp can be formed in the same layer. However, in accordance with the regrowth method, a discontinuous crystal plane is likely to be formed at an interface serving as a starting point of regrowth and a semiconductor device with excellent properties cannot be obtained. By contrast, in Embodiment 1, stacked nitride semiconductor layers can continuously be deposited so that a discontinuous plane is less likely to be formed at the interface between the layers. In addition, a regrowth step can be avoided so that a discontinuous plane resulting from the regrowth step is not formed.

Thus, in Embodiment 1, the n-type semiconductor region CDn and the p-type semiconductor region CDp can accurately be formed in the same layer by simple and easy process steps. In addition, each of the formed n-type semiconductor region CDn and the formed p-type semiconductor region CDp has excellent properties.

Application Example 1

In the foregoing semiconductor device (see FIG. 6), the boundary portion (pn junction portion) between the n-type semiconductor region CDn and the p-type semiconductor region CDp is located so as to correspond to the source-electrode-side end portion of the trench, which is an ideal position. However, the position of the pn junction portion is not limited to this position and can be changed.

Figure 31:
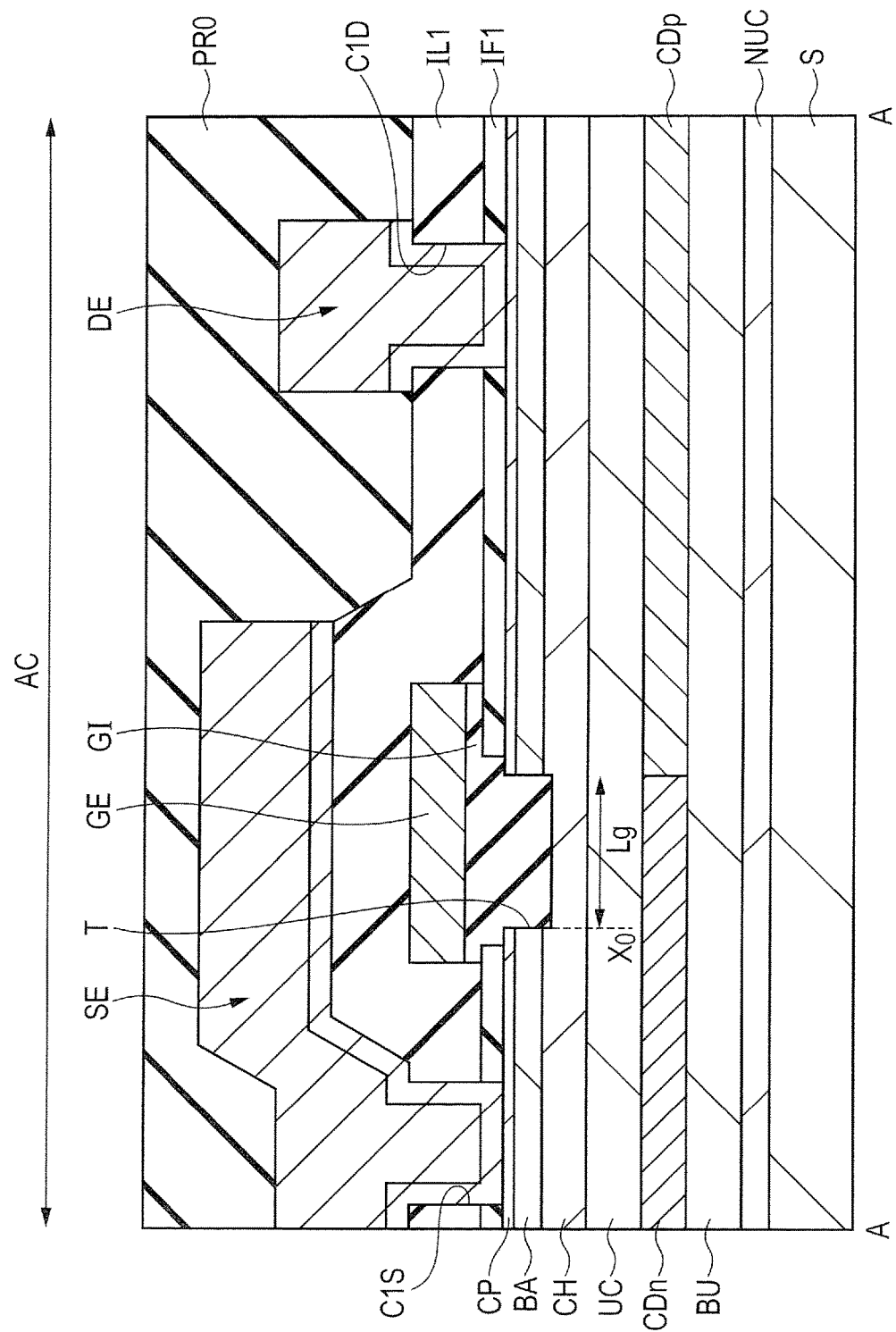
FIG. 31 is a cross-sectional view showing a configuration of a semiconductor device in Application Example 1 of Embodiment 1.

FIG. 31 is a cross-sectional view showing a configuration of a semiconductor device in Application Example 1 of Embodiment 1. The semiconductor device in Application Example 1 is the same as the foregoing semiconductor device (FIGS. 5 to 30) except for the position of the foregoing pn junction portion.

As shown in FIG. 31, the boundary portion (pn junction portion) between the n-type semiconductor region CDn and the p-type semiconductor region CDp may also correspond to the end portion of the trench T which is closer to the drain electrode DE. That is, in this case, the p-type semiconductor region CDp extends from the end portion of the trench T which is closer to the drain electrode DE to a position under the drain electrode DE. On the other hand, the n-type semiconductor region CDn extends from the end portion of the trench T which is closer to the drain electrode DE to a position under the source electrode SE.

Application Example 2

Figure 32:
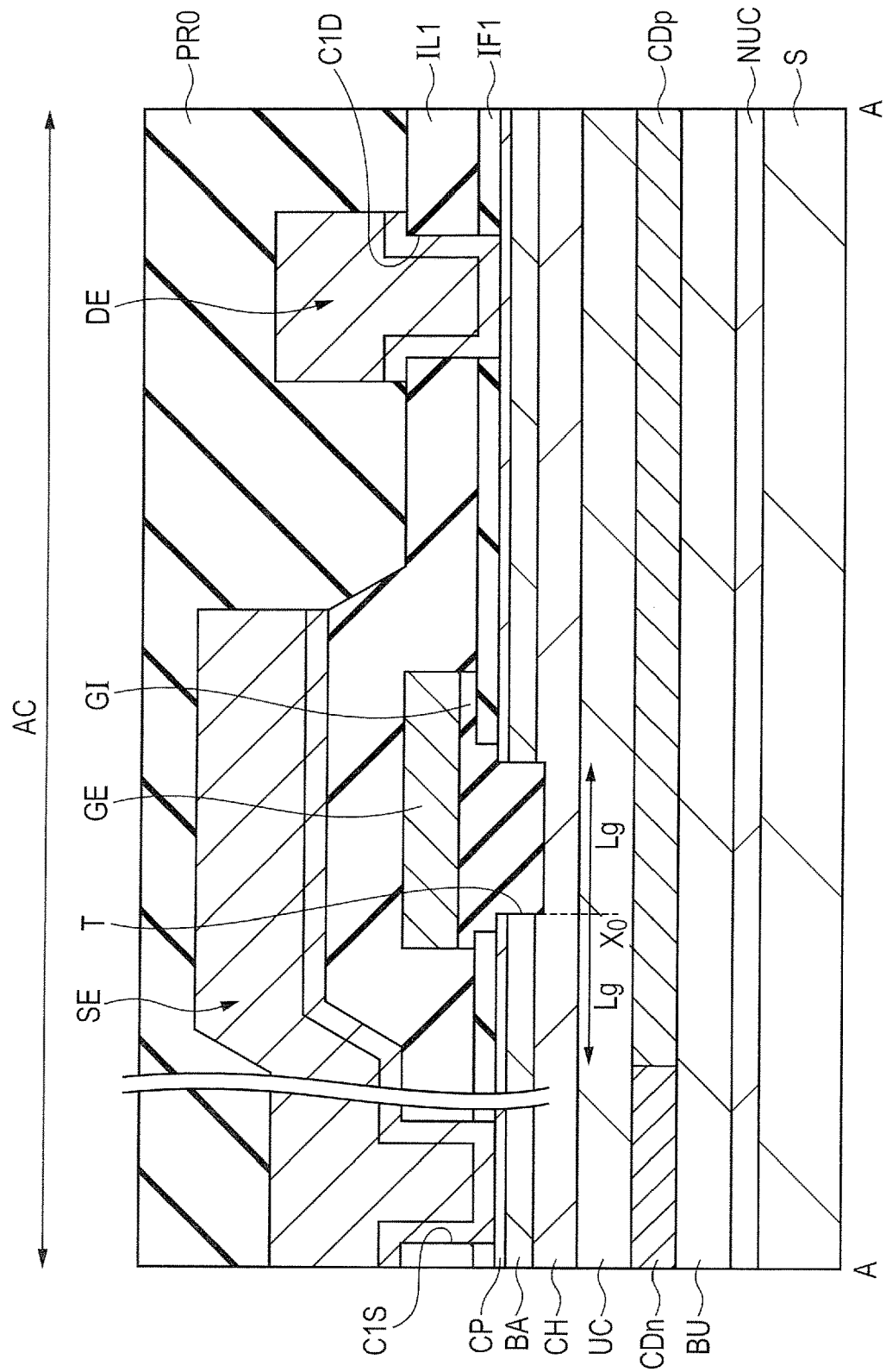
FIG. 32 is a cross-sectional view showing a configuration of a semiconductor device in Application Example 2 of Embodiment 1.

FIG. 32 is a cross-sectional view showing a configuration of a semiconductor device in Application Example 2 of Embodiment 1. The semiconductor device in Application Example 2 is the same as the foregoing semiconductor device (FIGS. 5 to 30) except for the position of the foregoing pn junction portion.

As shown in FIG. 32, the boundary portion (pn junction portion) between the n-type semiconductor region CDn and the p-type semiconductor region CDp may also correspond to a point away from the end portion ($X_0$ of the trench T which is closer to the source electrode SE by a distance Lg corresponding to the width of the trench T (length of the trench T in the X-direction). That is, in this case, the p-type semiconductor region CDp extends from the foregoing point to a position under the drain electrode DE. On the other hand, the n-type semiconductor region CDn extends from the foregoing point to a position under the source electrode SE.

Thus, the boundary portion (pn junction portion) between the n-type semiconductor region CDn and the p-type semiconductor region CDp may also be located within a range of $\pm$Lg from the end portion ($X_0$) of the trench T which is closer to the source electrode SE. In other words, the boundary portion (pn junction portion) between the n-type semiconductor region CDn and the p-type semiconductor region CDp may also be located within a region away from the end portion ($X_0$) of the trench T which is closer to the source electrode SE by the distance (Lg) corresponding to the width of the trench (T).

Embodiment 2

In Embodiment 1, the configuration is used in which the source pad SP and the via pad VIAP are provided as separate patterns such that potentials are individually applicable to these pads. However, the source pad SP and the via pad VIAP may also be provided as an integral pattern.

Figure 33:
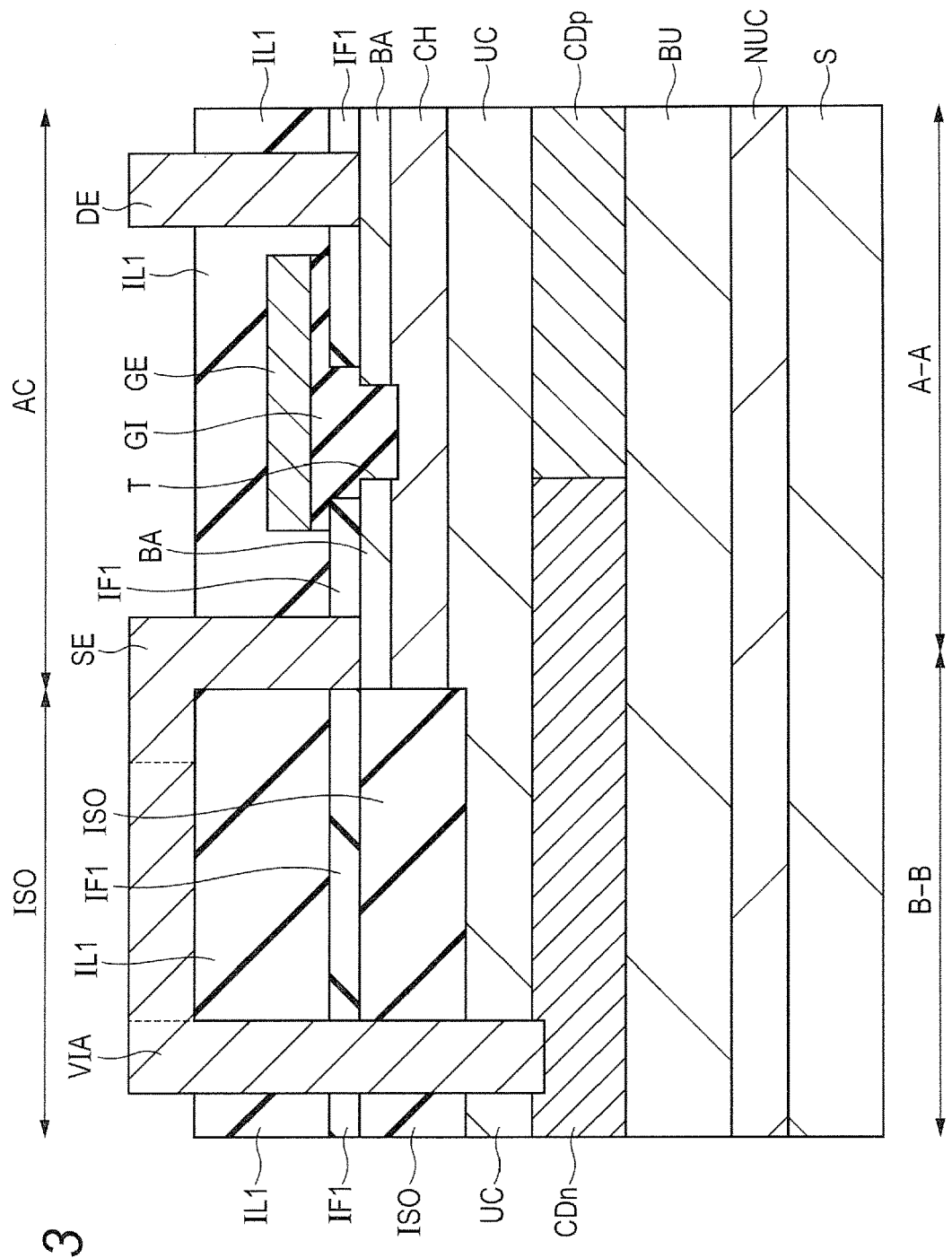
FIG. 33 is a cross-sectional view schematically showing a configuration of a semiconductor device in Embodiment 2.

FIG. 33 is a cross-sectional view schematically showing a configuration of a semiconductor device in Embodiment 2. Note that the semiconductor device is the same as in the case shown in Embodiment 1 except that the source pad SP (source electrode SE) and the via pad VIAP (via VIA) are integrated with each other.

Figure 34:
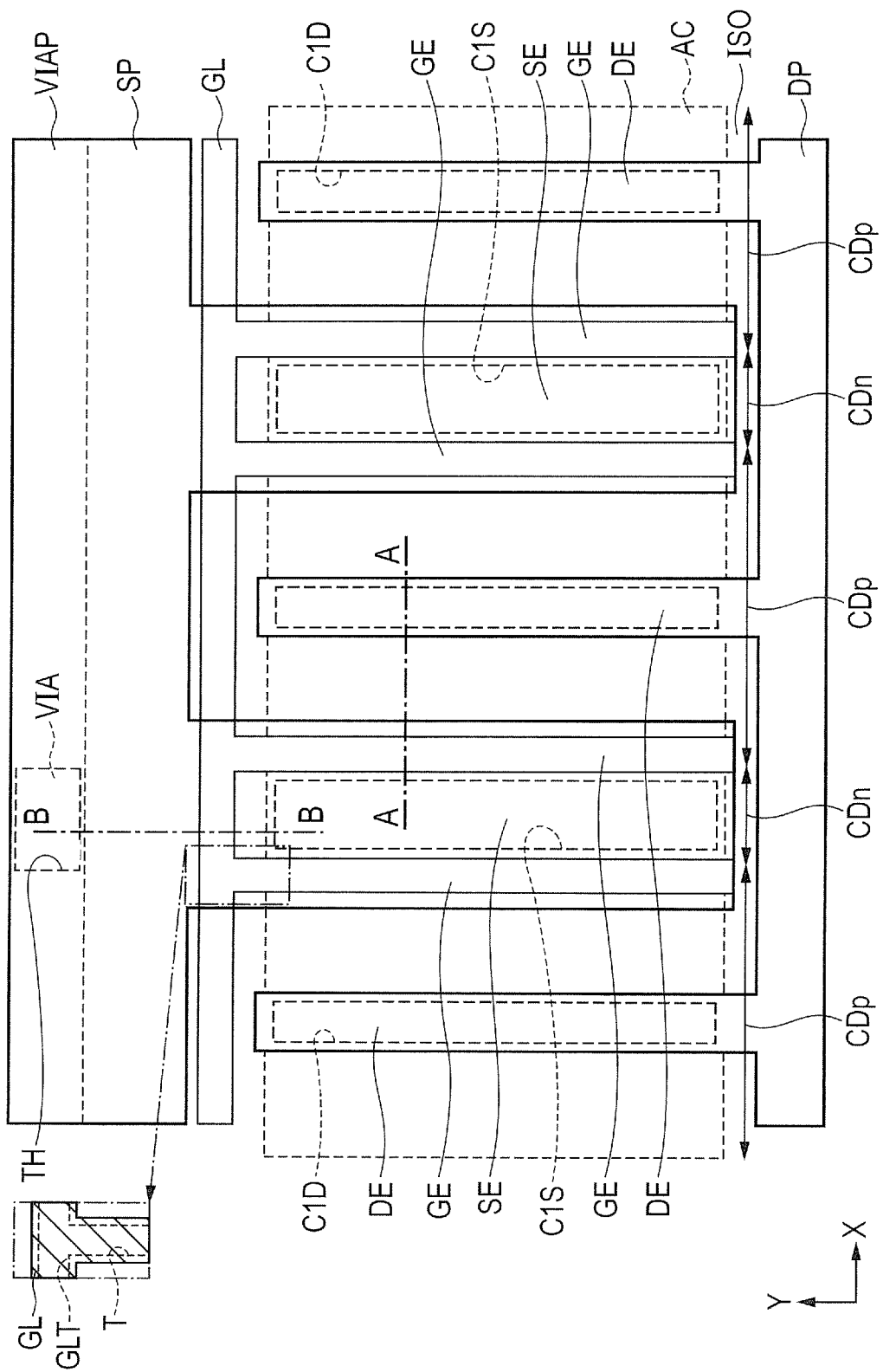
FIG. 34 is a plan view showing the configuration of the semiconductor device in Embodiment 2.
Figure 35:
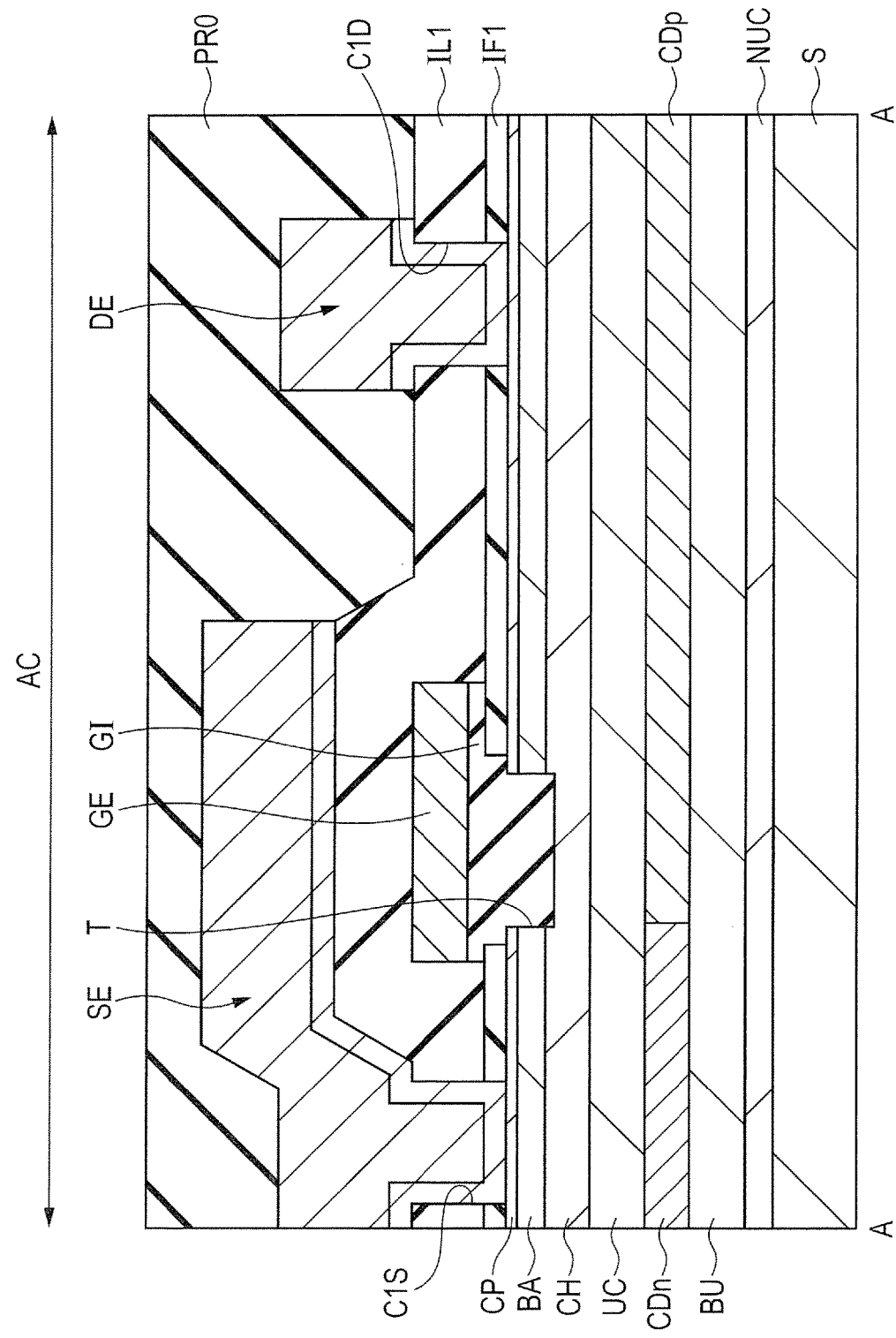
FIG. 35 is a cross-sectional view showing the configuration of the semiconductor device in Embodiment 2.
Figure 36:
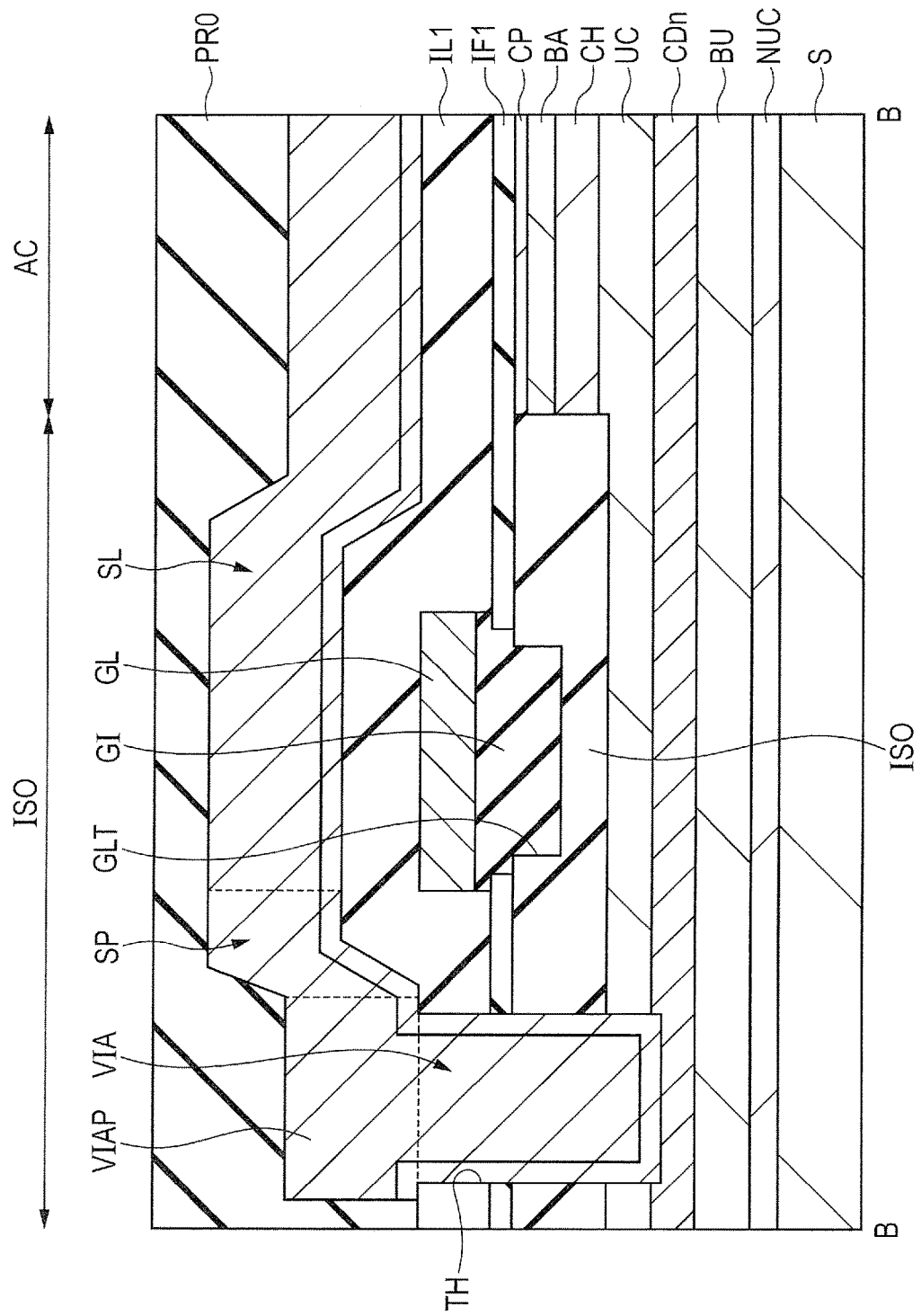
FIG. 36 is a cross-sectional view showing the configuration of the semiconductor device in Embodiment 2.

Referring to FIGS. 34 to 36, the semiconductor device in Embodiment 2 will be described in greater detail. FIGS. 34 to 36 are plan or cross-sectional views each showing the configuration of the semiconductor device in Embodiment 2.

As shown in FIGS. 34 to 36, in the semiconductor device in Embodiment 2, the source pad SP and the via pad VIAP (via VIA) are coupled to each other. In such a configuration, the n-type semiconductor region CDn is coupled to the source electrodes SE via the coupling portion VIA. Consequently, the n-type semiconductor region CD is fixed to a source potential (e.g., 0 V).

The semiconductor device in Embodiment 2 can be formed in the same manner as in Embodiment 1 using the materials described in Embodiment 1.

Embodiment 3

In Embodiment 1, the coupling portion VIA is provided in the isolation region ISO, but the coupling portion VIA may also be provided in the active region AC. For example, in Embodiment 3, the coupling portions VIA are provided under the source electrodes SE.

Referring to the drawings, the following will describe the semiconductor device in Embodiment 3 in detail. Note that a description of the same components as used in the case shown in Embodiment 1 is omitted.

Figure 37:
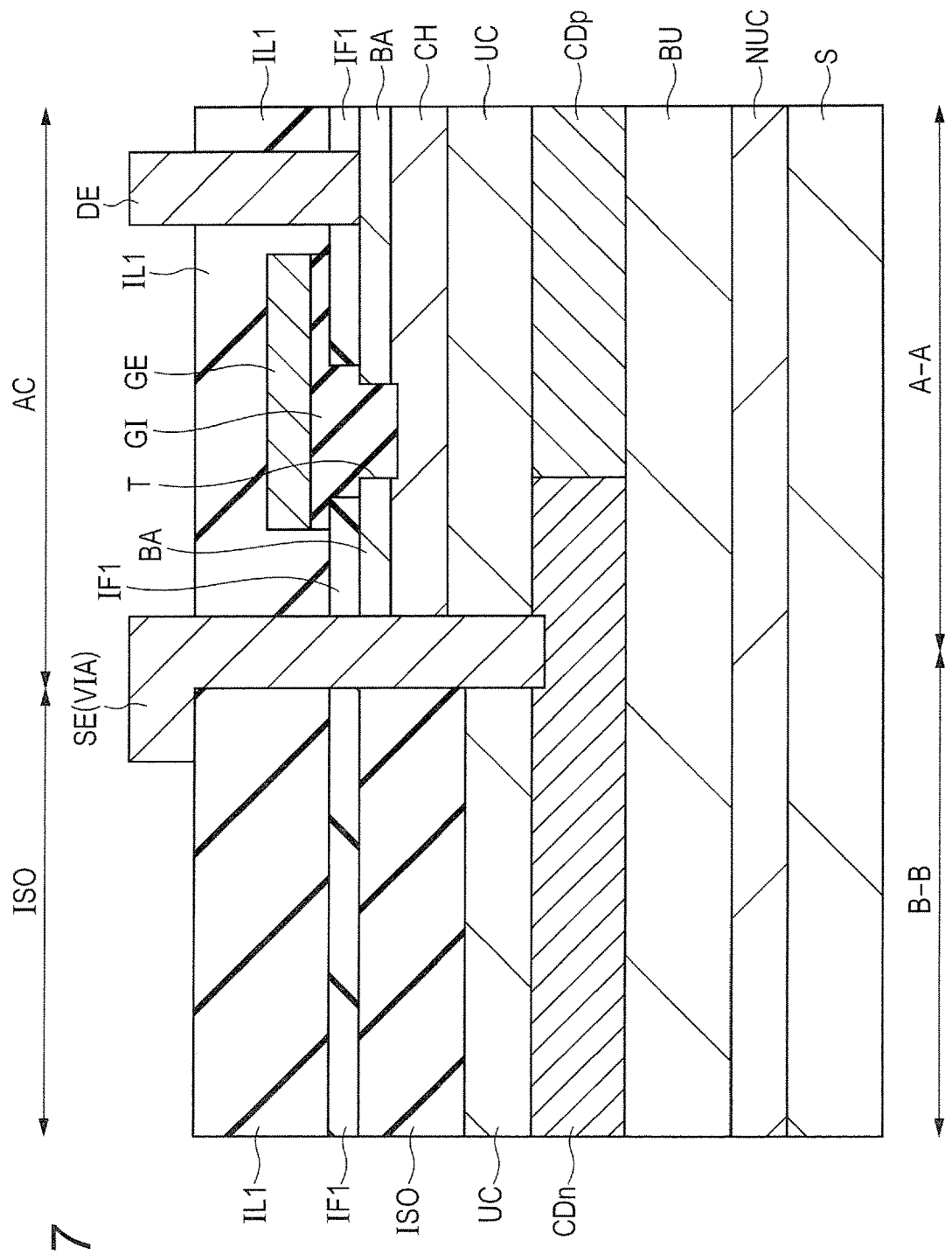
FIG. 37 is a cross-sectional view schematically showing a configuration of a semiconductor device in Embodiment 3.
Figure 38:
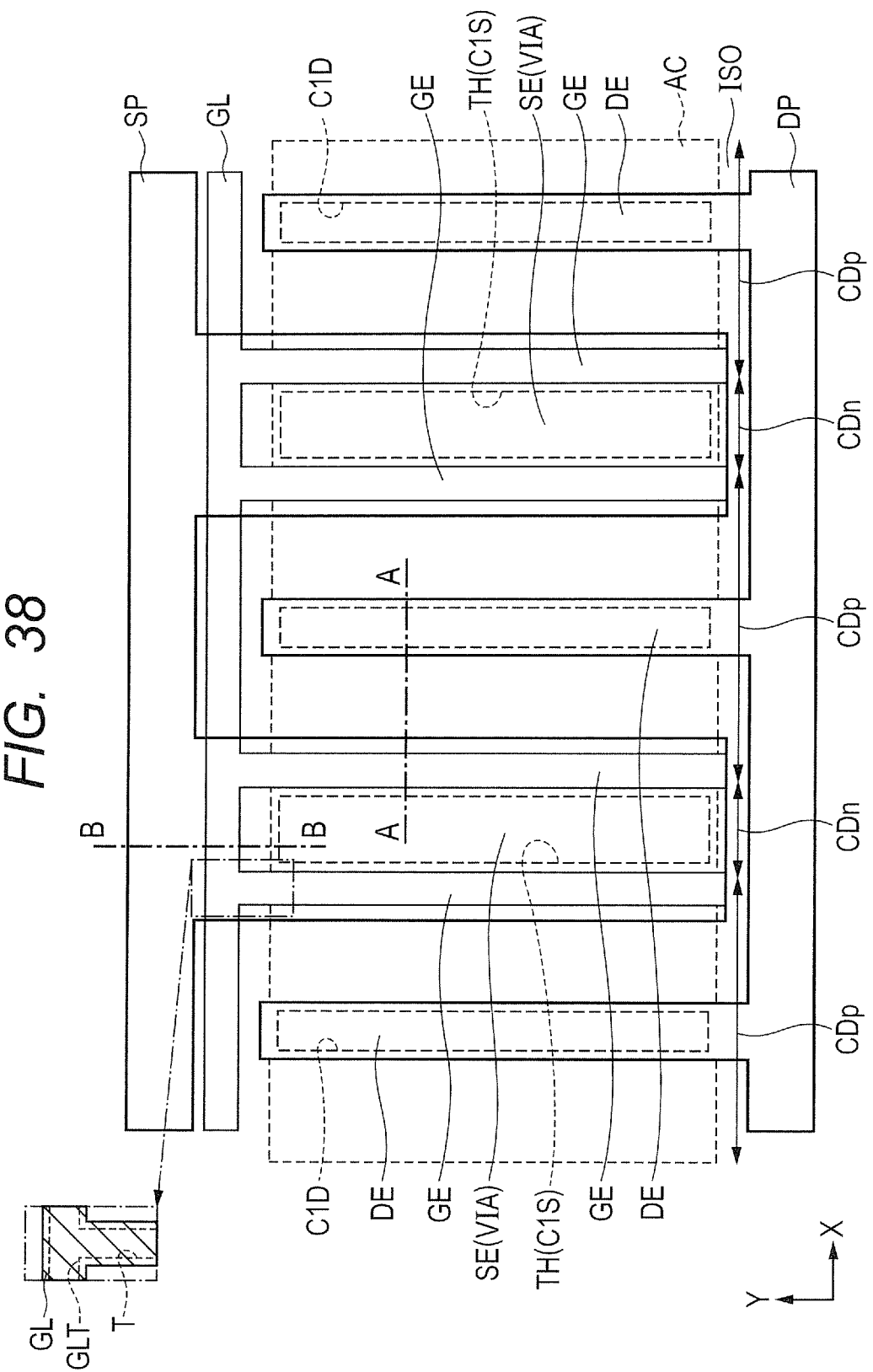
FIG. 38 is a plan view showing the configuration of the semiconductor device in Embodiment 3.
Figure 39:
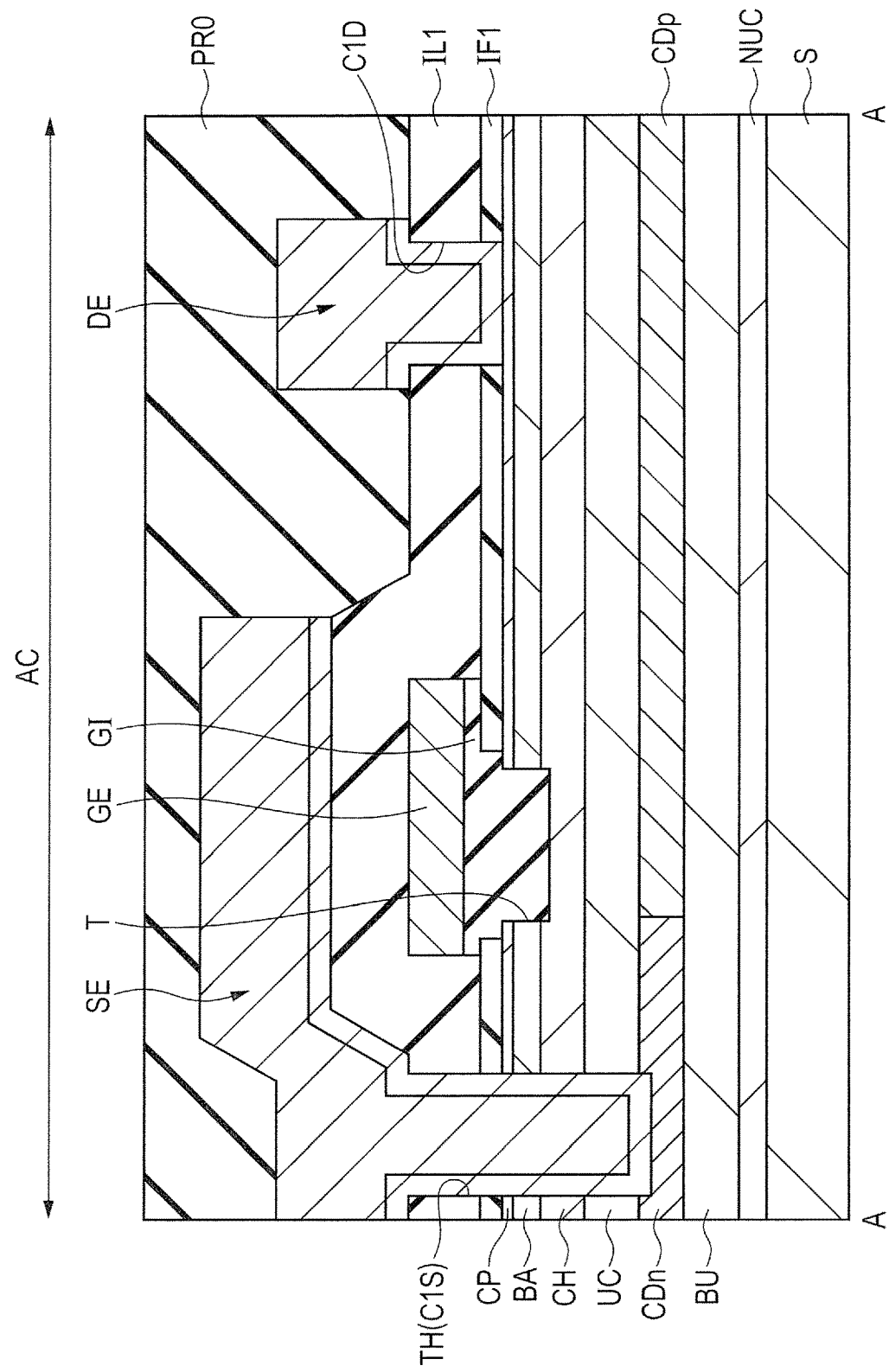
FIG. 39 is a cross-sectional view showing the configuration of the semiconductor device in Embodiment 3.
Figure 40:
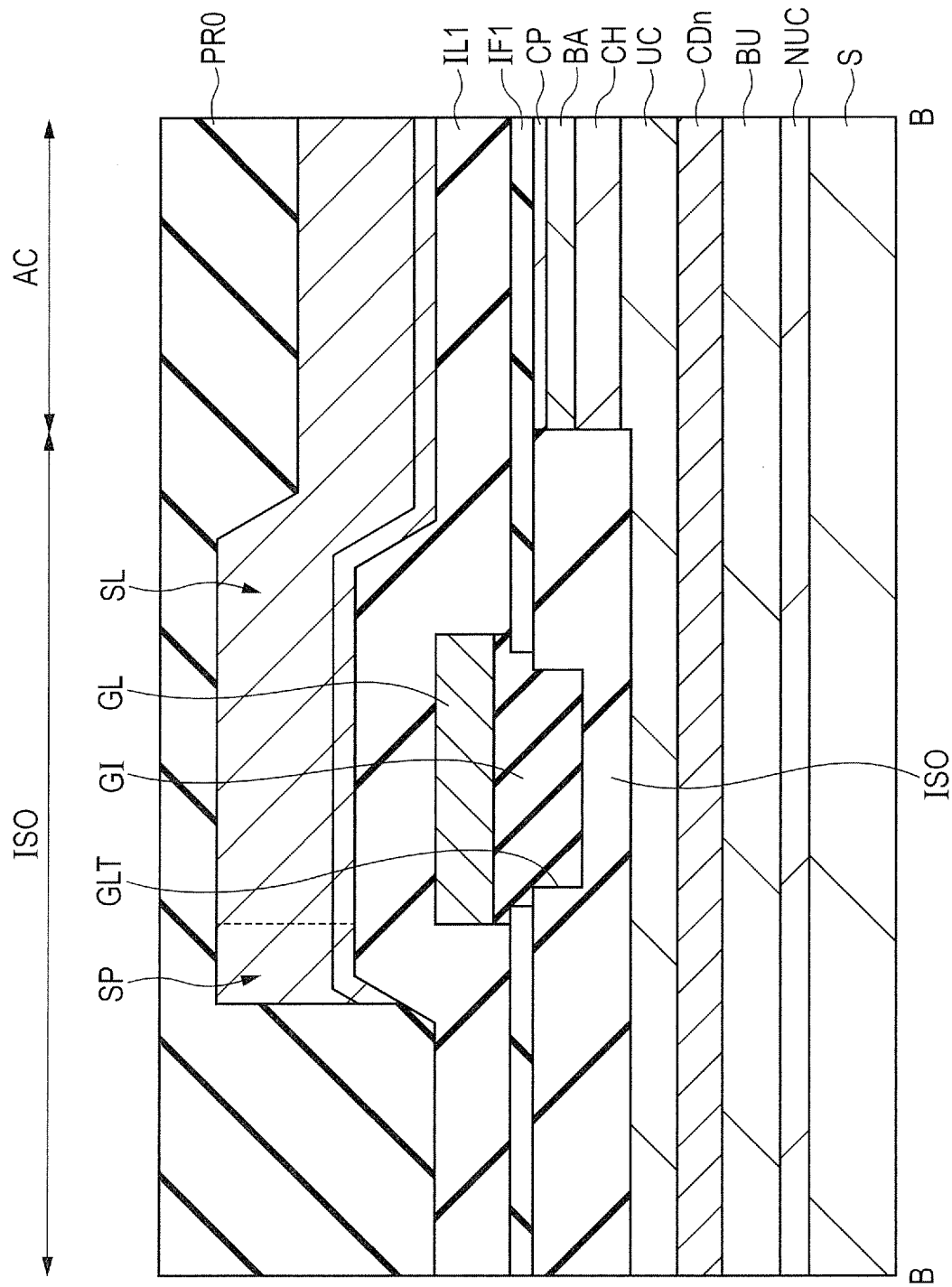
FIG. 40 is a cross-sectional view showing the configuration of the semiconductor device in Embodiment 3.

FIG. 37 is a cross-sectional view schematically showing a configuration of the semiconductor device in Embodiment 3. FIG. 38 is a plan view showing the configuration of the semiconductor device in Embodiment 3. FIGS. 39 and 40 are cross-sectional views each showing the configuration of the semiconductor device in Embodiment 3. The semiconductor device (semiconductor element) in Embodiment 3 is a MIS field effect transistor using nitride semiconductors. The semiconductor device can be used as a power transistor of a high-electron-mobility-transistor (HEMT) type. The semiconductor device in Embodiment 3 is a so-called recessed-gate semiconductor device.

In the semiconductor device in Embodiment 3, as shown in FIGS. 38 to 40, the coupling portions (referred to also as vias) VIA are provided to extend through the barrier layer BA, the channel layer CH, and the channel underlying layer UC under the source electrodes SE in the active region AC and reach the n-type semiconductor region CDn located thereunder. The coupling portions VIA are electrically coupled to the source electrodes SE. By thus providing the n-type semiconductor region CDn and coupling the n-type semiconductor region CDn to the source electrodes SE, variations in properties such as threshold potential and ON resistance can be reduced, as described in Embodiment 1. In addition, since the coupling portions VIA are disposed in the active region AC which conducts electrons, the potential of the n-type semiconductor region CDn can be fixed more effectively. Moreover, since the coupling portions VIA are disposed in the active region AC, it is possible to achieve a reduction in the size of the semiconductor element and a higher integration thereof.

Also, in Embodiment 3, between the gate electrodes GE and the drain electrodes DE, the p-type semiconductor region CDp is provided. This can improve the drain breakdown voltage as described in Embodiment 1.

The semiconductor device in Embodiment 3 can be formed in the same manner as in Embodiment 1 using the materials described in Embodiment 1.

Embodiment 4

In each of Embodiments 1 to 3, the recessed-gate semiconductor device is shown by way of example. However, a semiconductor device having another configuration may also be used. For example, as in Embodiment 4, a mesa-shaped transistor configuration in which, under a gate electrode, a mesa-shaped nitride semiconductor is disposed via a gate insulating film may also be used.

Referring to the drawings, the following will describe a semiconductor device in Embodiment 4 in detail. Note that a description of the same components as used in the case shown in Embodiment 1 is omitted.

Figure 41:
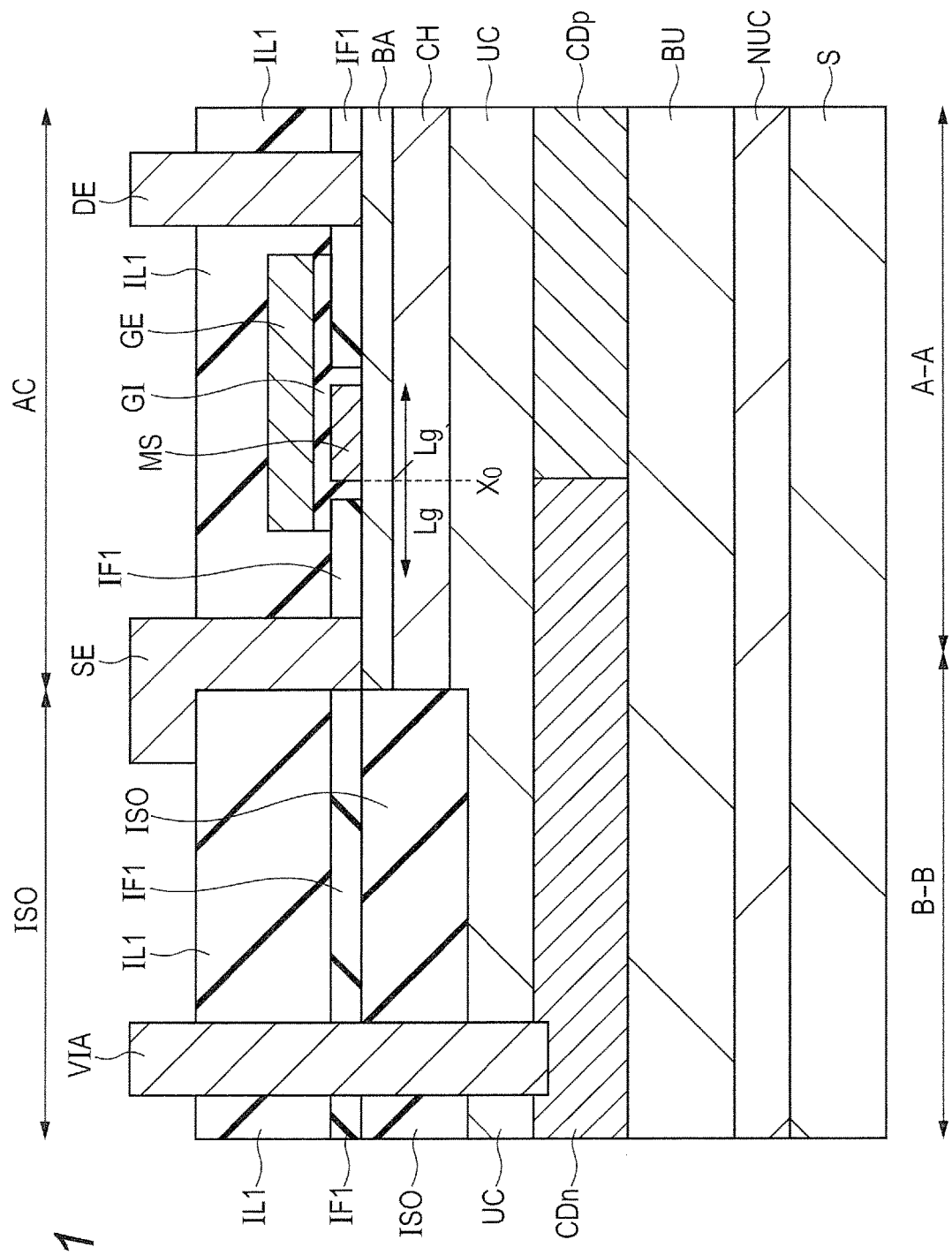
FIG. 41 is a cross-sectional view schematically showing a configuration of a semiconductor device in Embodiment 4.

FIG. 41 is a cross-sectional view schematically showing a configuration of the semiconductor device in Embodiment 4. In the semiconductor device in Embodiment 4, in the same manner as in Embodiment 1, the nucleation layer NUC, the buffer layer BU, the codoped layer CD, the channel underlying layer UC, the channel layer CH, and the barrier layer BA are formed in this order over the substrate S. The nucleation layer NUC is made of a nitride semiconductor layer. The buffer layer BU includes one or a plurality of nitride semiconductor layers each doped with an impurity which forms a deep level in a nitride semiconductor. Here, a superlattice structure including a plurality of nitride semiconductor layers is used. The codoped layer CD is made of a nitride semiconductor layer having an impurity serving as a p-type impurity and an impurity serving as an n-type impurity for a nitride semiconductor. The codoped layer CD is a GaN layer containing, e.g., Mg as a p-type impurity and Si as an n-type impurity. As described in Embodiment 1, the codoped layer CD has the p-type semiconductor region CDp and the n-type semiconductor region CDn.

In the semiconductor element in Embodiment 4, over the barrier layer BA, a mesa-shaped nitride semiconductor MS is disposed.

As the channel underlying layer UC, a nitride semiconductor layer having an electron affinity smaller than that of the channel layer CH and having an average lattice constant in a direction along the top surface of the substrate which is smaller than that of the channel layer CH is used preferably. As the channel layer CH, a nitride semiconductor layer having an electron affinity larger than that of the channel underlying layer UC is used preferably. As the barrier layer BA, a nitride semiconductor layer having an electron affinity smaller than that of the channel layer CH and larger than that of the channel underlying layer UC is used preferably. As the mesa-shaped nitride semiconductor MS, a nitride semiconductor layer having an electron affinity larger than that of the barrier layer BA is used preferably.

Over the mesa-type nitride semiconductor MS, the gate electrode GE formed via the gate insulating film GI is disposed. Over the barrier layer BA located on both sides of the gate electrode GE, the source electrode SE and the drain electrode DE are disposed. The semiconductor element is formed in the active region AC defined by the isolation region ISO.

In the channel layer CH located in the vicinity of the interface between the channel layer CH and the barrier layer BA, the two-dimensional electron gas (2DEG) is generated. However, under the mesa-shaped nitride semiconductor MS, negative charges resulting from acceptor ionization have raised the conduction band of the channel layer CH so that the two-dimensional electron gas (2DEG) is not formed. Consequently, in the semiconductor device in Embodiment 4, the OFF state can be retained in a state where a positive potential (threshold potential) is not applied to the gate electrode GE and the ON state can be retained in a state where a positive potential (threshold potential) is applied to the gate electrode GE. In this manner, a normally-off operation can be performed.

In Embodiment 4, in the isolation region ISO, the coupling portion (referred to also as via) VIA is provided to extend through the isolation region ISO and reach the n-type semiconductor region CDn located thereunder. The coupling portion VIA is electrically coupled to the via pad (potential fixing electrode) VIAP. This can fix the potential of the n-type semiconductor region CDn and reduce variations in properties such as threshold potential and ON resistance.

Also, in Embodiment 4, between the gate electrode GE and the drain electrode DE, the p-type semiconductor region CDp is provided. This allows an improvement in drain breakdown voltage, as described in Embodiment 1.

The semiconductor device in Embodiment 4 can be formed using the materials described in Embodiment 1 by process steps similar to those in Embodiment 1. For example, after a nitride semiconductor is formed over the barrier layer BA, hydrogen is introduced into the codoped layer CD. Then, the nitride semiconductor is patterned into a mesa shape and subsequently the insulating film IF1 is formed on both sides thereof. Further, over the mesa-shaped nitride semiconductor MS, the gate electrode GE is formed via the gate insulating film GI. Then, in the same manner as in Embodiment 1, the contact holes C1S and C1D and the through hole TH are formed and subsequently the source electrodes SE, the drain electrodes DE, the coupling portion VIA, and the like are formed.

In FIG. 41, the boundary portion (pn junction portion) between the n-type semiconductor region CDn and the p-type semiconductor region CDp is located so as to correspond to the end portion ($X_0$) of the mesa-shaped nitride semiconductor MS which is closer to the source electrode. However, the pn junction portion is not limited to this position and may also be located within the range of $\pm Lg$ (in this case, Lg corresponds to the width of the mesa-shaped nitride semiconductor MS) from the foregoing end portion ($X_0$), as has been described in Application Examples 1 and 2 of Embodiment 1.

Also, in FIG. 41, a configuration is shown in which the source pad SP and the via pad VIAP are provided as separate patterns and potentials are individually applicable to these pads. However, the source pad SP and the via pad VIAP may also be provided as an integral pattern (see Embodiment 2).

Figure 42:
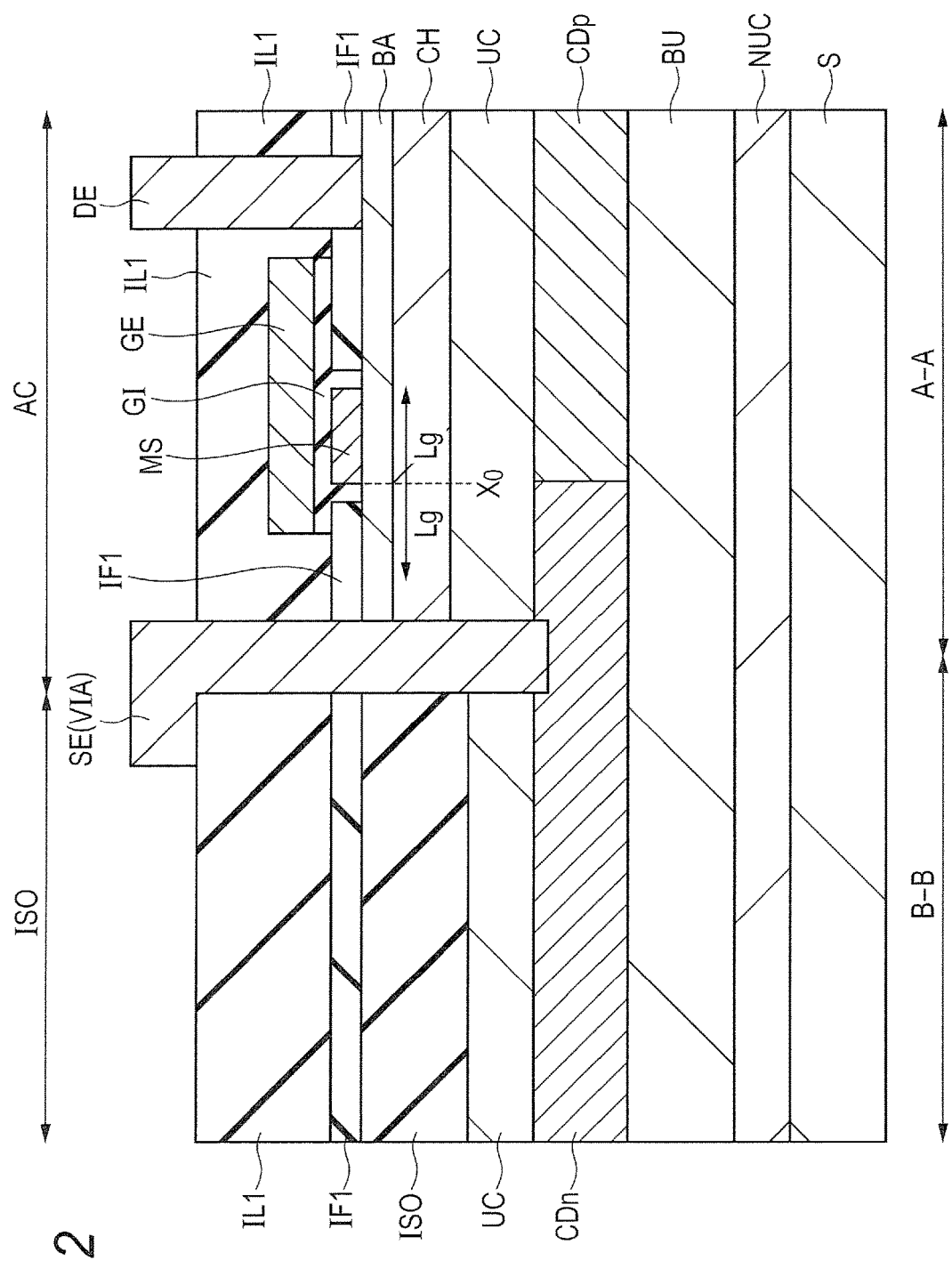
FIG. 42 is a cross-sectional view schematically showing another configuration of the semiconductor device in Embodiment 4.

FIG. 42 is a cross-sectional view schematically showing another configuration of the semiconductor device in Embodiment 4. In FIG. 41, the coupling portion VIA is provided in the isolation region ISO. However, as described in Embodiment 3, the coupling portions VIA may also be provided under the source electrodes SE. In this configuration also, the pn junction portion may also be located within the range of $\pm Lg$ from the foregoing end portion ($X_0$).

Embodiment 5

In each of Embodiments 1 to 3, the recessed-gate semiconductor device is shown by way of example. However, a semiconductor device having another configuration may also be used. For example, as in Embodiment 5, a junction transistor configuration in which a gate junction layer is disposed under a gate electrode may also be used.

Referring to the drawings, the following will describe a semiconductor device in Embodiment 5 in detail. Note that a description of the same components as in the case shown in Embodiment 1 is omitted.

Figure 43:
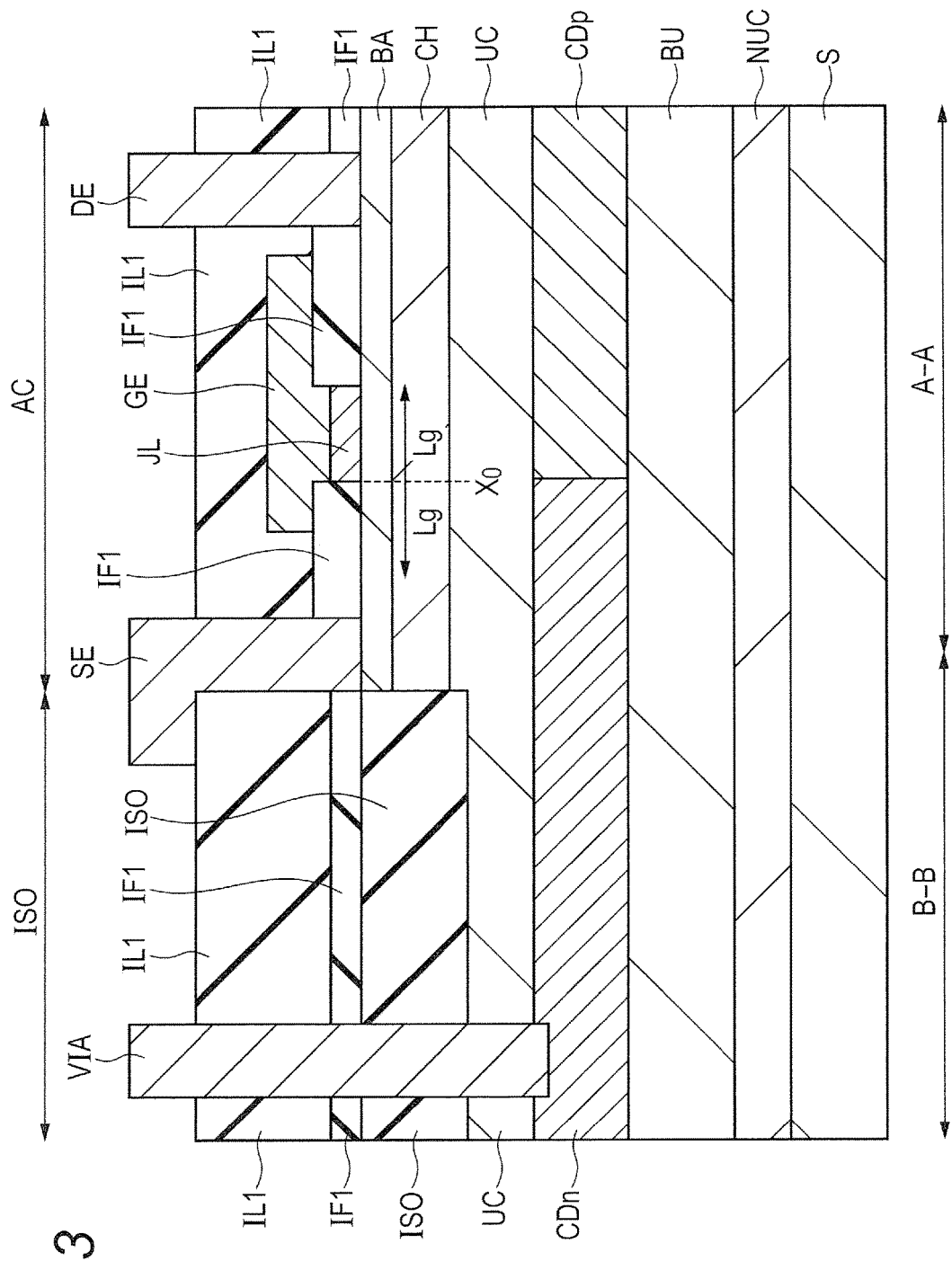
FIG. 43 is a cross-sectional view schematically showing a configuration of a semiconductor device in Embodiment 5.

FIG. 43 is a cross-sectional view schematically showing a configuration of the semiconductor device in Embodiment 5. In the semiconductor device in Embodiment 5, in the same manner as in Embodiment 1, the nucleation layer NUC, the buffer layer BU, the codoped layer CD, the channel underlying layer UC, the channel layer CH, and the barrier layer BA are formed in this order over the substrate S. The nucleation layer NUC is made of a nitride semiconductor layer. The buffer layer BU includes one or a plurality of nitride semiconductor layers each doped with an impurity which forms a deep level in a nitride semiconductor. Here, a superlattice structure including a plurality of nitride semiconductor layers is used. The codoped layer CD is made of a nitride semiconductor layer having an impurity serving as a p-type impurity and an impurity serving as an n-type impurity for a nitride semiconductor. The codoped layer CD is a GaN layer containing, e.g., Mg as a p-type impurity and Si as an n-type impurity. As described in Embodiment 1, the codoped layer CD has the p-type semiconductor region CDp and the n-type semiconductor region CDn.

The semiconductor element in Embodiment 5 has the gate electrode GE, the source electrode SE, and the drain electrode DE. The gate electrode GE is formed over the barrier layer BA via a gate junction layer JL. The source electrode SE and the drain electrode DE are formed over the barrier layer BA located on both sides of the gate electrode GE. The semiconductor element is formed in the active region AC defined by the isolation region ISO. The gate junction layer JL is a nitride semiconductor doped with a p-type impurity. Preferably, the gate junction layer JL and the gate electrode GE make ohmic contacts with holes.

As the channel underlying layer UC, a nitride semiconductor layer having an electron affinity smaller than that of the channel layer CH and having an average lattice constant in a direction along the top surface of the substrate which is smaller than that of the channel layer CH is used preferably. As the channel layer CH, a nitride semiconductor layer having an electron affinity larger than that of the channel underlying layer UC is used preferably. As the barrier layer BA, a nitride semiconductor layer having an electron affinity smaller than that of the channel layer CH and larger than that of the channel underlying layer UC is used preferably. As the gate junction layer JL, a nitride semiconductor layer having an electron affinity larger than that of the barrier layer BA is used preferably.

Over the gate junction layer JL, the gate electrode GE formed via the gate insulating film GI is disposed. Over the barrier layer BA located on both sides of the gate electrode GE, the source electrode SE and the drain electrode DE are disposed. The semiconductor element is formed in the active region AC defined by the isolation region ISO.

In the channel layer CH located in the vicinity of the interface between the channel layer CH and the barrier layer BA, the two-dimensional electron gas (2DEG) is generated. However, under the gate junction layer VL, negative charges resulting from acceptor ionization have raised the conduction band of the channel layer CH so that the two-dimensional electron gas (2DEG) is not formed. Consequently, in the semiconductor device in Embodiment 5, the OFF state can be retained in a state where a positive potential (threshold potential) is not applied to the gate electrode GE and the ON state can be retained in a state where a positive potential (threshold potential) is applied to the gate electrode GE. In this manner, a normally-off operation can be performed.

In Embodiment 5, in the isolation region ISO, the coupling portion (referred to also as via) VIA is provided to extend through the isolation region ISO and reach the n-type semiconductor region CDn located thereunder. The coupling portion VIA is electrically coupled to the via pad (potential fixing electrode) VIAP. This can fix the potential of the n-type semiconductor region CDn and reduce variations in properties such as threshold potential and ON resistance.

Also, in Embodiment 5, between the gate electrode GE and the drain electrode DE, the p-type semiconductor region CDp is provided. This allows an improvement in drain breakdown voltage, as described in Embodiment 1.

The semiconductor device in Embodiment 5 can be formed using the materials described in Embodiment 1 by process steps similar to those in Embodiment 1. For example, after a nitride semiconductor is formed over the barrier layer BA, hydrogen is introduced into the codoped layer CD. Then, the nitride semiconductor is patterned to form the gate junction layer JL and subsequently the insulating film IF1 is formed on both sides thereof. Further, over the gate junction layer JL, the gate electrode GE is formed. Then, in the same manner as in Embodiment 1, the contact holes C1S and C1D and the through hole TH are formed and subsequently the source electrodes SE, the drain electrodes DE, the coupling portion VIA, and the like are formed.

In FIG. 43, the boundary portion (pn junction portion) between the n-type semiconductor region CDn and the p-type semiconductor region CDp is located so as to correspond to the end portion ($X_0$) of the gate junction layer JL which is closer to the source electrode. However, the pn junction portion is not limited to this position and may also be located within the range of ±Lg (in this case, Lg corresponds to the width of the gate junction layer JL) from the foregoing end portion ($X_0$), as has been described in Application Examples 1 and 2 of Embodiment 1.

Also, in FIG. 43, the configuration is shown in which the source pad SP and the via pad VIAP are provided as separate patterns and potentials are individually applicable to these pads. However, the source pad SP and the via pad VIAP may also be provided as an integral pattern (see Embodiment 2).

Figure 44:
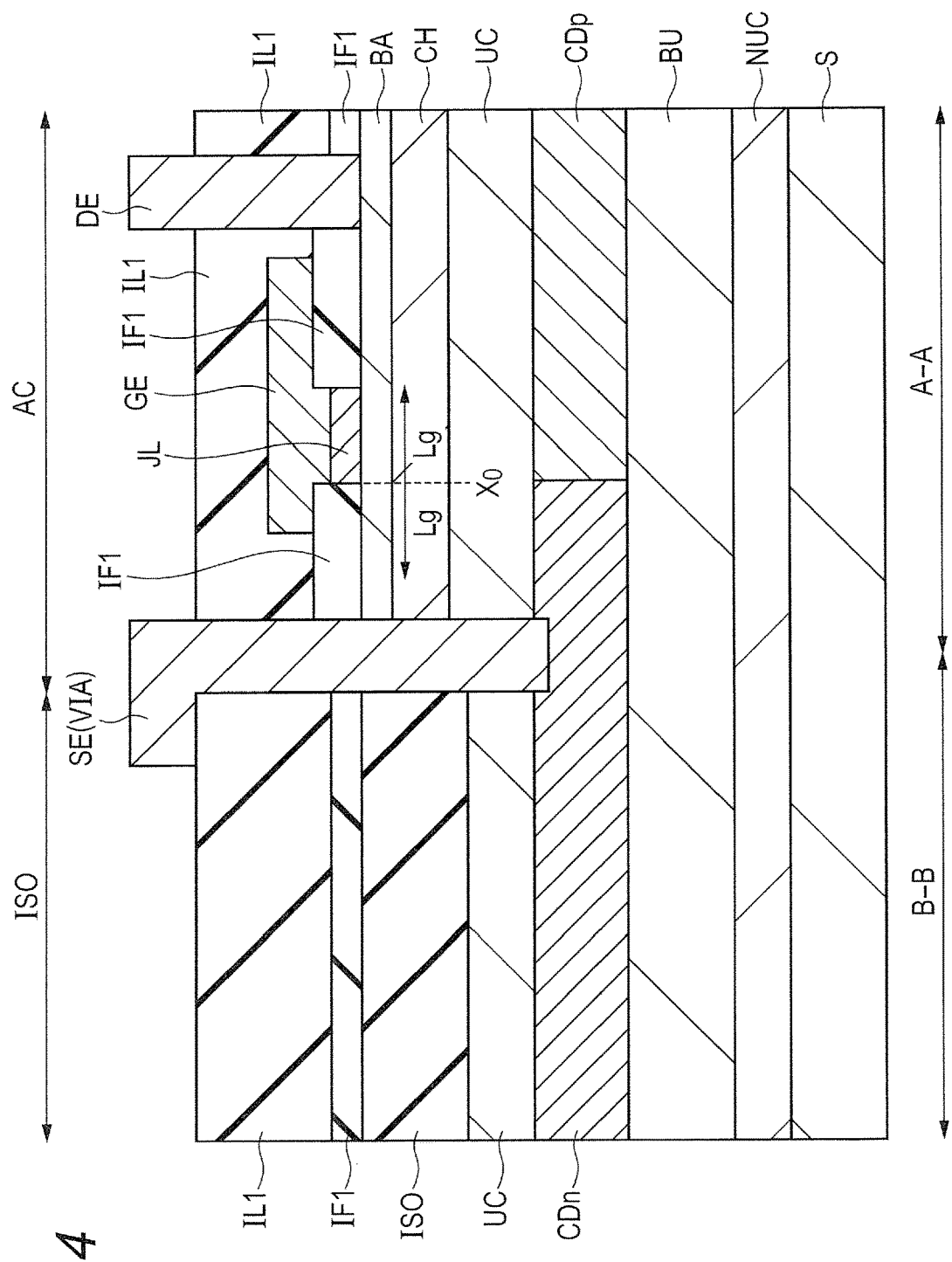
FIG. 44 is a cross-sectional view schematically showing another configuration of the semiconductor device in Embodiment 5.

FIG. 44 is a cross-sectional view schematically showing another configuration of the semiconductor device in Embodiment 5. In FIG. 43, the coupling portion VIA is provided in the isolation region ISO. However, as described in Embodiment 3, the coupling portions VIA may also be provided under the source electrodes SE. In this configuration also, the pn junction portion may also be located within the range of ±Lg from the foregoing end portion ($X_0$).

Embodiment 6

In each of Embodiments 1 to 3, the recessed-gate semiconductor device is shown by way of example. However, a semiconductor device having another configuration may also be used. For example, as in Embodiment 6, a Schottky-type transistor configuration in which a gate insulating film is not provided under a gate electrode and the gate electrode and a nitride semiconductor layer located thereunder are Schottky-coupled to each other may also be used.

Referring to the drawings, the following will describe a semiconductor device in Embodiment 6 in detail. Note that a description of the same components as in the case shown in Embodiment 1 is omitted.

Figure 45:
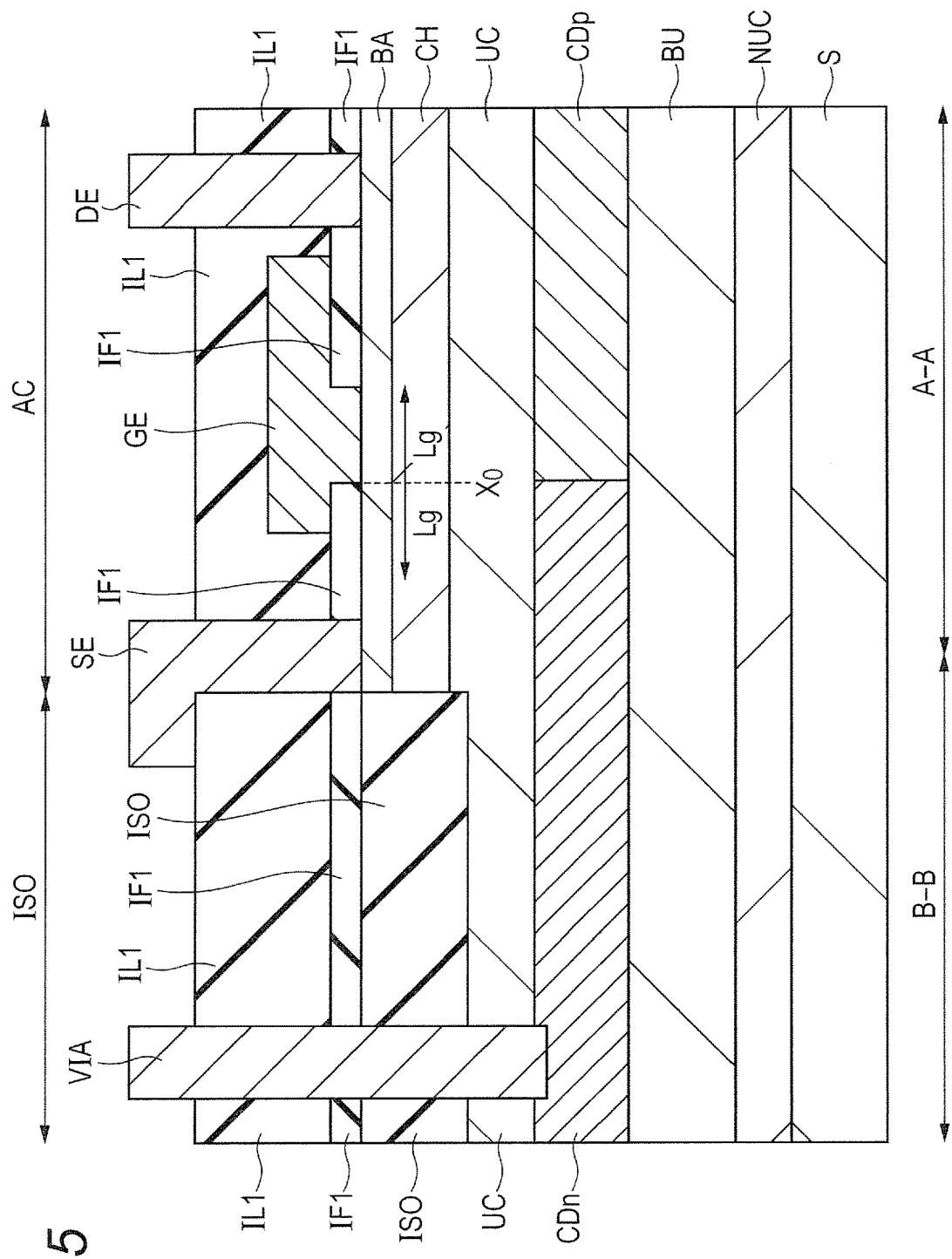
FIG. 45 is a cross-sectional view schematically showing a configuration of a semiconductor device in Embodiment 6.

FIG. 45 is a cross-sectional view schematically showing a configuration of the semiconductor device in Embodiment 6. In the semiconductor device in Embodiment 6, in the same manner as in Embodiment 1, the nucleation layer NUC, the buffer layer BU, the codoped layer CD, the channel underlying layer UC, the channel layer CH, and the barrier layer BA are formed in this order over the substrate S. The nucleation layer NUC is made of a nitride semiconductor layer. The buffer layer BU includes one or a plurality of nitride semiconductor layers each doped with an impurity which forms a deep level in a nitride semiconductor. Here, a superlattice structure including a plurality of nitride semiconductor layers is used. The codoped layer CD is made of a nitride semiconductor layer having an impurity serving as a p-type impurity and an impurity serving as an n-type impurity for a nitride semiconductor. The codoped layer CD is a GaN layer containing, e.g., Mg as a p-type impurity and Si as an n-type impurity. As described in Embodiment 1, the codoped layer CD has the p-type semiconductor region CDp and the n-type semiconductor region CDn.

The semiconductor element in Embodiment 6 has the gate electrode GE, the source electrode SE, and the drain electrode DE. The gate electrode GE is formed over the barrier layer BA. The source electrode SE and the drain electrode DE are formed over the barrier layer BA located on both sides of the gate electrode GE. Note that the region where the barrier layer BA and the gate electrode GE are in contact with each other is referred to as a "gate junction portion" or "Schottky junction portion". The semiconductor element is formed in the active region AC defined by the isolation region ISO.

In the channel layer CH located in the vicinity of the interface between the channel layer CH and the barrier layer BA, the two-dimensional electron gas (2DEG) is generated. However, by applying a predetermined potential to the gate electrode GE, it is possible to cause the two-dimensional electron gas (2DEG) to disappear and provide the OFF state.

As the channel underlying layer UC, a nitride semiconductor layer having an electron affinity smaller than that of the channel layer CH and having an average lattice constant in a direction along the top surface of the substrate which is smaller than that of the channel layer CH is used preferably. As the channel layer CH, a nitride semiconductor layer having an electron affinity larger than that of the channel underlying layer UC is used preferably. As the barrier layer BA, a nitride semiconductor layer having an electron affinity smaller than that of the channel layer CH and larger than that of the channel underlying layer UC is used preferably.

In Embodiment 6, in the isolation region ISO, the coupling portion (referred to also as via) VIA is provided to extend through the isolation region ISO and reach the n-type semiconductor region CDn located thereunder. The coupling portion VIA is electrically coupled to the via pad (potential fixing electrode) VIAP. This can fix the potential of the n-type semiconductor region CDn and reduce variations in properties such as threshold potential and ON resistance.

Also, in Embodiment 6, between the gate electrode GE and the drain electrode DE, the p-type semiconductor region CDp is provided. This allows an improvement in drain breakdown voltage, as described in Embodiment 1.

The semiconductor device in Embodiment 5 can be formed using the materials described in Embodiment 1 by process steps similar to those in Embodiment 1. For example, after the insulating film IF1 is formed over the barrier layer BA, hydrogen is introduced into the codoped layer CD. Then, in the insulating film IF1, an opening is formed and, over the insulating film IF1 including the opening, the gate electrode GE is formed. Then, in the same manner as in Embodiment 1, the contact holes C1S and C1D and the through hole TH are formed and subsequently the source electrodes SE, the drain electrodes DE, the coupling portion VIA, and the like are formed.

In FIG. 45, the boundary portion (pn junction portion) between the n-type semiconductor region CDn and the p-type semiconductor region CDp is located so as to correspond to the end portion ($X_0$) of the opening (gate junction portion) of the insulating film IF1 which is closer to the source electrode. However, the pn junction portion is not limited to this position and may also be located within the range of ±Lg (in this case, Lg corresponds to the width of the gate junction portion) from the foregoing end portion ($X_0$), as has been described in Application Examples 1 and 2 of Embodiment 1.

Also, in FIG. 45, the configuration is shown in which the source pad SP and the via pad VIAP are provided as separate patterns and potentials are individually applicable to these pads. However, the source pad SP and the via pad VIAP may also be provided as an integral pattern (see Embodiment 2).

FIG. 46 is a cross-sectional view schematically showing another configuration of the semiconductor device in Embodiment 6. In FIG. 45, the coupling portion VIA is provided in the isolation region ISO. However, as described in Embodiment 3, the coupling portions VIA may also be provided under the source electrodes SE. In this configuration also, the pn junction portion may also be located within the range of $\pm Lg$ from the foregoing end portion ($X_0$).

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof. For example, the position of the boundary portion (pn junction portion) between the n-type semiconductor region CDn and the p-type semiconductor region CDp described in Application Examples 1 and 2 of Embodiment 1 described above may also be applied to the semiconductor device in Embodiment 2 or 3.

A device to which the semiconductor device in each of the foregoing embodiments is applied is not limited and is used as a power electronic device or a high-frequency amplification device. The semiconductor device in each of the foregoing embodiments is useful in a switching power supply, a circuit such as an inverter, a high-frequency amplifier, or the like.

(Note 1)
A semiconductor device, includes:
a first nitride semiconductor layer formed over a substrate;
a second nitride semiconductor layer formed over the first nitride semiconductor layer;
a third nitride semiconductor layer formed over the second nitride semiconductor layer;
a gate electrode disposed over the third nitride semiconductor layer via a fourth nitride semiconductor layer;
a first electrode and a second electrode which are formed over the third nitride semiconductor layer located on both sides of the gate electrode; and
a coupling portion coupling a potential fixing electrode to the first nitride semiconductor layer,
in which an electron affinity of the second nitride semiconductor layer is larger than an electron affinity of the third nitride semiconductor layer,
in which the first nitride semiconductor layer has an impurity having a first conductivity type and an impurity having a second conductivity type,
in which, in the first nitride semiconductor layer, a concentration of the second-conductivity-type impurity is higher than a concentration of the first-conductivity-type impurity,
in which, of the first nitride semiconductor layer, a region closer to the first electrode is a semiconductor region having the first conductivity type and a region closer to the second electrode is a semiconductor region having the second conductivity type opposite to the first conductivity type, and
in which the coupling portion couples the potential fixing electrode to the first-conductivity-type semiconductor region.

(Note 2)
In the semiconductor device according to Note 1,
the first-conductivity-type semiconductor region contains hydrogen, and
a hydrogen concentration in the first-conductivity-type semiconductor region is higher than a hydrogen concentration in the second-conductivity-type semiconductor region.

(Note 3)
In the semiconductor device according to Note 1,
in the first nitride semiconductor layer, a concentration of the second-conductivity-type impurity is not less than double a concentration of the first-conductivity-type impurity.

(Note 4)
In the semiconductor device according to Note 2,
the first-conductivity-type impurity is Si and the second-conductivity-type impurity is Mg.

(Note 5)
In the semiconductor device according to Note 1,
a boundary portion between the first-conductivity-type semiconductor region and the second-conductivity-type semiconductor region is located at a position corresponding to an end portion of the fourth nitride semiconductor layer which is closer to the first electrode.

(Note 6)
In the semiconductor device according to Note 1,
a boundary portion between the first-conductivity-type semiconductor region and the second-conductivity-type semiconductor region is located in a region away from an end portion of the fourth nitride semiconductor layer which is closer to the first electrode by a distance corresponding to a width of the fourth nitride semiconductor layer.

(Note 7)
A semiconductor device, includes:
a first nitride semiconductor layer formed over a substrate;
a second nitride semiconductor layer formed over the first nitride semiconductor layer;
a third nitride semiconductor layer formed over the second nitride semiconductor layer;
a gate electrode disposed over the third nitride semiconductor layer;
a first electrode and a second electrode which are formed over the third nitride semiconductor layer located on both sides of the gate electrode; and
a coupling portion coupling a potential fixing electrode to the first nitride semiconductor layer,
in which an electron affinity of the second nitride semiconductor layer is larger than an electron affinity of the third nitride semiconductor layer,
in which the first nitride semiconductor layer has an impurity having a first conductivity type and an impurity having a second conductivity type,
in which, in the first nitride semiconductor layer, a concentration of the second-conductivity-type impurity is higher than a concentration of the first-conductivity-type impurity,
in which, of the first nitride semiconductor layer, a region closer to the first electrode is a semiconductor region having the first conductivity type and a region closer to the second electrode is a semiconductor region having the second conductivity type opposite to the first conductivity type, and
in which the coupling portion couples the potential fixing electrode to the first-conductivity-type semiconductor region.

(Note 8)
In the semiconductor device according to Note 7,
the first-conductivity-type semiconductor region contains hydrogen, and a hydrogen concentration in the first-conductivity-type semiconductor region is higher than a hydrogen concentration in the second-conductivity-type semiconductor region.

(Note 9)

In the semiconductor device according to Note 7, in the first nitride semiconductor layer, a concentration of the second-conductivity-type impurity is not less than double a concentration of the first-conductivity-type impurity.

(Note 10)

In the semiconductor device according to Note 7, the first-conductivity-type impurity is Si and the second-conductivity-type impurity is Mg.

(Note 11)

In the semiconductor device according to Note 7, respective contact portions of the third nitride semiconductor layer and the gate electrode form a Schottky junction portion, and a boundary portion between the first-conductivity-type semiconductor region and the second-conductivity-type semiconductor region is located at a position corresponding to an end portion of the Schottky junction portion which is closer to the first electrode.

(Note 12)

In the semiconductor device according to Note 7, respective contact portions of the third nitride semiconductor layer and the gate electrode form a Schottky junction portion, and a boundary portion between the first-conductivity-type semiconductor region and the second-conductivity-type semiconductor region is located in a region away from an end portion of the Schottky junction portion which is closer to the first electrode by a distance corresponding to a width of the Schottky junction portion.

What is claimed is:

1. A semiconductor device, comprising:
   a first nitride semiconductor layer formed over a substrate;
   a second nitride semiconductor layer formed over the first nitride semiconductor layer;
   a third nitride semiconductor layer formed over the second nitride semiconductor layer;
   a trench extending through the third nitride semiconductor layer and reaching a middle point in the second nitride semiconductor layer;
   a gate electrode disposed in the trench via a gate insulating film;
   a first electrode and a second electrode which are formed over the third nitride semiconductor layer located on both sides of the gate electrode; and
   a coupling portion coupling a potential fixing electrode to the first nitride semiconductor layer,
   wherein an electron affinity of the second nitride semiconductor layer is larger than an electron affinity of the third nitride semiconductor layer,
   wherein the first nitride semiconductor layer has an impurity having a first conductivity type and an impurity having a second conductivity type,
   wherein, in the first nitride semiconductor layer, a concentration of the second-conductivity-type impurity is higher than a concentration of the first-conductivity-type impurity,
   wherein, of the first nitride semiconductor layer, a region closer to the first electrode is a semiconductor region having the first conductivity type and a region closer to the second electrode is a semiconductor region having the second conductivity type opposite to the first conductivity type, and
   wherein the coupling portion couples the potential fixing electrode to the first-conductivity-type semiconductor region.

2. The semiconductor device according to claim 1,
   wherein the first-conductivity-type semiconductor region contains hydrogen, and
   wherein a hydrogen concentration in the first-conductivity-type semiconductor region is higher than a hydrogen concentration in the second-conductivity-type semiconductor region.

3. The semiconductor device according to claim 2,
   wherein the first-conductivity-type impurity is Si and the second-conductivity-type impurity is Mg.

4. The semiconductor device according to claim 1,
   wherein, in the first nitride semiconductor layer, a concentration of the second-conductivity-type impurity is not less than double a concentration of the first-conductivity-type impurity.

5. The semiconductor device according to claim 1,
   wherein a boundary portion between the first-conductivity-type semiconductor region and the second-conductivity-type semiconductor region is located at a position corresponding to an end portion of the trench which is closer to the first electrode.

6. The semiconductor device according to claim 1,
   wherein a boundary portion between the first-conductivity-type semiconductor region and the second-conductivity-type semiconductor region is located in a region away from an end portion of the trench which is closer to the first electrode by a distance corresponding to a width of the trench.

7. The semiconductor device according to claim 1,
   wherein the substrate has a first region and a second region,
   wherein the gate electrode, the first electrode, and the second electrode are formed in the first region,
   wherein the second region is an isolation region formed in each of the third and second nitride semiconductor layers, and
   wherein the coupling portion is disposed in a through hole extending through the isolation region and reaching the first nitride semiconductor layer.

8. The semiconductor device according to claim 7,
   wherein, over the coupling portion, the first electrode is disposed.

9. The semiconductor device according to claim 1, further comprising:
   a first terminal portion electrically coupled to the first electrode,
   wherein the potential fixing electrode is electrically coupled to the first terminal portion.

10. The semiconductor device according to claim 1,
    wherein the coupling portion is disposed in a through hole extending through the third and second nitride semiconductor layers and reaching the first nitride semiconductor layer.

11. A semiconductor device, comprising:
    a first nitride semiconductor layer formed over a substrate;
    a second nitride semiconductor layer formed over the first nitride semiconductor layer;
    a third nitride semiconductor layer formed over the second nitride semiconductor layer;

a mesa-shaped fourth nitride semiconductor layer formed over the third nitride semiconductor layer;

a gate electrode disposed over the fourth nitride semiconductor layer via a gate insulating film;

a first electrode and a second electrode which are formed over the third nitride semiconductor layer located on both sides of the gate electrode; and a coupling portion coupling a potential fixing electrode to the first nitride semiconductor layer, wherein an electron affinity of the second nitride semiconductor layer is larger than an electron affinity of the third nitride semiconductor layer, wherein the first nitride semiconductor layer has an impurity having a first conductivity type and an impurity having a second conductivity type, wherein, in the first nitride semiconductor layer, a concentration of the second-conductivity-type impurity is higher than a concentration of the first-conductivity-type impurity, wherein, of the first nitride semiconductor layer, a region closer to the first electrode is a semiconductor region having the first conductivity type and a region closer to the second electrode is a semiconductor region having the second conductivity type opposite to the first conductivity type, and wherein the coupling portion couples the potential fixing electrode to the first-conductivity-type semiconductor region.

12. The semiconductor device according to claim 11,
wherein the first-conductivity-type semiconductor region contains hydrogen, and
wherein a hydrogen concentration in the first-conductivity-type semiconductor region is higher than a hydrogen concentration in the second-conductivity-type semiconductor region.

13. The semiconductor device according to claim 12,
wherein the first-conductivity-type impurity is Si and the second-conductivity-type impurity is Mg.

14. The semiconductor device according to claim 11,
wherein, in the first nitride semiconductor layer, a concentration of the second-conductivity-type impurity is not less than double a concentration of the first-conductivity-type impurity.

15. The semiconductor device according to claim 11,
wherein a boundary portion between the first-conductivity-type semiconductor region and the second-conductivity-type semiconductor region is located at a position corresponding to an end portion of the fourth nitride semiconductor layer which is closer to the first electrode.

16. The semiconductor device according to claim 11,
wherein a boundary portion between the first-conductivity-type semiconductor region and the second-conductivity-type semiconductor region is located in a region away from an end portion of the fourth nitride semiconductor layer which is closer to the first electrode by a distance corresponding to a width of the fourth nitride semiconductor layer.

* * * * *